(12) United States Patent
Rofougaran et al.

(10) Patent No.: US 6,961,546 B1
(45) Date of Patent: Nov. 1, 2005

(54) ADAPTIVE RADIO TRANSCEIVER WITH OFFSET PLL WITH SUBSAMPLING MIXERS

(75) Inventors: Ahmadreza Rofougaran, Marina Del Rey, CA (US); Maryam Rofougaran, Marina Del Rey, CA (US); Jacob Rael, Los Angeles, CA (US); Syed Masood, Los Angeles, CA (US); Brima Ibrahim, Los Angeles, CA (US); Hung-Ming Chien, Los Angeles, CA (US); Stephen Wu, Los Angeles, CA (US); Meng-An Pan, Los Angeles, CA (US)

(73) Assignee: Broadcom Corporation, Irvine, CA (US)

( * ) Notice: Subject to any disclaimer, the term of this patent is extended or adjusted under 35 U.S.C. 154(b) by 673 days.

(21) Appl. No.: 09/699,040

(22) Filed: Oct. 27, 2000

Related U.S. Application Data

(63) Continuation of application No. 09/695,715, filed on Oct. 23, 2000, which is a continuation-in-part of application No. 09/634,552, filed on Aug. 8, 2000.

(60) Provisional application No. 60/202,997, filed on May 10, 2000, provisional application No. 60/201,330, filed on May 2, 2000, provisional application No. 60/201,179, filed on May 2, 2000, provisional application No. 60/201,157, filed on May 2, 2000, provisional application No. 60/201,335, filed on May 2, 2000, provisional application No. 60/172,348, filed on Dec. 16, 1999, provisional application No. 60/165,356, filed on Nov. 12, 1999, provisional application No. 60/165,355, filed on Nov. 12, 1999, provisional application No. 60/164,987, filed on Nov. 11, 1999, provisional application No. 60/165,234, filed on Nov. 11, 1999, provisional application No. 60/165,239, filed on Nov. 11, 1999, provisional application No. 60/164,446, filed on Nov. 9, 1999, provisional application No. 60/164,442, filed on Nov. 9, 1999, provisional application No. 60/164,194, filed on Nov. 9, 1999, provisional application No. 60/164,314, filed on Nov. 9, 1999, provisional application No. 60/163,780, filed on Nov. 5, 1999, provisional application No. 60/163,488, filed on Nov. 4, 1999, provisional application No. 60/163,487, filed on Nov. 4, 1999, provisional application No. 60/163,398, filed on Nov. 4, 1999, provisional application No. 60/160,839, filed on Oct. 21, 1999, and provisional application No. 60/160,806, filed on Oct. 21, 1999.

(51) Int. Cl.[7] .......................... H01Q 11/12; H04B 1/04
(52) U.S. Cl. ......................... 455/118; 455/20; 455/85; 455/86; 455/190.1; 455/180.3; 455/209; 455/78; 331/37; 331/38; 331/39
(58) Field of Search ........................... 455/20, 118, 85, 455/86, 190.1, 180.3, 209, 76, 78, 77, 84, 87, 115.1, 192.1, 207, 208; 327/427, 434

(56) References Cited

U.S. PATENT DOCUMENTS 4,135,158 A * 1/1979 Parmet ........................ 455/143

(Continued)

OTHER PUBLICATIONS

A. Kral et al., "RF–CMOS Oscillators with Switched Tuning," Proceedings of the Custom IC Conference, Santa Clara, California, pp. 555–558 (May 1998).

(Continued)

Primary Examiner—Marceau Milord
(74) Attorney, Agent, or Firm—McAndrews, Held & Malloy, Ltd.

(57) ABSTRACT

An exemplary embodiment of the present invention described and shown in the specification and drawings is a transceiver with a receiver, a transmitter, a local oscillator (LO) generator, a controller, and a self-testing unit. All of these components can be packaged for integration into a single IC including components such as filters and inductors. The controller for adaptive programming and calibration of the receiver, transmitter and LO generator. The self-testing unit generates is used to determine the gain, frequency characteristics, selectivity, noise floor, and distortion behavior of the receiver, transmitter and LO generator. It is emphasized that this abstract is provided to comply with the rules requiring an abstract which will allow a searcher or other reader to quickly ascertain the subject matter of the technical disclosure. It is submitted with the understanding that it will not be used to interpret or limit the scope or the meaning of the claims.

29 Claims, 53 Drawing Sheets

U.S. PATENT DOCUMENTS

| | | | | |
|---|---|---|---|---|
| 4,692,715 A | * | 9/1987 | Spence | 331/2 |
| 5,020,148 A | * | 5/1991 | Bonato | 455/302 |
| 5,303,394 A | * | 4/1994 | Hrncirik | 455/84 |
| 5,341,110 A | * | 8/1994 | Nardi | 331/17 |
| 5,367,529 A | * | 11/1994 | Holsinger et al. | 372/30 |
| 5,706,310 A | * | 1/1998 | Wang et al. | 375/296 |
| 5,890,051 A | * | 3/1999 | Schlang et al. | 455/76 |
| 6,134,282 A | * | 10/2000 | Ben-Efraim et al. | 375/350 |

OTHER PUBLICATIONS

Chan, P.Y., et al., "A Highly Linear 1–GHz CMOS Down-conversion Mixer," European Solid State Circuits Conference, Seville, Spain, Sep. 22–24, 1993, p.p. 210–213 of conference proceedings, Integrated Circuits & Systems Laboratory, University of California, Los Angeles, CA.

Rofougaran, Ahmadreza, "A Single–Chip Spread–Spectrum Wireless Transceiver in CMOS," Final Report, Integrated Circuits & Systems Laboratory Electrical Engineering Department, University of California, Los Angeles, CA, 1999, 339 pages.

* cited by examiner

LIMITED IF SIGNAL SPECTRUM

SINUSOIDAL INPUT SPECTRUM

IF MIXER OUTPUT SPECTRUM

DIFFERENTIAL INPUT CLOCK SIGNAL SPECTRUM

SIGNAL SPECTRUM AFTER 3fs AND 5fs POLYPHASE

SINUSOIDAL SIGNAL GENERATION AFTER LOW PASS FILTER $$\omega_p = \frac{1}{R(C_p+C)}$$

$$\omega_o = \frac{1}{RC}$$

$$V_{out} = \frac{V_1}{R(C_p+C)s+1} + \frac{V_2 RCs}{R(C_p+C)s+1}$$

SIGNAL SPECTRUM AT POLYPHASE OUTPUT

SIGNAL SPECTRUM AT POLYPHASE OUTPUT

SIGNAL SPECTRUM AT LOW PASS FILTER OUTPUT

*FIG.26a* *FIG.26b*
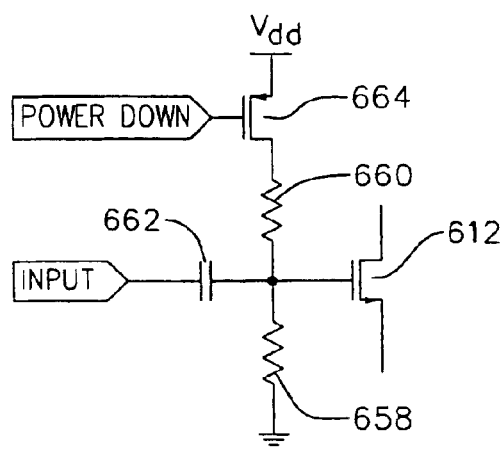
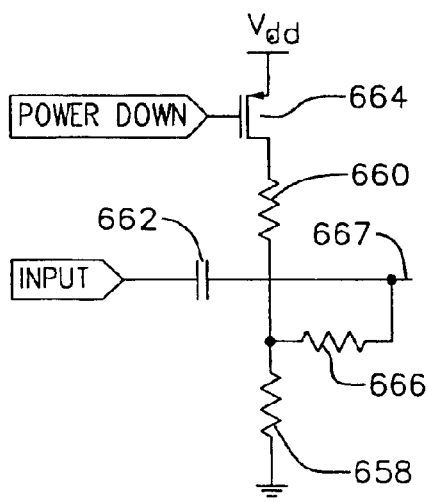
*FIG.27*
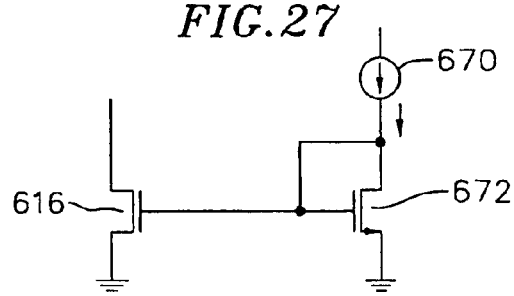
*FIG.28*
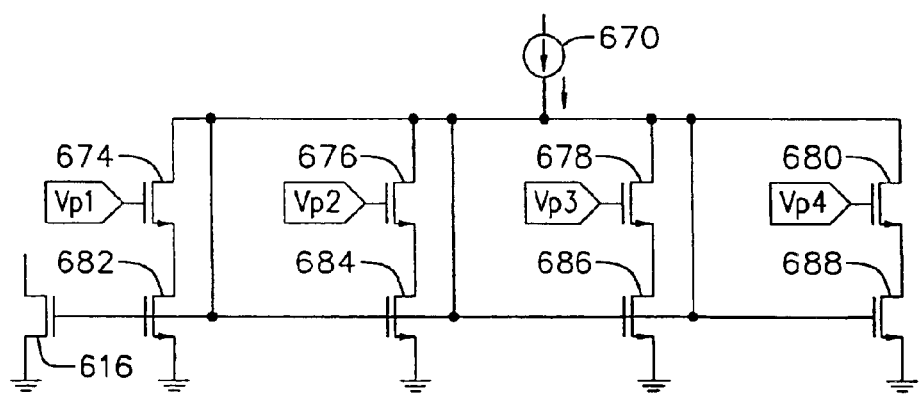

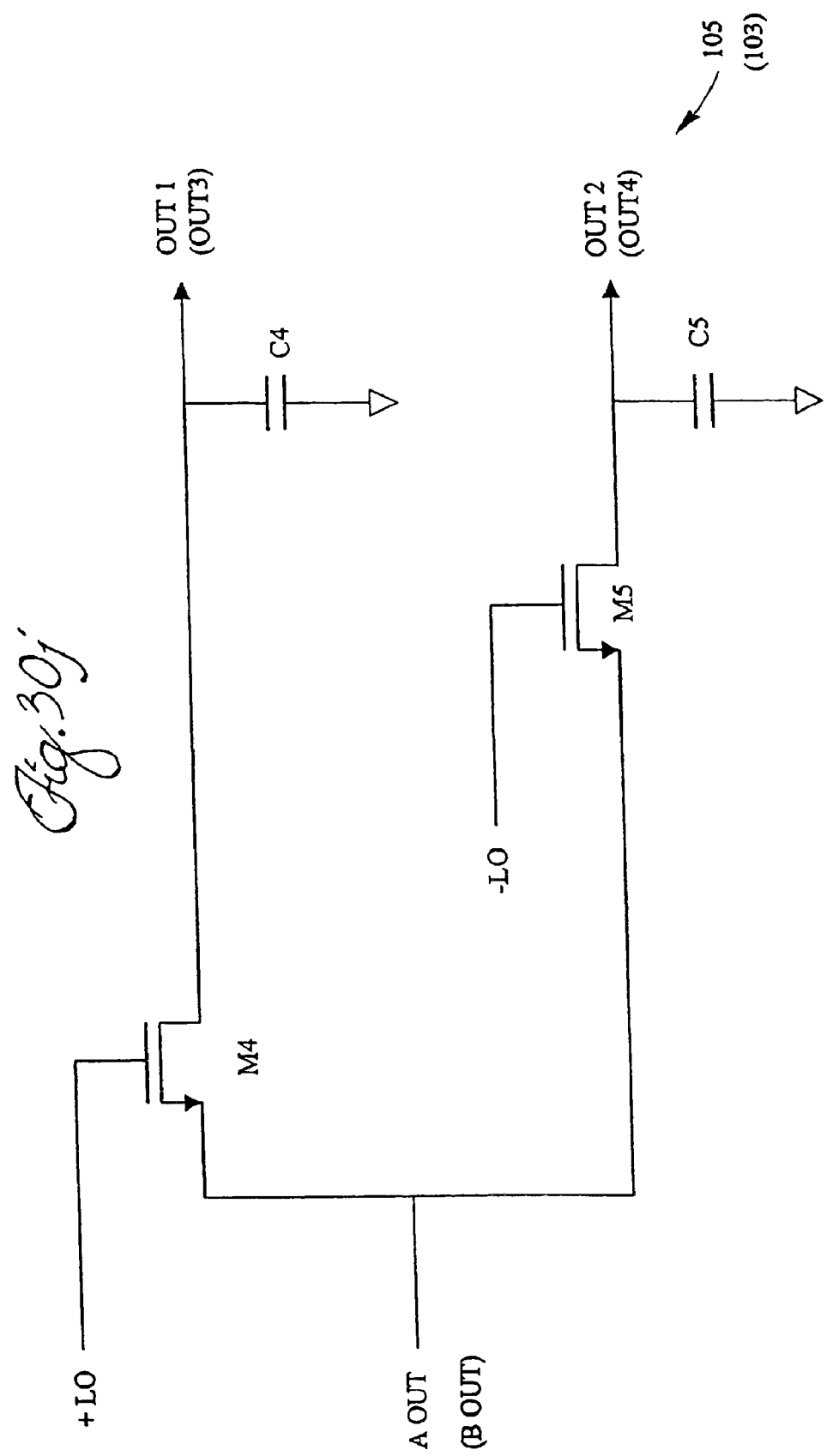

TYPICAL VCO TUNING CURVE

SEGMENTED VCO TUNING CURVE

ADAPTIVE RADIO TRANSCEIVER WITH OFFSET PLL WITH SUBSAMPLING MIXERS

CROSS-REFERENCE TO RELATED APPLICATION

The present application is a continuation of application Ser. No. 09/695,715, filed Oct. 23, 2000, which is a continuation-in-part of application Ser. No. 09/634,552, filed Aug. 8, 2000, which claims priority to provisional application Ser. No. 60/160,806, filed Oct. 21, 1999; application Ser. No. 60/163,487, filed Nov. 4, 1999; application Ser. No. 60/163,398, filed Nov. 4, 1999; application Ser. No. 60/164,442, filed Nov. 9, 1999; application Ser. No. 60/164,194, filed Nov. 9, 1999; application Ser. No. 60/164,314, filed Nov. 9, 1999; application Ser. No. 60/165,234, filed Nov. 11, 1999; application Ser. No. 60/165,239, filed Nov. 11, 1999; application Ser. No. 60/165,356, filed Nov. 12, 1999; application Ser. No. 60/165,355, filed Nov. 12, 1999; application Ser. No. 60/172,348, filed Dec. 16, 1999; application Ser. No. 60/201,335, filed May 2, 2000; application Ser. No. 60/201,157, filed May 2, 2000; application Ser. No. 60/201,179, filed May 2, 2000; application Ser. No. 60/202,997, filed May 10, 2000; application Ser. No. 60/201,330, filed May 2, 2000. The priority of these applications is hereby claimed under 35 U.S.C. §§119(e), 120.

The present application also claims priority under 35 U.S.C. §119(e) to provisional application Ser. No. 60/160,839, filed Oct. 21, 1999; application Ser. No. 60/163,488, filed Nov. 4, 1999; application Ser. No. 60/163,780, filed Nov. 5, 1999; application Ser. No. 60/164,446, filed Nov. 9, 1999; and application Ser. No. 60/164,987, filed Nov. 11, 1999.

All these applications are expressly incorporated herein by referenced as though fully set forth in full.

FIELD OF THE INVENTION

The present invention relates to telecommunication systems, and in particular, to radio transceiver systems and techniques.

BACKGROUND OF THE INVENTION

Transceivers are used in wireless communications to transmit and receive electromagnetic waves in free space. In general, a transceiver comprises three main components: a transmitter, a receiver, and an LO generator or frequency synthesizer. The function of the transmitter is to modulate, upconvert, and amplify signals for transmission into free space. The function of the receiver is to detect signals in the presence of noise and interference, and provide amplification, downconversion and demodulation of the detected the signal such that it can be displayed or used in a data processor. The LO generator provides a reference signal to both the transmitter for upconversion and the receiver for downconversion.

Transceivers have a wide variety of applications ranging from low data rate wireless applications (such as mouse and keyboard) to medium data rate Bluetooth and high data rate wireless LAN 802.11 standards. However, due to the high cost, size and power consumption of currently available transceivers, numerous applications are not being fully commercialized. A simplified architecture would make a transceiver more economically viable for wider applications and integration with other systems. The integration of the transceiver into a single integrated circuit (IC) would be an attractive approach. However, heretofore, the integration of the transceiver into a single IC has been difficult due to process variations and mismatches. Accordingly, there is a need for an innovative transceiver architecture that could be implemented on a single IC, or alternatively, with a minimum number of discrete off-chip components that compensate for process variations and mismatches.

SUMMARY OF THE INVENTION

In one aspect of the present invention, a phase lock loop including an oscillator having a tuning input, and an output with a tunable frequency responsive to the tuning input, a subsampling mixer to mix the oscillator output with a second signal to produce a mixed signal, and a phase detector outputting an error signal which is a function of a phase difference between the mixed signal and an input signal, the error signal being applied to the tuning input.

In another aspect of the present invention, a phase lock loop includes a tunable oscillator having a tuning input, a subsampling mixer having coupled the oscillator, and a phase detector having a first input coupled to the mixer, a second input adapted to receive an input signal, and an output coupled to the tuning input.

In yet another aspect of the present invention, a phase lock loop includes oscillator means for generating a first signal having a tunable frequency, the oscillating means comprising tuning means for tuning the frequency of the first signal, mixer means for mixing the first signal with a second signal to produce a mixed signal, filter means for filtering the mixed signal to generate a difference signal between the frequency of the first signal and a harmonic of the second signal, and detector means for detecting a phase difference between the filtered mixed signal and an input signal, and generating an error signal which is a function of the phase difference, the tuning means being responsive to the error signal.

In a further aspect of the present invention, a transmission system includes a transmitter having a tunable oscillator having a tuning input, a subsampling mixer having a first input coupled the oscillator, a second input, and an output, and a phase detector having a first input coupled to the mixer output, a second input, and an output coupled to the tuning input, and a local oscillator coupled to the second input of the mixer.

In yet a further aspect of the present invention, method of upconverting an input signal includes generating a first signal having a tunable frequency, mixing the first signal with a second signal to produce a mixed signal, filtering the mixed signal to generate a difference signal between the frequency of the first signal and a harmonic of the second signal generating an error signal as a function of a phase difference between the mixed signal and the input signal, and tuning the first frequency with the error signal.

It is understood that other embodiments of the present invention will become readily apparent to those skilled in the art from the following detailed description, wherein it is shown and described only embodiments of the invention by way of illustration of the best modes. contemplated for carrying out the invention. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

DESCRIPTION OF THE DRAWINGS

These and other features, aspects, and advantages of the present invention will become better understood with regard to the following description, appended claims, and accompanying drawings where:

FIG. 26(a) is a electrical diagram of one bias circuit to the input and/or output stage of the differential power amplifier of FIG. 25 in accordance with an exemplary embodiment of the present invention;

FIG. 26(b) is an electrical diagram of another bias circuit to the input and/or output stage of the differential power amplifier of FIG. 25 in accordance with an exemplary embodiment of a the present invention;

FIG. 27 is an electrical diagram of a bias circuit for a the current source of the differential power amplifier of FIG. 25 in accordance with an exemplary embodiment of the present invention;

FIG. 28 is an electrical diagram of a power control circuit for the differential power amplifier of FIG. 25 in accordance with an exemplary embodiment of the present invention;

FIG. 30(j) is a schematic diagram of the first and second track and hold subsampling mixer circuits;

FIG. 30(l) is a block diagram of a second embodiment of a Subsampling Mixer for high frequencies;

DETAILED DESCRIPTION OF THE INVENTION

Exemplary Embodiments of a Transceiver

In accordance with an exemplary embodiment of the present invention, a transceiver utilizes a combination of frequency planning, circuit design, layout and implementation, differential signal paths, dynamic calibration, and self-tuning to achieve robust performance over process variation and interference. This approach allows for the full integration of the transceiver onto a single IC for a low cost, low power, reliable and more compact solution. This can be achieved by (1) moving external bulky and expensive image reject filters, channel select filters, and baluns onto the RF chip; (2) reducing the number of off-chip passive elements such as capacitors, inductors, and resistors by moving them onto the chip; and (3) integrating all the remaining components onto the chip. As those skilled in the art will appreciate, the described exemplary embodiments of the transceiver do not require integration into a single IC and may be implemented in a variety of ways including discrete hardware components.

Figure 1:
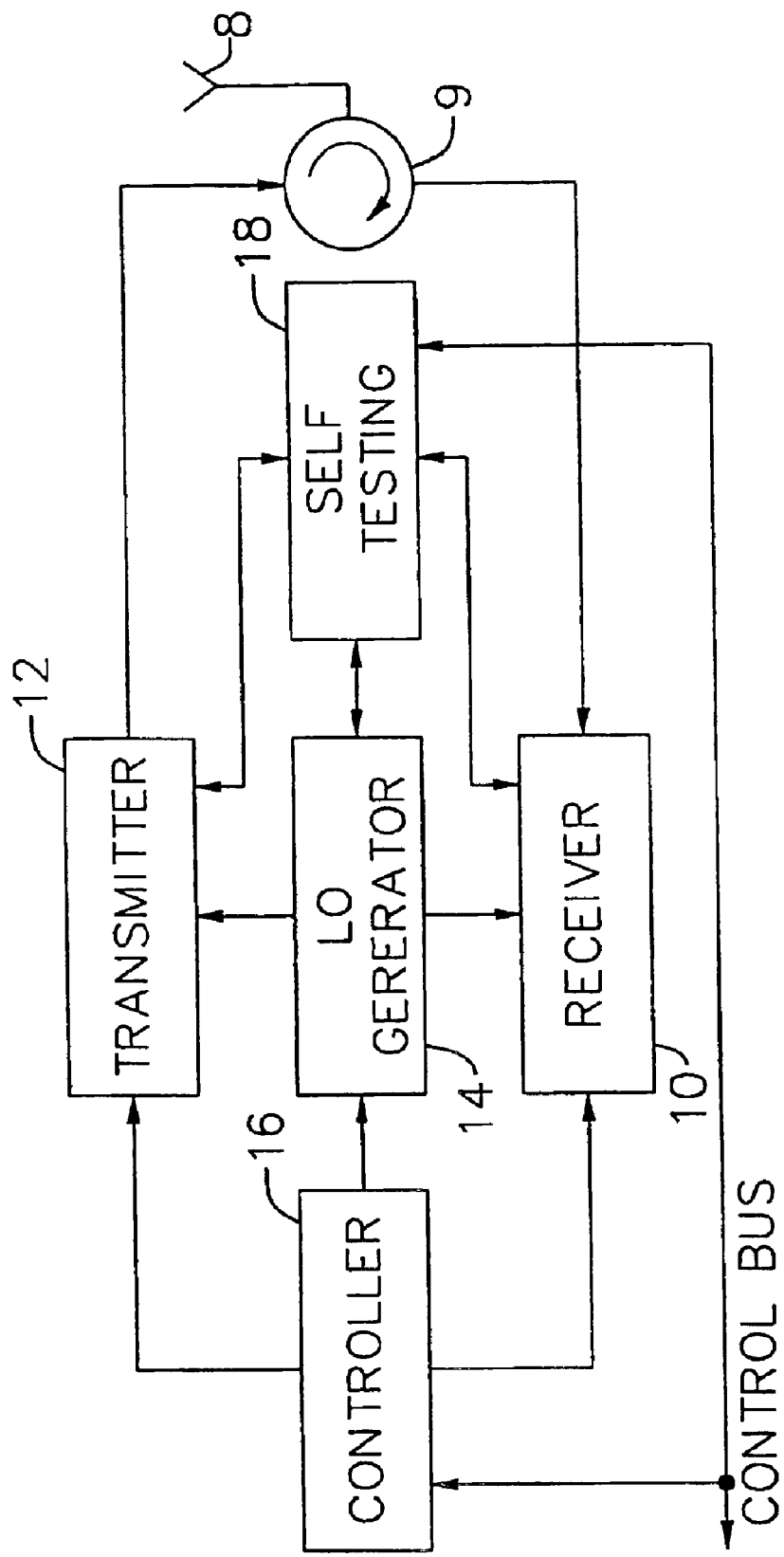
FIG. 1 is a block diagram of a transceiver in accordance with an exemplary embodiment of the present invention.

As shown in FIG. 1, a described exemplary embodiment of the transceiver includes an antenna 8, a switch 9, a receiver 10, a transmitter 12, a local oscillator (LO) generator (also called a synthesizer) 14, a controller 16, and a self-testing unit 18. All of these components can be packaged for integration into a single IC including components such as filters and inductors.

The transceiver can operate in either a transmit or receive mode. In the transmit mode, the transmitter 12 is coupled to the antenna 8 through the switch 9. The switch 9 provides sufficient isolation to prevent transmitter leakage from desensitizing or damaging the receiver 10. In the receive mode, the switch 9 directs signal transmissions from the antenna 8 to the receiver 10. The position of the switch 9 can be controlled by an external device (not shown) such as a computer or any other processing device known in the art.

The receiver 10 provides detection of desired signals in the presence of noise and interference. It should be able extract the desired signals and amplify it to a level where information contained in the received transmission can be processed. In the described exemplary embodiment, the receiver 10 is based on a heterodyne complex (I-Q) architecture with a programmable intermediate frequency (IF). The LO generator 14 provides a reference signal to the receiver 10 to downconvert the received transmission to the programmed IF.

A low IF heterodyne architecture is chosen over a direct conversion receiver because of the DC offset problem in direct conversion architectures. DC offset in direct conversion architectures arises from a number of sources including impedance mismatches, variations in threshold voltages due to process variations, and leakage from the LO generator to the receiver. With a low IF architecture, AC coupling between the IF stages can be used to remove the DC offset.

The transmitter 12 modulates incoming data onto a carrier frequency. The modulated carrier is upconverted by the reference signal from the LO generator 14 and amplified to a sufficient power level for radiation into free space through the antenna 8. The transmitter uses a direct conversion architecture. With this approach only one step of upconversion is required This leads to a reduction in both circuit complexity and power consumption.

The controller 16 performs two functions. The first function provides for adaptive programming of the receiver 10, transmitter 14 and LO generator 16. By way of example, the transceiver can be programmed to handle various communication standards for local area networks (LAN) and personal area networks (PAN) including HomeRF, IEEE 802.11, Bluetooth, or any other wireless standard known in the art. This entails programming the transceiver to handle different modulation schemes and data rates. The described exemplary embodiment of the transceiver can support modulation schemes such as Binary Phase Shift Keying (BPSK), Quadrature Phase Shift Keying (QPSK), offset quadrature phase shift keying (OQPSK), Multiple frequency modulations such as M level frequency shift keying (FSK), Continuous Phase Frequency Shift Keying modulation (CFSK), Minimum Shift Keying modulation (MSK), Gaussian filtered FSK modulation (GFSK), and Gaussian filtered Minimum Shift Keying (GMSK), Phase/Amplitude modulation (such as Quadrature Amplitude Modulation (QAM)), orthogonal frequency modulation (such as Orthogonal Frequency Division Multiplexing (OFDM)), direct sequence spread spectrum systems, and frequency hopped spread spectrum systems and numerous other modulation schemes known in the art. Dynamic programming of the transceiver can also be used to provide optimal operation in the presence of noise and interference. By way of example, the IF can be programmed to avoid interference from an external source.

The second function provides for adaptive calibration of the receiver 10, transmitter 14 and LO generator 16. The calibration functionality controls the parameters of the transceiver to account for process and temperature variations that impact performance. By way of example, resistors can be calibrated within exacting tolerances despite process variations in the chip fabrication process. These exacting tolerances can be maintained in the presence of temperature changes by adaptively fine tuning the calibration of the resistors.

The controller 16 can be controlled externally by a central processing unit (CPU), a microprocessor, a digital signal processor (DSP), a computer, or any other processing device known in the art. In the described exemplary embodiment, a control bus 17 provides two way communication between the controller 16 and the external processing device (not shown). This communication link can be used to externally program the transceiver parameters for different modulation schemes, data rates and IF operating frequencies. The output of the controller 16 is used to adjust the parameters of the transceiver to achieve optimal performance in the presence of process and temperature variations for the selected modulation scheme, data rate and IF.

The self-testing unit 18 generates test signals with different amplitudes and frequency ranges. The test signals are coupled to the receiver 10, transmitter 12 and LO generator 14 where they are processed and returned to the self-testing unit 18. The return signals are used to determine the gain, frequency characteristics, selectivity, noise floor, and distortion behavior of the receiver 10, transmitter 12 and LO generator 14. This is accomplished by measuring the strength of the signals output from the self-testing unit 18 against the returned signals over the tested frequency ranges. In an exemplary embodiment of the self-testing unit 18, these measurements can be made with different transceiver parameters by sweeping the output of the controller 16 through its entire calibrating digital range, or alternatively making measurements with the controller output set to a selected few points, by way of example, at the opposite ends of the digital range.

In the described exemplary embodiment, the self-testing unit 18 is in communication with the external processing device (not shown) via the control bus 17. During self-test, the external processing device provides programming data to both the controller 16 and the self-testing unit. 18. The self-testing unit 18 utilizes the programming data used by the controller 16 to set the parameters of the transceiver to determine the gain, frequency characteristics, selectivity, noise floor, and distortion behavior of the receiver 10, transmitter 12 and LO generator 14.

Figure 2:
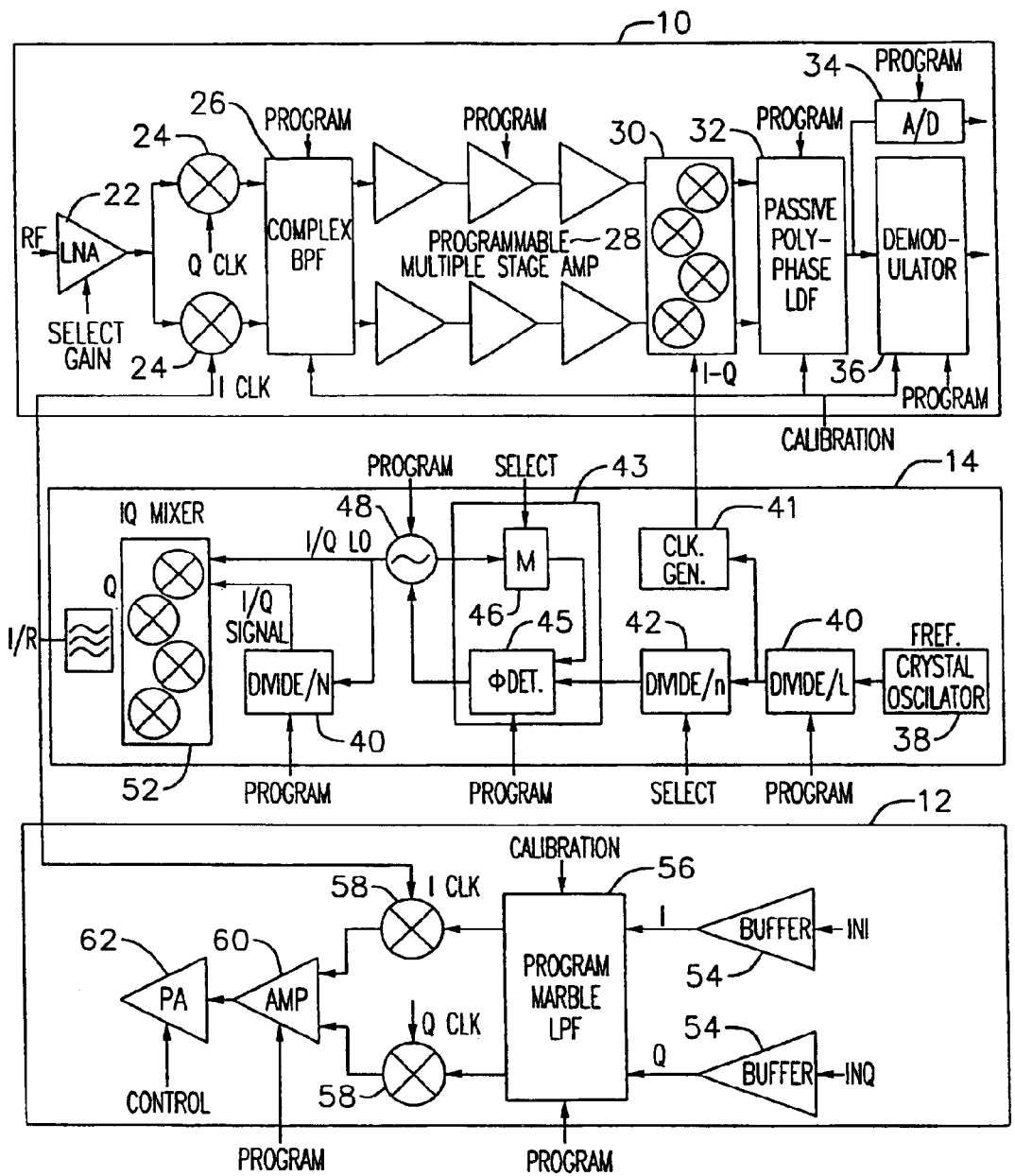
FIG. 2 is a block diagram of the transceiver blocks including a receiver, transmitter and local oscillator in accordance with an exemplary embodiment of the present invention.

FIG. 2 shows a block diagram of the transceiver in accordance with an embodiment of the invention. The described exemplary embodiment is integrated into a single IC. For ease of understanding, each component coupled to the controller is shown with a "program" designation or a "calibration" designation. These designations indicate whether the component is programmed by the controller or calibrated by the controller. In practice, in accordance with the described exemplary embodiment of the present invention, the components that are programmed receive the MSBs and the components that are calibrated receive the LSBs. The components requiring both programming and calibration receive the entire digital output from the controller. As those skilled in the art will appreciate, any number of methodologies maybe used to deliver programming and calibration information to the individual components. By way of example, a single controller bus could be used having the programming and or calibration data with the appropriate component addresses.

The receiver 10 front end includes a low noise amplifier (LNA) 22 which provides high gain with good noise figure performance. Preferably, the gain of the LNA 22 can be set by the controller (not shown) through a "select gain" input to maximize the receivers dynamic range. The desirability of dynamic gain control arises from the effect of blockers or interferers which can desensitize the LNA. Conventional filter designs at the input of the LNA 22 may serve to sufficiently attenuate undesired signals below a certain power level, however, for higher power blockers or interferers, the LNA 22 should be operated with low gain.

The output of the LNA 22 is downconverted to a low IF frequency by the combination of complex IF mixers 24 and a complex bandpass filter 26. More particularly, the output of the LNA 22 is coupled to the complex IF mixers 24 which generate a spectrum of frequencies based upon the sum and difference of the received signal and the RF clocks from the LO generator. The complex bandpass filter passes the complex IF signal while rejecting the image of the received signal. The image rejection capability of the complex,IF mixers 24 in cooperation with the complex bandpass filter 26 eliminates the need for the costly and power consuming preselect filter typically required at the input of the LNA for conventional low IF architectures.

The output of the complex bandpass filter 26 is coupled to a programmable multiple gain stage amplifier 28. The amplifier 28 can be designed to be programmable to select between a limiter and an automatic gain control (AGC) feature, depending on the modulation scheme used in the transceiver. The limiting amplifier can be selected if the transceiver uses a constant envelope modulation such as FSK. AGC can be selected if the modulation is not a constant envelope, such as QAM. In addition, the bandwidth of the amplifier 28 can be changed by the controller to accommodate various data rates and modulation schemes.

The output of the amplifier 28 is coupled to a second set of complex IF mixers 30 where it is mixed with the IF clocks from the LO generator for the purpose of downconverting the complex IF signal to baseband. The complex IF mixers 30 not only reject the image of the complex IF signal, but also reduces some of the unwanted cross modulation spurious signals thereby relaxing the filtering requirements.

The complex baseband signal from the mixers 30 is coupled to a programmable passive polyphase filter within a programmable low pass filter 32. The programmable low pass filter 32 further filters out higher order cross modulation products. The polyphase filter can be centered at four times the IF frequency to notch out one of the major cross modulation products which results from the multiplication of the third harmonic of the IF signal with the IF clock. After the complex baseband signal is filtered, it either is passed through an analog-to-digital (A/D) converter 34 to be digitized or is passed to an analog demodulator 36. The analog demodulator 36 can be implemented to handle any number of different modulation schemes by way of example FSK. Embodiments of the present invention with an FSK demodulator uses the A/D converter 36 to sample baseband data with other modulation schemes for digital demodulation in a digital signal processor (not shown).

The LO generator 14 provides the infrastructure for frequency planning. The LO generator 14 includes an IF clock generator 44 and an RF clock generator 47. The IF clock generator includes an oscillator 38 operating at a ratio of the RF signal ($f_{OCS}$). High stability and accuracy can be achieved in a number of ways including the use of a crystal oscillator.

The reference frequency output from the oscillator 38 is coupled to a divider 40. The divider 40 divides the reference signal $f_{OSC}$ by a number L to generate the IF clocks for downconverting the complex IF signal in the receiver to baseband. A clock generator 41 is positioned at the output of the divider 40 to generate a quadrature sinusoidal signal from the square wave output of the divider 40. Alternatively, the clock generator 41 can be located in the receiver. The divider 40 may be programmed by through the program input. This feature allows changes in the IF frequency to avoid interference from an external source.

The output of the divider 40 is coupled to the RF clock generator 47 where it is further divided by a number n by a second divider 42. The output of the second divider 42 provides a reference frequency to a phase lock loop (PLL) 43. The PLL includes a phase detector 45, a divide by M circuit 46 and a voltage controlled oscillator (VCO) 48. The output of the VCO 48 is fed back through the divide by M circuit 46 to the phase detector 45 where it is compared with the reference frequency. The phase detector 45 generates an error signal representative of the phase difference between the reference frequency and the output of the divide by M circuit 46. The error signal is fed back to the control input of the VCO 48 to adjust its output frequency $f_{VCO}$ until the VCO 48 locks to a frequency which is a multiple of the reference frequency. The VCO 48 may be programmed by setting M via the controller through the program input to the divide by M circuit 46. The programmability resolution of the VCO frequency $f_{VCO}$ is set by the reference frequency which also maybe programmed by the controller through the program input of the divider 42.

In the described exemplary embodiment, the VCO frequency is sufficiently separated (in frequency) from the RF frequency generated by the transmitter 12 to prevent VCO pulling and injection lock of the VCO. Transmitter leakage can pull the VCO frequency toward the RF frequency and actually cause the VCO to lock to the RF signal if their frequencies are close to each other. The problem is exasperated if the gain and tuning range of the VCO is large. If the frequency of the RF clocks is $f_{LO}$, then the VCO frequency can be defined as: $f_{VCO}=Nf_{LO}/(N+1)$. This methodology is implemented with a divide by N circuit 50 coupled to the output of the VCO 48 in the PLL 43. The output of the VCO 48 and the output of the divide by N circuit 50 are coupled to a complex mixer 52 where they are multiplied together to generate the RF clocks. A filter 53 can be positioned at the output of the complex mixer to remove the harmonics and any residual mixing images of the RF clocks. The divide by N circuit can be programmable via the controller through the select input. For example, if N=2, then $f_{VCO}=(2/3)f_{LO}$, and if N=3, then $f_{VCO}=(3/4)f_{LO}$.

A VCO frequency set at 2/3 the frequency of the RF clocks works well in the described exemplary embodiment because the transmitter output is sufficiently separated (in frequency) from the VCO frequency. In addition, the frequency of the RF clocks is high enough so that its harmonics and any residual mixing images such as $f_{VCO} \times 1-(1/N)$), $3f_{VCO} \times 1+(1/N)$, and $3f_{VCO} \times 1-(1/N)$) are sufficiently separated (in frequency) from the transmitter output to relax the filtering requirements of the RF clocks. The filtering requirements do not have to be sharp because the filter can better distinguish between the harmonics and the residual images when they are separated in frequency. Programming the divide by N circuit 50 also provides for the quadrature outputs of the divide by N circuit. Otherwise, with an odd number programmed, the outputs of the divide by N circuit 50 would not be quadrature. For an odd number, the divider 50 outputs will be differential, but will not be 90 degrees out of phase, i.e., will not be I-Q signals.

Figure 3:
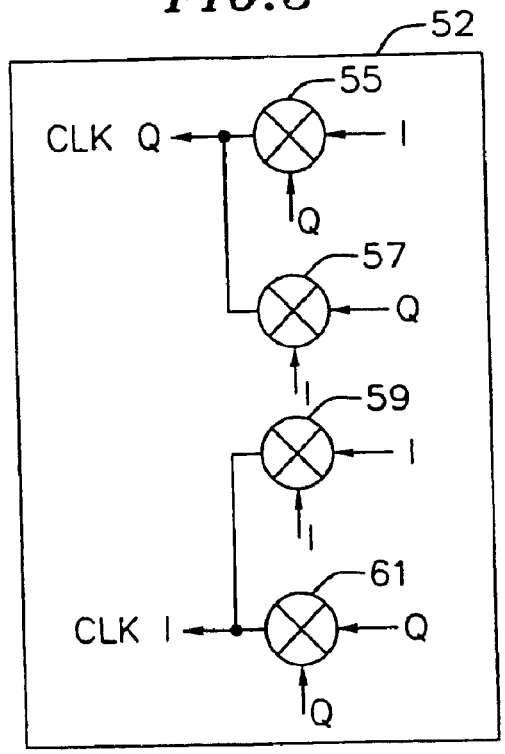
FIG. 3 is a block diagram of a mixer in accordance with an exemplary embodiment of the present invention.

In the described exemplary embodiment, the RF clocks are generated in the in the LO generator 14. This can be accomplished in various fashions including, by way of example, either generating the RF clocks in the VCO or using a polyphase circuit to generate the RF clocks. Regardless of the manner in which the RF clocks are generated, the mixer 52 will produce a spectrum of frequencies including the sum and difference frequencies, specifically, $f_{VCO} \times (1+(1/N))$ and its image $f_{VCO} \times (1-(1/N))$. To reject the image, the mixer 52 can be configured as a double quadrature mixer as depicted in FIG. 3. The double quadrature mixer includes one pair of mixers 55, 57 to generate the clock and a second pair of mixers 59, 61 to generate the I-clock. The Q-clock mixers utilizes a first mixer 55 to mix the I output of the VCO 48 (see FIG. 2) with the Q output of the divider 40 and a second mixer 57 to mix the Q output of the VCO with the I output of the divider. The outputs of the first and second mixers are connected together to generate the Q-clock. Similarly, the I-clock mixers utilizes a first mixer 59 to mix the I output of the divider with the Q output of the VCO and a second mixer 61 to mix the Q output of the divider with the I output of the VCO. The outputs of the first and second mixers are connected together to generate the I-clock. This technique provides very accurate I-Q clocks by combination of quadrature VCO and filtering. Because of the quadrature mixing, the accuracy of the I-Q clocks is not affected by the VCO inaccuracy, provided that the divide by N circuit generates quadrature outputs. This happens for even divide ratios, such as N=2.

Optimized performance is achieved through frequency planning and implemented by programmable dividers in the LO generator to select different ratios. Based on FIG. 2, all the dependencies of the frequencies are shown by the following equation:

$$f_{LO} = f_{RF} - (M \times f_{OSC}/nL)(1+1/N) = f_{OSC}/L$$

where $f_{RF}$ is frequency of the transmitter output.

Turning back to FIG. 2, the transmitter 12 includes a complex buffer 54 for coupling incoming I-Q modulated baseband signals to a programmable low-pass filter 56. The low-pass filter 56 can be programmed by the controller through the select input. The output of the low-pass filter 56 is coupled to complex mixers 58. The complex mixers 58 mixes the I-Q modulated baseband signals with the RF clocks from the LO generator to directly upconvert the baseband signals to the transmitting frequency. The upconverted signal is then coupled to an amplifier 60 and eventually a power amplifier (PA) 62 for transmission into free space through the antenna A bandpass filter (not shown) may be disposed after the PA 62 to filter out unwanted frequencies before transmission through the antenna.

In the described exemplary embodiment, the transmitter can be configured to minimize spurious transmissions. Spurious transmissions in a direct conversion transmitter are generated mainly because of the nonlinearity of the complex mixers and the DC offsets at the input to the complex mixers. Accordingly, the complex mixers can be designed to meet a specified IIP3 (Input Intercept Point for the $3^{rd}$ Harmonic) for the maximum allowable spurs over the frequency spectrum of the communications standard. The DC offsets at the input to the complex mixers can be controlled by the physical size of the transistors.

In addition, the transmitter can be designed to minimize spurious transmission outside the frequency spectrum of the communications standard set by the FCC. There are two sources for these spurs: the LO generator and the transmitter. These spurs can be are suppressed by multiple filtering stages in the LO generator and transmitter. Specifically, in the LO generator, due to the complex mixing of the VCO signal with the output of the divide by N circuit, all the spurs are at least $f_{VCO}/N$ away from the RF clocks. By setting N to 2, by way of example, these unwanted spurs will be sufficiently separated (in frequency) from the transmitted signal and are easily removed by conventional filters in the LO generator and transmitter. Thus, the spurs will be mainly limited to the harmonics of the transmitted signal, which are also sufficiently separated (in frequency) from the transmitted signal, and therefore, can be rejected with conventional filtering techniques. For further reduction in spurs, a dielectric filter may be placed after the PA in the transmitter.

1.0 Receiver 1.1 Differential Amplifier

In exemplary embodiments of the present invention, a differential amplifier can be used to provide good noise immunity in low noise applications. Although the differential amplifiers are described in the context of a low noise amplifier (LNA) for a transceiver, those skilled in the art will appreciate that the techniques described are likewise suitable for various applications requiring good noise immunity. Accordingly, the described exemplary embodiments of an LNA for a transceiver is by way of example only and not by way of limitation.

1.1.1 Single-to-Differential LNA

The described LNA can be integrated into a single chip transceiver or used in other low noise applications. In the case of transceiver chip integration, the LNA should be relatively insensitive to the substrate noise or coupling noise from other transceiver circuits. This can be achieved with a single-to-differential LNA. The single-ended input provides an interface with an off-chip single-ended antenna. The differential output provides good noise immunity due to its common mode rejection.

Figure 4:
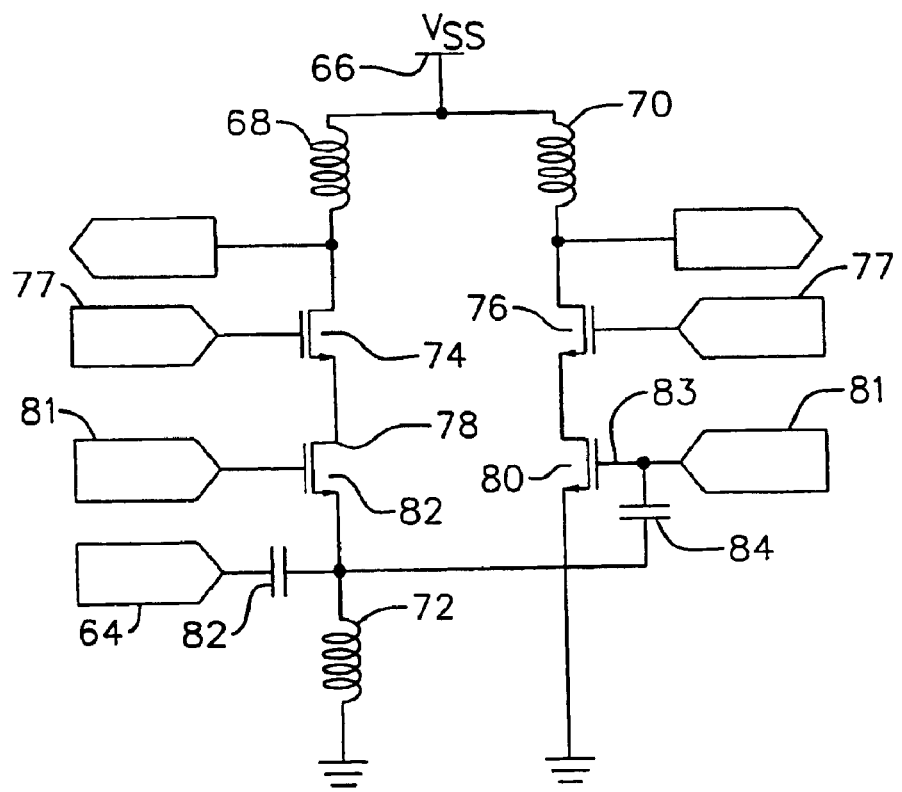
FIG. 4 is an electrical diagram of a low noise amplifier in accordance with an exemplary embodiment of the present invention.

FIG. 4 shows a schematic of a single-to-differential amplifier having two identical cascode stages that are driven by the same single-ended input 64. The input 64 is coupled to a T-network having two series capacitors 82, 84 and a shunt inductor 72. The first stage includes a pair of transistors 74, 78 connected between the shunt inductor 72 and a DC power source via an inductor 68. The second stage includes a complimentary pair of transistors 76, 80 connected between ground and the DC power source via an inductor 70. The gate of the one of the transistors 80 in the second stage is connected to the output of the T-network at the capacitor 84. A bias current is applied to the gate of each transistor.

This configuration provides an input that is well matched with the antenna because the parallel connection of the T-network with the source of the transistor 78 transforms the 1/gm (transconductance) of the transistor to a resistance (preferably 50 ohms to match the antenna). By adjusting the values of T-network components, the matching circuit can be tuned for different frequencies and source impedances. The input capacitor 82 of the T-network further provides decoupling between the antenna and the amplifier.

For DC biasing purposes, the shunt inductor 72 provides a short circuit to ground allowing both stages of the amplifier to operate at the same DC drain current. The output capacitor 84 provides DC isolation between the gate bias applied to the transistor 80 of the second stage and the source 82 of the transistor 78 in the first stage.

In operation, a signal applied to the input of the amplifier is coupled to both the source 82 of the transistor 78 of the first stage and the gate 83 of the transistor 80 of the second stage. This causes the gain of each stage to vary inversely to one another. As a result, the signal voltage applied to the input of the amplifier is converted to a signal current with the signal current in the first stage being inverted from the signal current in the second stage. Moreover, the two stages will generate the same gain because the gm of the transistors should be the same, and therefore, the total gain of the amplifier is twice as much as conventional single-to-differential amplifiers.

1.1.2 Differential LNA

Figure 4A:
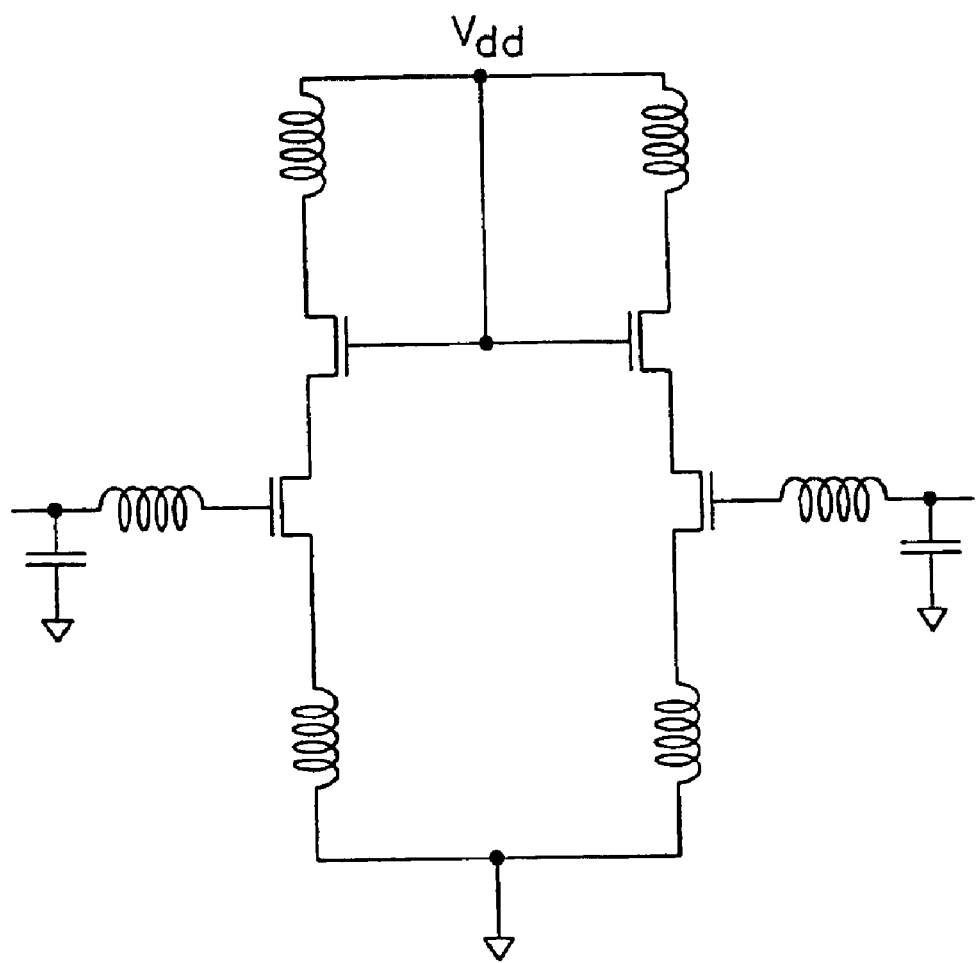
FIG. 4(a) is an electrical diagram of a low noise amplifier in accordance with an another exemplary embodiment of the present invention.

A differential LNA can also be used to provide good noise immunity in low noise applications, such as the described exemplary embodiment of the transceiver. In FIG. 4(a), an exemplary differential LNA is shown having a cascode differential pair with inductive degeneration. In the described exemplary embodiment, the differential LNA can be integrated into a single chip transceiver or used in other similar applications.

In the case of transceiver chip integration, an off chip coupler (not shown) can be used to split the single-ended output from the antenna into a differential output with each output being 180° out of phase. The LNA input can be matched to the coupler, i.e., a 50 ohm source, by LC circuits. A shunt capacitor 463 in combination with a series inductor 465 provides a matching circuit for one output of the coupler, and a shunt capacitor 467 in combination with a series inductor 469 provides a matching circuit for the other output of the coupler. At 2.4 GHz., each LC circuit maybe replaced by a shunt capacitor and transmission line. In the described exemplary embodiment, the LC circuits are off-chip for improved noise figure performance. Alternatively, the LC circuits could be integrated on chip. However, due to the high loss of on chip inductors, the noise figure, as well as gain, could suffer.

The differential output of the coupler is connected to a differential input of the LNA via the LC matching circuits. The differential input includes a pair of input FET transistors 471,473 with inductive degeneration. This is achieved with an on chip source inductor 475 connected between the input transistor 471 and ground, and a second on chip source inductor 479 connected between the input transistor 473 and ground. The on chip inductive degeneration provides a predominantly resistive input impedance. In addition, the FET noise contribution at the operating frequency is reduced.

The outputs of the input transistors 471, 473 are coupled to a cascode stage implemented with a pair of transistors 481, 486, respectively. The cascode stage provides isolation between the LNA input and its output. This methodology improves stability, and reduces the effect of the output load on the LNA input matching circuits. The gates of the cascode transistors 481, 486 are biased at the supply voltage by a resistor 488. The resistor 488 reduces instability that might otherwise be caused by parasitic inductances at the gates of the cascoded transistors 481, 486.

Since the described exemplary embodiment of the LNA uses a differential architecture, the resistor does not contribute noise to the LNA output.

The output of cascoded transistor 481 is coupled to the supply voltage through a first inductor 490. The output of the cascodedc transistor 486 is coupled to the supply voltage through a second inductor 492. The LNA is tuned to the operating frequency by the output inductors 490, 492. More particularly, these inductors 490, 492 resonate with the LNA output parasitic capacitance, and the input capacitance of the next state (not shown). Embodiments of the present invention integrated into a single integrated circuit do not require a matching network at the LNA output.

The gain of the LNA can be digitally controlled. This is achieved by introducing a switchable resistor in parallel with each of the output inductors. In the described exemplary embodiment, a series resistor 494 and switch 496 is connected in parallel with the output inductor 490, and a second series resistor 498 and switch 500 is connected in parallel with the output inductor 492. The switches can be FET transistors or any other similar switching devices known in the art. In the low gain mode, each resistor 494, 498 is connected in parallel with its respective output inductor 490, 492, which in turn, reduces the quality factor of each output inductor, and as a consequence the LNA gain. In the high gain mode, the resistors 494, 498 are switched out of the LNA output circuit by their respective switches 496, 500.

1.2 A Complex Filter

In an exemplary embodiment of the present invention, a programmable/tunable complex filter is used to provide frequency planning, agility, and noise immunity. This is achieved with variable components to adjust the frequency characteristics of the complex filter. Although the complex filter is described in the context of a transceiver, those skilled in the art will appreciate that the techniques described are likewise suitable for various applications requiring frequency agility or good noise immunity. Accordingly, the described exemplary embodiment for a complex filter in a transceiver is by way of example only and not by way of limitation.

The described complex filter can be integrated into a single chip transceiver or used in other low noise applications. In the case of transceiver chip integration, the off-chip filters used for image rejection and channel selection can be eliminated. A low-IF receiver architecture enables the channel-select feature to be integrated into the on-chip filter. However, if the IF lies within the bandwidth of the received signal, e.g. less than 80 MHz in the Bluetooth standard, the on-chip filter should be a complex filter (which in combination with the complex mixers) can suppress the image signal. Thus, either a passive or an active complex filter with channel select capability should be used. Although a passive complex filter does not dissipate any power by itself, it is lossy, and loads the previous stage significantly. Thus, an active complex filter with channel select capability is preferred. The channel select feature of the active complex filter can achieve comparable performance to conventional bandpass channel-select filters in terms of noise figure, linearity, and power consumption The described exemplary embodiment of the complex filter accommodates several functions in the receiver signal path: it selects the desired channel, rejects the image signal which lies inside the data band of the received signal due to its asymmetric frequency response, and serves as a programmable gain amplifier (PGA). Moreover, the complex filter center frequency and its bandwidth can be programed and tuned. These capabilities facilitate a robust receiver in a wireless environment, where large interferers may saturate the receiver or degrade the signal-to-noise ratio at the demodulator input. The attenuation of the received signal at certain frequencies can also be enhanced by introducing zeros in the complex filter.

1.2.1 Cascaded Biquads

Figure 5:
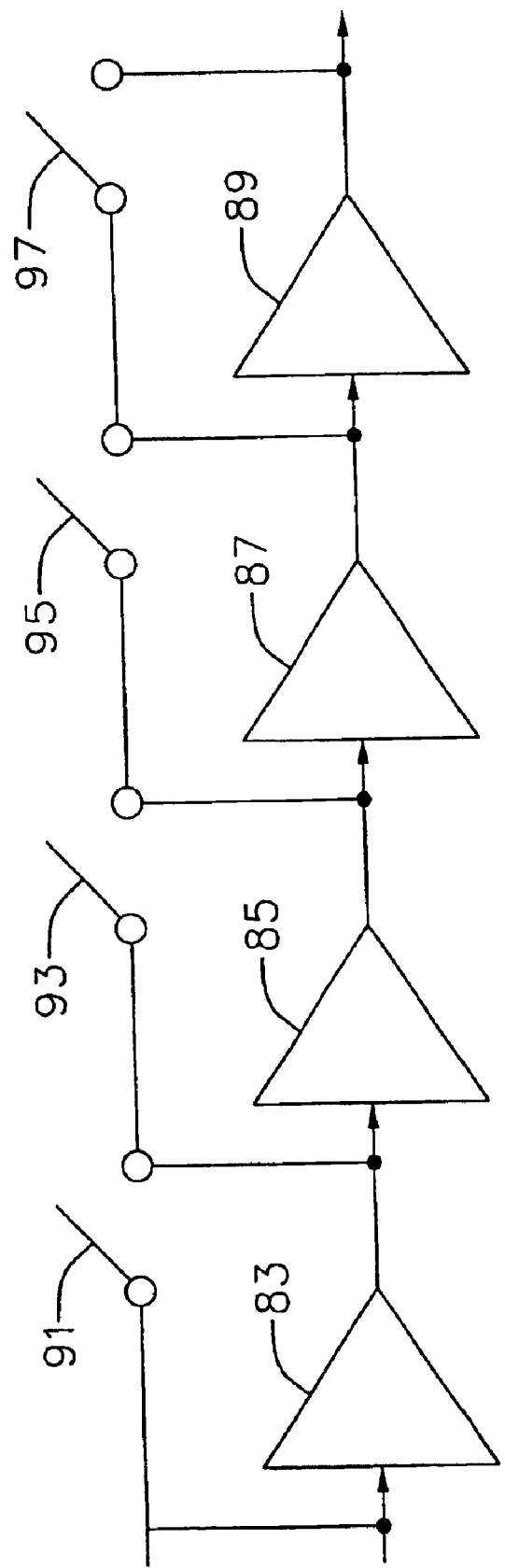
FIG. 5 is a block diagram of a four-stage biquad complex bandpass filter in accordance with an exemplary embodiment of the present invention.

An exemplary embodiment of the complex filter includes a cascade of biquads. Each biquad comprises a 2'nd order bandpass filter. The total order of the filter is the sum of orders of the cascaded biquads. The order of the filter can be programmable. By way of example, four cascaded biquads 83, 85, 87, 89 can be used with each of the cascaded biquads having an individually controlled bypass switch. Referring to FIG. 5, a bypass switch 91 is connected across the input stage biquad 83. Similarly, a bypass switch 93 is connected across the second stage biquad 85, a bypass switch 95 is connected across the third stage biquad 87, and a bypass switch 97 is connected across the output stage biquad. With this configuration, the order of the filter can be programmed by bypassing one or more biquads. A biquad that is bypassed contributes a zero order to the filter.

In the described exemplary embodiment, the bypass switches are operated in accordance with the output from the controller 16 (see FIG. 2). An 8'th order filter can be constructed by opening the bypass switches 91, 93, 95, 97 via the digital signal from the controller output. The complex filter can be reduced to a 6'th order filter by closing the bypass switch 97 to effectively remove the output stage biquad from the complex filter. Similarly, the complex filter can be reduced to a 4'th order filter by closing bypass switches 95, 97 effectively removing the third stage biquad and output stage biquad. A 2'nd order filter can be created by closing bypass switches 93, 95, 97 effectively removing all biquads with the exception of the input stage from the circuit.

1.2.1.1 The Poles of a Biquad Stare

Figure 6:
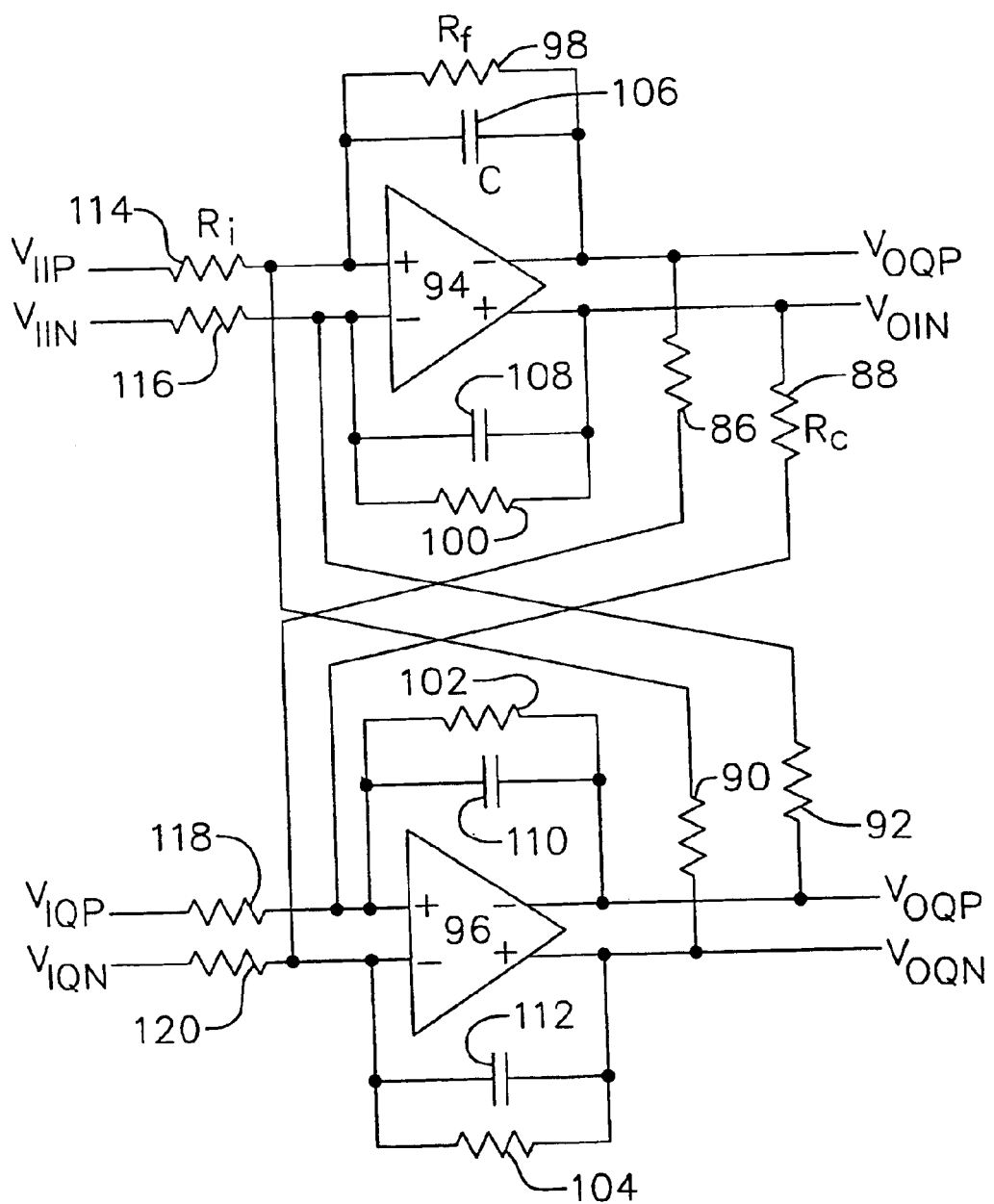
FIG. 6 is an electrical diagram of one biquad stage of the complex bandpass filter in accordance with an exemplary embodiment of the present invention.

FIG. 6 shows an exemplary embodiment of a biquad stage of the complex filter. The biquad stage includes two first order resistor-capacitor (RC) filters each being configured with a differential operational amplifier 94, 96, respectively. The first differential operational amplifier 94 includes two negative feedback loops, one between each differential output and its respective differential input. Each feedback loop includes a parallel RC circuit (98, 106), (108, 100), respectively. Similarly, the second differential operational amplifier 96 includes two negative feedback loops, one between each differential output and its respective differential input. Each feedback loop includes a parallel RC circuit (102–110), (112–104), respectively. This topology is highly linear, and therefore, should not degrade the overall IIP3 of the receiver. The RC values determine the pole of the biquad stage.

The differential inputs of the biquad stage are coupled to their respective differential operational amplifiers through input resistors 114, 116, 118, 120. The input resistors in combination with their respective feedback resistors set the gain of the biquad stage.

Preferably, some or all of the resistors and capacitors values can programmable and can be changed dynamically by the controller This methodology provides a frequency agile biquad stage.

The two first order RC filters are cross coupled by resistors 86, 88, 90, 92. By cross-coupling between the two filters, a complex response can be achieved, that is, the frequency response at the negative and positive frequencies will be different. This is in contrast to a real-domain filter, which requires the response to be symmetric at both positive and the negative frequencies. This feature is useful because the negative frequency response corresponds to the image signal. Thus, the biquad stage selects the desired channel, whereas the image signal, which lies at the negative frequency is attenuated.

For the resistor values shown in FIG. 6, the biquad stage outputs are:

$$V_{OI} = A \frac{(1 + jRC\omega)V_{II} + 2QV_{IQ}}{(1 + jRC\omega)^2 + 4Q^2} \quad (1)$$

and $$V_{OQ} = A \frac{-2QV_{II} + (1 + jRC\omega)V_{IQ}}{(1 + jRC\omega)^2 + 4Q^2} \quad (2)$$

Figure 7:
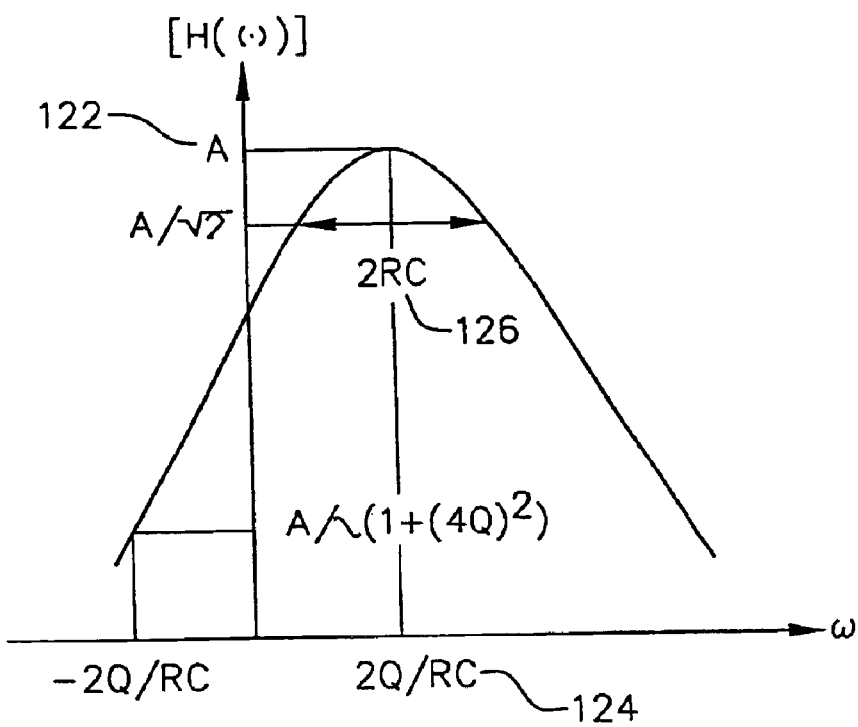
FIG. 7 is a graphical depiction of the frequency response on the biquad stage of FIG. 6 in accordance with an exemplary embodiment of the present invention.

FIG. 7 shows the frequency response for the complex biquad filter.

After the received signal is downconverted, the desired channel in the I path lags the one in the Q path, that is, $V_{II} = -j_{IQ}$, and therefore:

$$H(j\omega) = \frac{V_O}{V_I}(j\omega) = \frac{A}{1 + jRC\omega - j2Q} \quad (3)$$

This shows a passband gain of A 122 at a center frequency of 2Q/RC 124, with a 3-dB bandwidth of 2RC 126. Thus, the quality factor of the second-order stage will be Q. For the image signal however, the signal at the I branch leads, and as a result:

$$H(j\omega) = \frac{A}{1 + jRC\omega + j2Q} \quad (4)$$

which shows that the image located at 2Q/RC is rejected by $$\frac{1}{\sqrt{(1 + (4Q)2}}.$$

Therefore, the biquad stage has an asymmetric frequency response, that is, the desired signal may be assigned to positive frequencies, whereas the image is attributed to negative frequencies. In general, the frequency response of the biquad stage is obtained by applying the following complex-domain transformation to a normalized real-domain lowpass filter:

$$j\omega \to \frac{j(\omega - \omega_0)}{BW} \quad (5)$$

where $\omega_0$ is the bandpass (BP) center frequency, and BW is the lowpass (LP) equivalent bandwidth, equal to half of the bandpass filter bandwidth. For instance, for a second-order biquad stage (as shown in FIG. 6), $\omega_0 = 2Q/RC$, and BW=1/RC. The biquad stage is designed by finding its LP equivalent frequency response using equation (5). Once the LP poles are known, the BP poles are calculated based on equation (5). Assume that the LP equivalent has n poles, and $P_{i,LP} = \alpha_i + j\beta_i$ is the ith pole. From equation (5), the BP pole will be:

$$P_{i,BP} = BW \cdot P_{i,LP} + j\omega_0 = \alpha_i \cdot BW + j(\omega_0 + \beta_i \cdot BW) \quad (6)$$

The complex filter is realized by cascading n biquad stages. Therefore, similar to real-domain bandpass filters, an nth order complex filter uses 2×n integrators. Based on equation (3), each biquad stage has a pole equal to −1/RC+ j2Q/RC. Thus:

$$a_i \cdot BW = \frac{-1}{RC} \tag{7}$$

and $$\omega_0 + \beta_i \cdot BW = \frac{2Q}{RC} \tag{8}$$

Since the LP equivalent poles are located in the left-half plane, $a_i$ is always negative. The above equations set the value of Q and RC in each stage. The gain of each biquad stage can be adjusted based on the desired gain in the complex filter, and noise-linearity trade-off: increasing the gain of one biquad stage lowers the noise contributed by the following biquad stages, but it also degrades the linearity of the complex filter.

In addition to image rejection, the complex frequency transformation of the biquad stage (equation (5)) provides for its frequency response to be symmetric around its center frequency as shown in FIG. 7. This is in contrast to regular bandpass filters which use the following real-domain transformation:

$$j\omega \rightarrow \frac{j(\omega^2 - \omega_0^2)}{BW \cdot \omega} \tag{9}$$

This symmetric response in the biquad stage ensures a uniform group delay across the data band.

1.2.1.2 The Zeros of a Biquad Stage

The described exemplary embodiment of the biquad stage can be modified to obtain a sharper rejection or notch at an undesired signal at a specific frequency. This can be achieved in the biquad stage by adding zeros. Assume that the input resistors at the biquad input ($R_i$ 114 in FIG. 6) is replaced with an admittance $Y_i$. For the received signal, the frequency response of the biquad stage will be equal to:

$$H(j\omega) = \frac{R \cdot Y_i}{1 + jRC\omega - j2Q} \tag{10}$$

Figure 8:
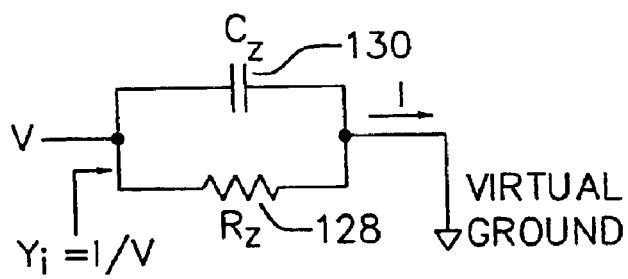
FIG. 8 is an electrical diagram of one possible input circuit for the biquad stage in accordance with an exemplary embodiment of the present invention.

FIG. 8 shows Yi having resistor $R_z$ 128 and capacitor $C_z$ 130.

In order to have a zero located at jω axis in the frequency response, $Y_i$ should contain a term such as 1−ω/ω$_z$. If $Y_i$ is simply made of a resistor $R_z$ in parallel with a capacitor $C_z$, then the input admittance will be equal to:

$$Y_i = \frac{1}{R_z} + j\omega C_z \tag{11}$$

which is not desirable, since the zero will be in the left-half plane, rather than the jω axis.

Figure 9:
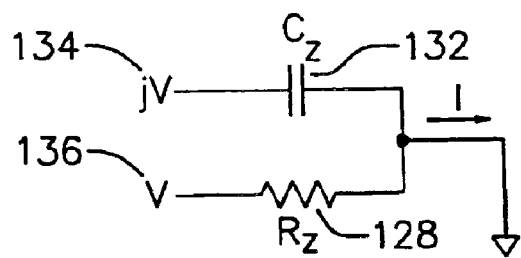
FIG. 9 is an electrical diagram of another possible input circuit for the biquad stage in accordance with an exemplary embodiment of the present invention.

FIG. 9 shows Yi with the capacitor $C_z$ 132 connected to the Q input 134 and the resistor $R_z$ connected to the I input 136. Now the current I will be equal to:

$$I = \frac{V}{R_z} + jC_z\omega \cdot (jV) \tag{12}$$

Therefore, the input admittance will be equal to:

$$Y_i = \frac{I}{V} = \frac{1}{R_z} - C_z\omega \tag{13}$$

which indicates that the filter will have a zero equal to 1/$R_z C_z$ at the jω axis.

Figure 10:
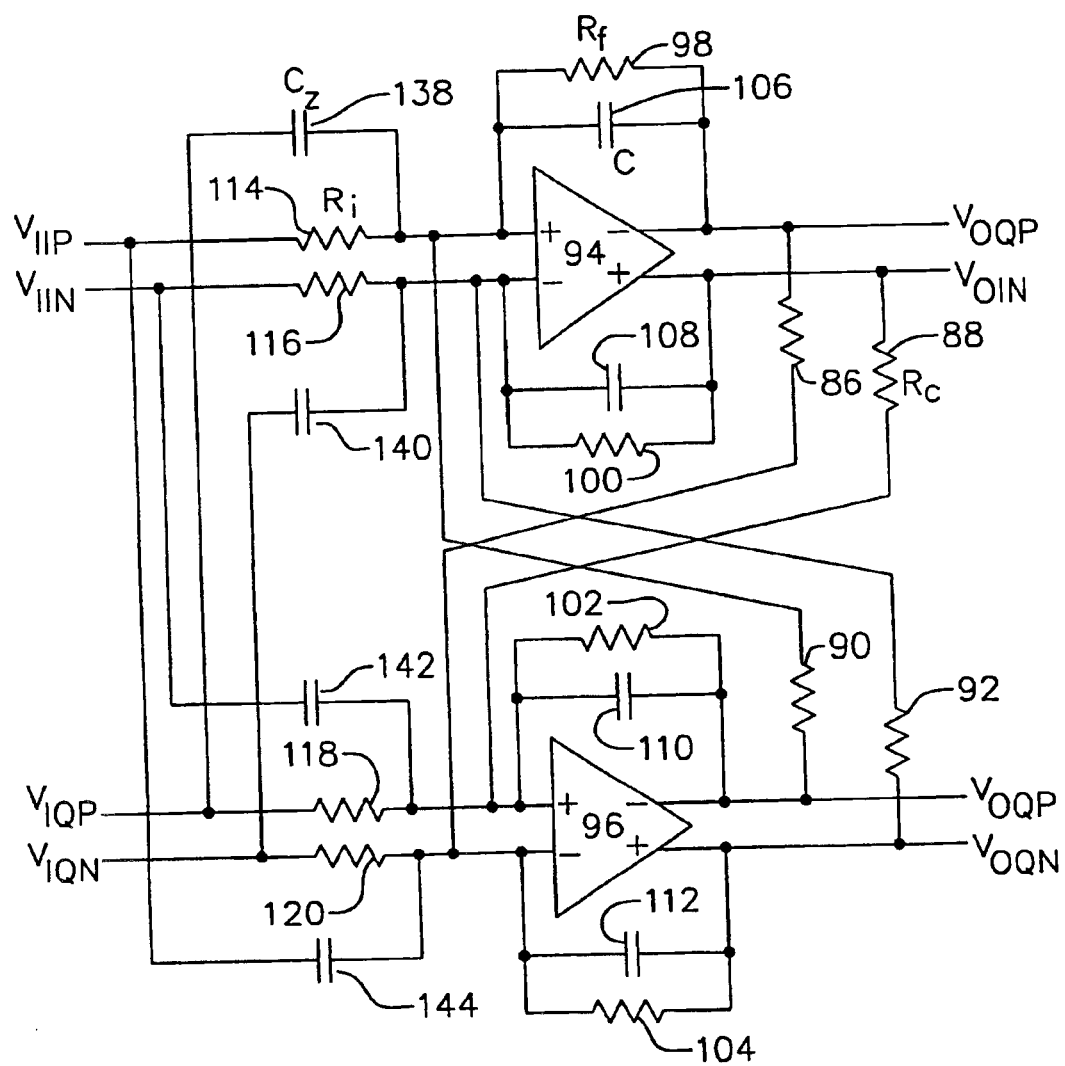
FIG. 10 is an electrical diagram of a modified a modified biquad stage of FIG. 6 in accordance with an exemplary embodiment of the present invention.
Figure 11:
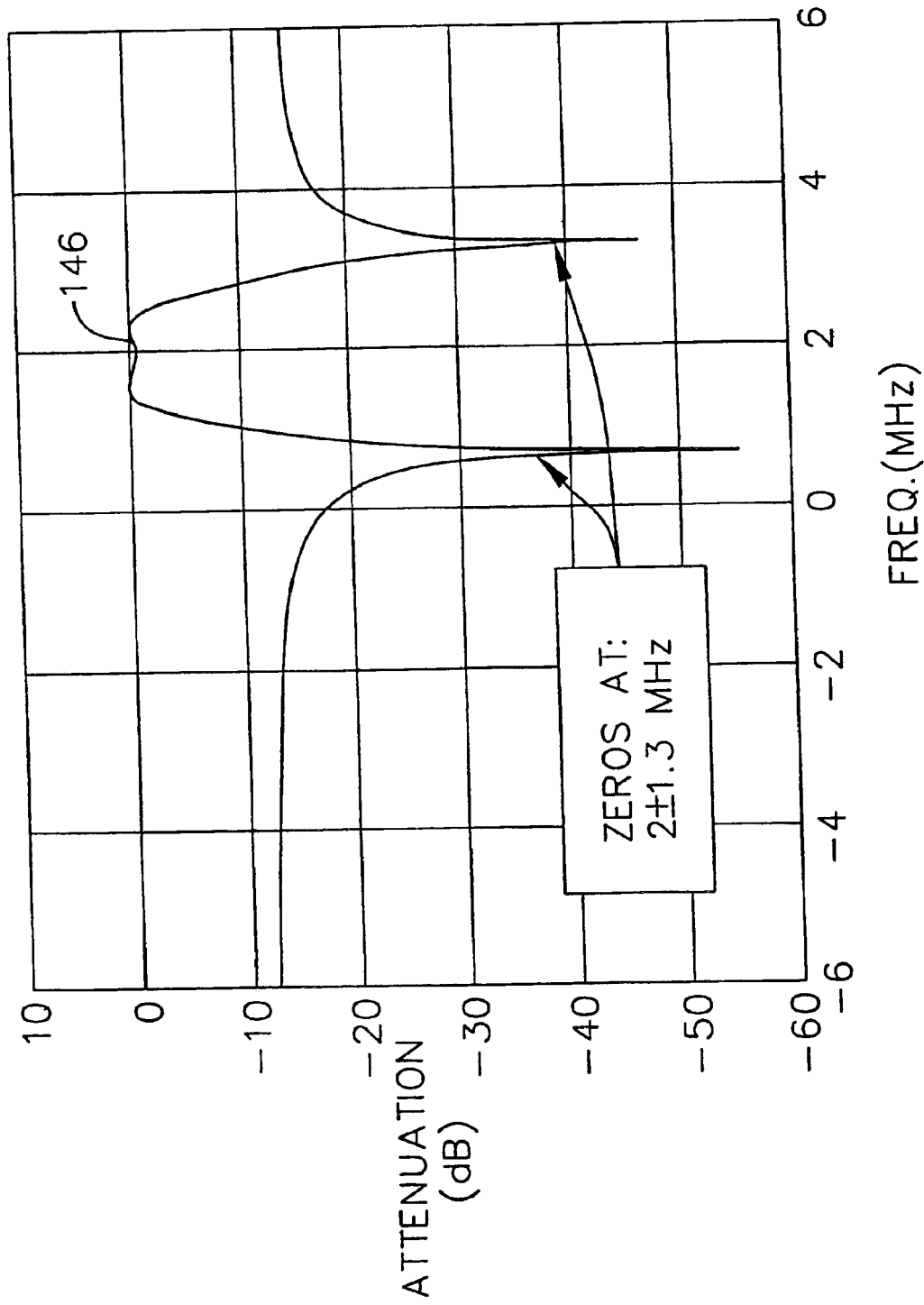
FIG. 11 is a graphical depiction of the frequency response of the modified biquad stage of FIG. 10 in accordance with an exemplary embodiment of the present invention.

FIG. 10 shows a single biquad stage modified to have a zero at the jω axis. The biquad stage includes capacitors 138, 140, 142, 144. The combination of capacitors 138, 140, 142, 148 and resistors 116, 118 determines a complex zero with respect to the center frequency. The transfer function for the received signal will be:

$$H(j\omega) = A \frac{1 - \frac{RC_z}{A}\omega}{1 + jRC\omega - j2Q} \tag{14}$$

Equation (14) is analogous to equation (3), with the difference that now a zero at A/$RC_z$ is added to the biquad stage of the complex filter. By knowing the LP equivalent characteristics of the biquad stage, the poles are calculated based on equation (6). The value of Q and RC in each biquad stage is designed by using equation (7) and equation (8). If the normalized LP zeros are at ±ω$_{z,LP}$, then the biquad stage should be realized with two biquad stages cascoded, and the frequency of zeros in the biquad stages will be (equation (5)):

$$\omega_{z1,2} = \omega_0 \pm \omega_{z,LP} \cdot BW \tag{15}$$

If the differential I and Q inputs connected to the zero capacitors are switched, the biquad stage will have zeros at negative frequencies (image response). This property may be exploited to notch the image signal.

1.2.1.3 Tunability and Programmability

In addition to channel selection and image rejection, the described exemplary embodiment of the complex filter can provide variable gain, bandwidth, and center frequency. In addition, an automatic tuning loop can be implemented to adjust the center frequency. These features result in a high quality receiver which can dynamically support different communication standards, modulation schemes and data rates.

By changing the gain of the biquad stages, the complex filter can perform as a PGA in the signal path of the receiver. This assures that the output swing of the complex filter remains constant when the receiver input signal changes. Moreover, adaptivity is achieved through dynamic programming of the bandwidth and center frequency. By way of example, when the receive environment is less noisy, the transmitter may switch to a higher data rate, and the bandwidth of the complex filter should increase proportionally. The center frequency, on the other hand, may be changed to increase the receiver immunity to blockers and other interferers.

The center frequency of each biquad stage is equal to 2Q/RC. The quality factor, Q, is precisely set, since it is determined by the ratio of two resistors ($R_f$ and $R_c$ in FIG. 10), which can be accurately established when the resistors are implemented on-chip. However, the RC product varies by temperature and process variations, and therefore, may be compensated by automatic tuning methods.

Figure 12A:
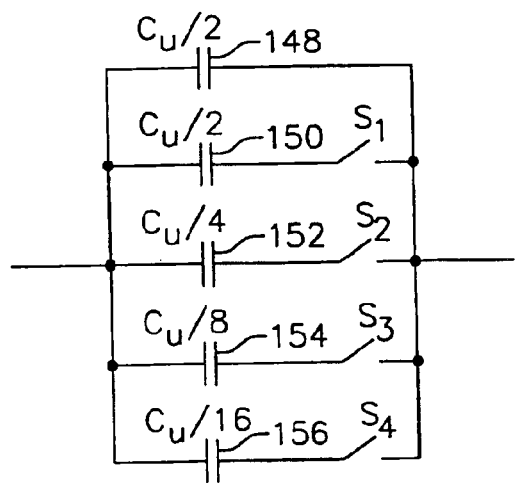
FIG. 12(a) is an electrical diagram of a tunable array of capacitors in accordance with an exemplary embodiment of the present invention.
Figure 12B:
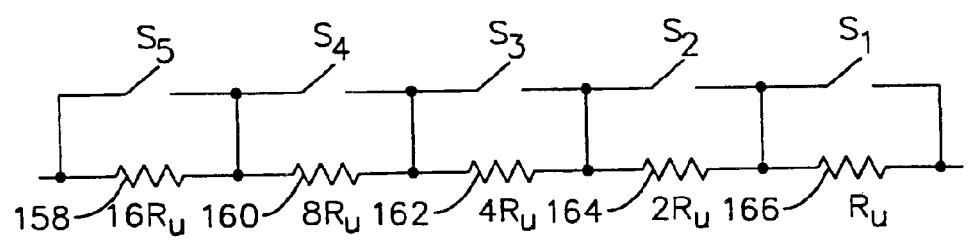
FIG. 12(b) is an electrical diagram of a tunable array of resistors in accordance with an exemplary embodiment of the present invention.

Referring to FIG. 12(a), each capacitor can be implemented with a capacitor 148 connected in parallel with a number of switchable capacitors 150, 152, 154, 156. The capacitance, and thereby the center frequency of the complex filter, can be varied by selectively switching in or out the capacitors based on a four-bit binary code. Each bit is used to switch one of the parallel capacitors from the circuit In the described exemplary embodiment, the capacitor 148 provides a capacitance of $C_u/2$. Capacitor 150 provides a capacitance of $C_u/2$. Capacitor 152 provides a capacitance of $C_u/4$. Capacitor 154 provides a capacitance of $C_u/8$. Capacitor 156 provides a capacitance of $C_u/6$. This provides ±50% tuning range with ±3% tuning accuracy. Due to discrete nature of the tuning scheme, there may be some error in the center frequency ($\pm 1/(2 \times 2^n)$ for n-bit array). This inaccuracy can be tolerated with proper design.

Referring to FIG. 2(*b*), each resistor can be implemented with a series of switchable resistors 158, 160, 162, 164, 166. Resistor 166 provides a resistance of $R_u$. Resistor 164 provides a resistance of $2\,R_u$. Resistor 162 provides a resistance of $4\,R_u$. Resistor 160 provides a resistance of $8\,R_u$. Resistor 158 provides a resistance of $16\,R_u$. In the described exemplary embodiment, the resistance can be varied between $R_u$ and $31 \times R_u$ in incremental steps equal to $R_u$ by selectively bypassing the resistor based on a five-bit binary code.

The center frequency of the complex filter can be adjusted by setting $1/R_u C_u$ equal to a reference frequency generated, by way of example, the crystal oscillator in the controller. The filter is automatically tuned by monotonic successive approximation as described in detail in Section 4.0 herein. Once the value of $R_u C_u$ is set, the complex filter characteristics depends only on four-bit code for the capacitors and the four-bit code for the resistors. For example, assume that the value of the resistors in the biquad stage of FIG. 6 is as following: $R_i=n_A R_u$, $R_f=n_Q R_u$, and $Rc=n_Q R_u$. Likewise, assume that $C=n_C C_u$, where $n_C$ is a constant, and that $1/R_u C_u = \omega_u$. The value of $\omega_u$ is set to a reference crystal by a successive approximation feedback loop. The filter frequency response for the received signal will be:

$$H(j\omega) = \frac{\frac{n_F}{n_A}}{1 + jn_c n_F R_u C_u \omega - j\frac{n_F}{n_Q}} \quad (16)$$

Therefore, the biquad stage gain (A), center frequency ($\omega_0$), and bandwidth (BW) will be equal to:

$$A = \frac{n_F}{n_A} \quad (17)$$

$$\omega_0 = \frac{1}{n_C n_Q} \cdot \omega_u \quad (18)$$

$$BW = \frac{1}{n_C n_F} \cdot \omega_u \quad (19)$$

The above equations show that the characteristics of the biquad stage is independently programmed by varying $n_A$, $n_F$, and $n_Q$. For instance, by setting $n_F$, the gain of the biquad stage changes from $n_F/31$ to $n_F$ by changing $n_A$ from 1 to 31.

1.2.2 I-Q Monolithic Bandpass Filter

Alternatively, a low power I-Q monolithic bandpass filter can be used for the complex filter of the described exemplary embodiment of the present invention. The I-Q monolithic bandpass filter is useful for short-range communication applications. It also provides low power monolithic bandpass filtering for high data rates such as Bluetooth and HomeRF applications. The I-Q monolithic bandpass filter can be fully incorporated in monolithic channel select filters for 1-MHz data rates.

Figure 13:
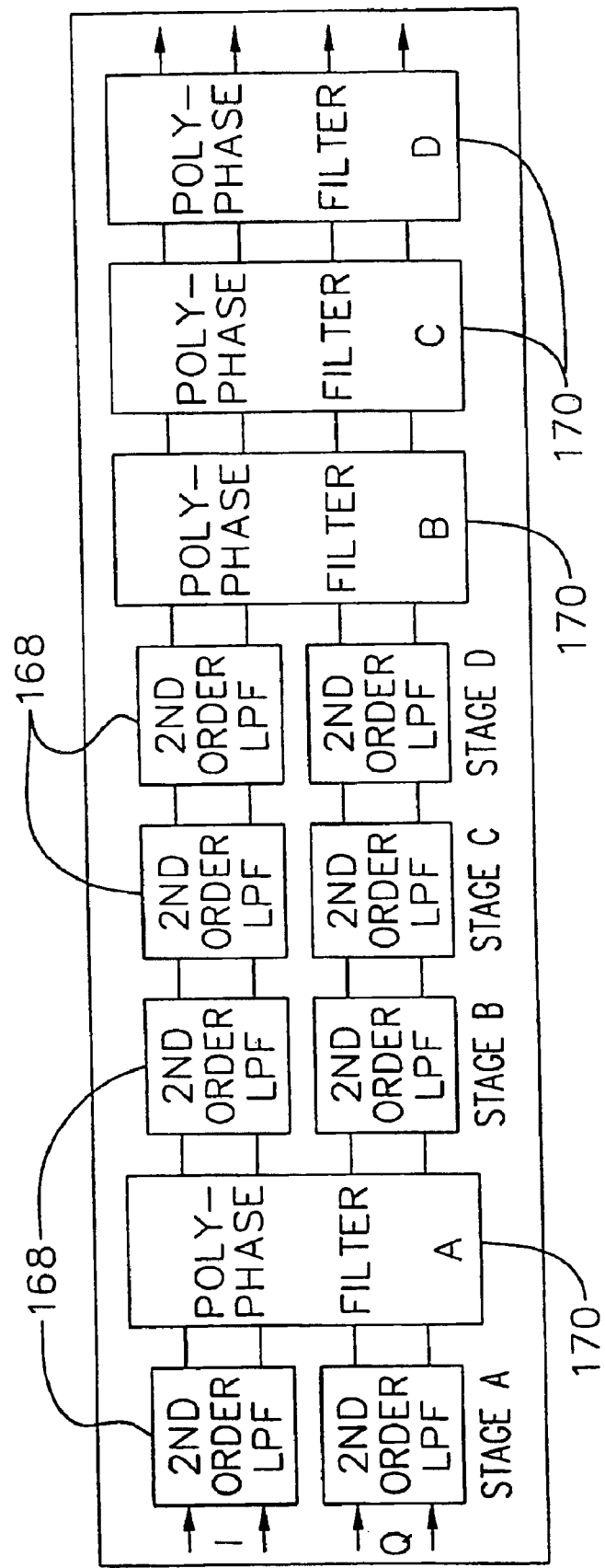
FIG. 13 is a block diagram of a complex bandpass filter using polyphase in accordance with an exemplary embodiment of the present invention.

FIG. 13 is a block diagram of the I-Q monolithic bandpass filter in accordance with an embodiment of the present invention. The I-Q monolithic bandpass filter includes a cascode of selectively intertwined biquads 168 and polyphase circuits 170. The biquads can be the same as the biquads described in Section 1.2.1 herein, or any other biquads known in the art. Similarly, the polyphase circuits can also be any conventional polyphase circuits known in the art. The biquad circuits can be 2'nd order lowpass filters, which in conjunction with the polyphase circuits, exhibit a 1-MHz bandwidth bandpass filter with more than 45 dB rejection for all frequencies beyond 2 MHz away from the center of the band. The number of biquads determines the order of the I-Q monolithic bandpass filter. The polyphase filters are for wider bandwidth and image rejection. The number of polyphase filters determines the number of zeros in the frequency response of the I-Q monolithic bandpass filter.

In the described embodiment, an 8'th order Butterworth filter is implemented in conjunction with selective side band filtering of polyphase circuits to create a low IF I-Q monolithic bandpass filter. The described embodiment of the I-Q monolithic bandpass filter does not suffer excessive group delay despite large bandwidth. The input IP3 can be better than 5 dBm with a gain of more than 20 dB and the noise figure can be less than 40 dB. In fully integrated embodiments of the present invention, the I-Q monolithic bandpass filter can have on chip tuning capability to adjust for process, temperature and frequency variations.

1.3 Programmable Multiple Gain Amplifier

In one exemplary embodiment of the present invention, a programmable multiple gain amplifier is used in the receiver path between the complex filter and the complex IF mixer (see FIG. 2). The programmable multiple gain amplifier can be designed to be programmable to select between a limiter and an AGC feature. The programmable multiple gain amplifier, when operating as a limiter provides a maximum gain for frequency modulation applications. The programmable-multiple gain amplifier, operating as an AGC, can be used for applications utilizing amplitude modulation.

Figure 14:
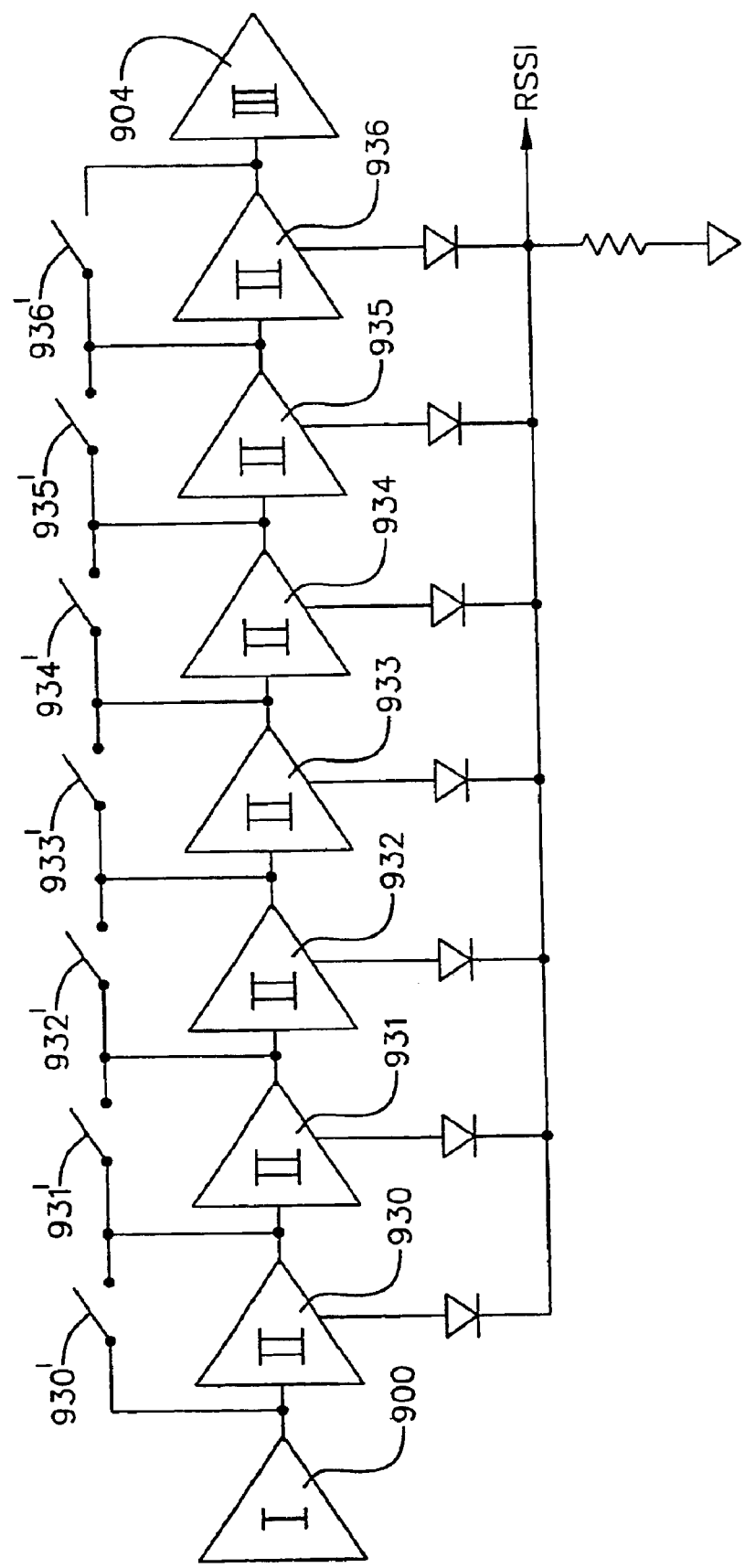
FIG. 14 is a block diagram of a programmable multiple stage amplifier in accordance with an exemplary embodiment of the present invention.

FIG. 14 shows a block diagram of an exemplary embodiment of the programmable multiple gain amplifier with an RSSI output. The RSSI output provides an indication of the strength of the IF signal. The programmable multiple gain amplifier includes three types of amplifiers. The input buffer is shown as a type I amplifier 900 and the type III amplifier 904 serves as the output buffer. The core amplifier is shown as a direct-coupled cascade of seven differential amplifiers 930, 931, 932, 933, 934, 935, 936. The core amplifier includes seven bypass switches 930', 931', 932', 933', 934', 935', 936', one bypass switch connected across each differential amplifier. The bypass switches provide programmable gain under control of the controller (see FIG. 2).

When the programmable gain amplifier is operating as a limiter, all the bypass switches will be opened by the controller. Conversely,when the programmable gain amplifier is operating in the AGC mode, the output gain of the core amplifier will be varied by controlling the bypass switch positions to prevent saturation of the core amplifier by large signals. In the described exemplary embodiment, the RSSI signal is fed back to control the bypass switch positions through a digital AGC loop in the external processing device. The AGC loop provides information to the controller 16 via the control bus 17 regarding the optimum gain reduction (see FIG. 2). The controller translates the information from the external processing device into a digital signal for controlling the bypass switch positions of the core amplifier accordingly. The larger the RSSI signal, the greater the gain reduction of the core amplifier will be and the more bypass switches that will be closed by the controller.

Figure 15:
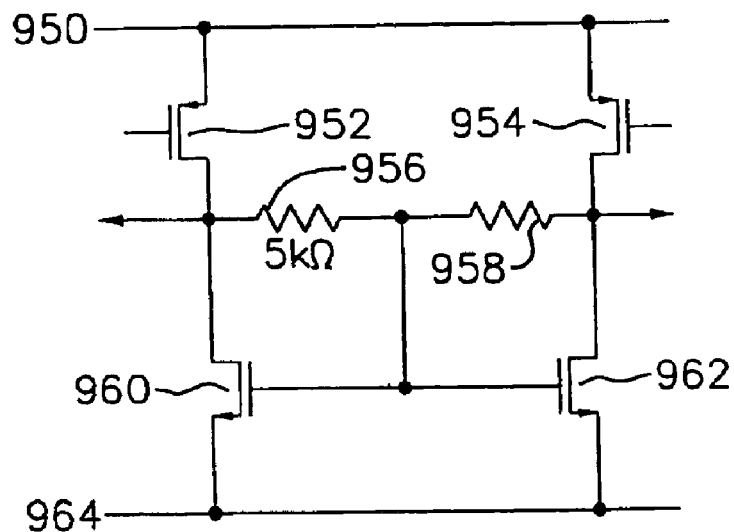
FIG. 15 is a block diagram of an input and/or output stage for the programmable multiple stage amplifier of FIG. 14 in accordance with an exemplary embodiment of the present invention.

In one embodiment of the programmable gain amplifier, the type I and type III amplifiers can be the same. FIG. 15 shows one possible construction of these amplifiers. In this configuration, transistors 952, 954 provide amplification of the differential input signal. The differential input signal is fed to the gates of transistor amplifiers 952, 954, and the amplified differential output signal is taken from the drains. The gain of the transistor amplifiers 952, 954 is set by load resistors 956, 958. Transistors 960, 962 provide a constant current source for the transistor amplifiers 952, 954. The load resistors 956, 958, connected between the drain of their respective transistor amplifiers 952, 954 and a common gate connection of transistors 960, 962, provides a bias current source to common mode feedback.

Turning back to FIG. 14, the type II core amplifier 902 includes a direct-coupled cascade of seven differential amplifiers 930, 931, 932, 933, 934, 935, 936, each with a voltage gain, by way of example, 12 dB. The voltage at the output of each differential amplifier 930, 931, 932, 933, 934, 935, 936 is coupled to a rectifier 937, 938, 939, 940, 941, 942, 943, 944, respectively. The outputs of the rectifiers are connected to ground through a common resistor 945. The summation of the currents from each of the rectifiers flowing through the common resistor provides a successive logarithmic approximation of the input IF voltage. With a 12 dB gain per each differential amplifier, a total cascaded gain of 84 dB is obtained. As those skilled in the art will appreciate, any number of differential amplifiers, each with the same or different gain, may be employed.

The input dynamic range of an RSSI is explained using the following derivation. Throughout this section, assume each rectifier has an ideal square law characteristic and its transfer function is:

$$y = \beta^2 V_{in}^2 \quad (20)$$

Now, assume that S is the maximum input range of one differential amplifier and rectifier combination, whichever is smaller. This is determined with the lowest of the two values $V_i$ and $V_L$ that are the maximum input range of each differential amplifier, and the maximum input range of the rectifier, respectively.

$$S = \min(V_i, V_L) \quad (21)$$

Therefore, the RSSI maximum input level is S, and the ideal RSSI minimum input level is $S/A^n$, where A is the gain of each differential amplifier and n is the number of the differential amplifiers. Thus, the ideal dynamic range is calculated as follows:

$$\text{Ideal Dynamic Range} = 20\log\frac{S}{\frac{S}{A^n}} = 20\log A^n = 20(n)\log A \quad (22)$$

However, in the case of a large amount of gain, the input level will be limited with the input noise and the dynamic range will also be limited to:

$$\text{Dynamic Range} = 20\log\frac{S}{\sqrt{\sigma_n}} \quad (23)$$

-continued $\sqrt{\sigma_n}$ = total noise rms $\sigma_n = (BW) \times \text{Noise Factor}$ If each differential amplifier has the same input dynamic range $V_L$ and each full-wave rectifier has similar input dynamic range $V_i$, then the dynamic range of the logarithmic differential amplifier and the total RSSI circuitry are the same.

The logarithmic approximations are provided by piecewise linear summation of the rectified output of each differential amplifier. This is done by segmentation of the input voltage by the power of 1/A. Successively, each differential amplifier will reach the limiting point as the input signal grows by the power of A. Assuming each rectifier is modeled as shown in equation (20), the logarithmic approximation is modeled as following:

For an input being in the following range:

$$\frac{S}{A^{n-m}} < V_{in} < \frac{S}{A^{n-m-1}} \quad (24)$$

up to the last m stages of the differential amplifier are all being limited and the rest of the differential amplifiers are in the linear gain region. Therefore, the RSSI is shown to be:

$$A^2\beta^2 V_{in}^2 + A^4\beta^4 V_{in}^2 + \ldots + A^{2(n-m)}\beta^{2(n-m)} V_{in}^{2(n-m)} + m\beta^2 S^2 = RSSI \quad (25)$$

This is further simplified to:

$$RSSI = \frac{(A\beta)^2}{(A\beta)^2 - 1} V_{in}^2 [(A\beta)^{2(n-m-1)} - ] + m\beta^2 S^2 \quad (26)$$

$$RSSI = \frac{1}{(A\beta)^2 - 1} V_{in}^2 (A\beta)^{2(n-m)} + m\beta^2 S^2 \quad (27)$$

The above equation is a first order approximation to the logarithmic function shown in equation (28) according to the first two terms of the Taylor expansion at a given operating point.

$$\text{Ideal RSSI} = C \log V_{in}^2 \quad (28)$$

The following calculates the constant C from the maximum and minimum of the RSSI:

$$\text{Max } RSSI - \text{Min } RSSI = C \log A^{2n} \quad (29)$$

$$\Delta RSSI = C \log A^{2n} \quad (30)$$

$$C = \frac{\Delta RSSI}{2n \log A} \quad (31)$$

$$(\text{Ideal}) RSSI = \frac{\Delta RSSI}{2n \log A} \log V_{in}^2. \quad (32)$$

To find the relation between the gain of a differential amplifier, the gain of a rectifier, and the maximum input range of the combined differential amplifier and the rectifier, the RSSI will be calculated for the two consecutive differential amplifier and rectifier combinations (see equations (33) and (34)) for both ideal RSSI equations (32) and approximated RSSI equation (27):

$$V_{in1} = \frac{S}{(A)^{n-m}} \quad (33)$$

$$V_{in2} = \frac{S}{(A)^{n-m-1}} \quad (34)$$

(Ideal) $RSSI_2 - RSSI_1 = \log(A)^2$ (35)

(Approximated) $RSSI_2 - RSSI_1 = {}^2S^2$ (36)

Therefore, $$C \log(A)^2 - \beta^2 S^2 \quad (37)$$

Using equations (18) and (12), the following expression is achieved:

$$\frac{\Delta RSSI}{n} = \beta^2 S^2 \quad (38)$$

Plugging equation (19) into (8) results in the following:

$$RSSI = \frac{1}{(A\beta)^2 - 1}(A\beta)^{2(n-m)}V_{in}^2 + m\frac{\Delta RSSI}{n}; \frac{S}{A^{n-m}} < V_{in} < \frac{S}{A^{n-m-1}} \quad (39)$$

Figure 16A:
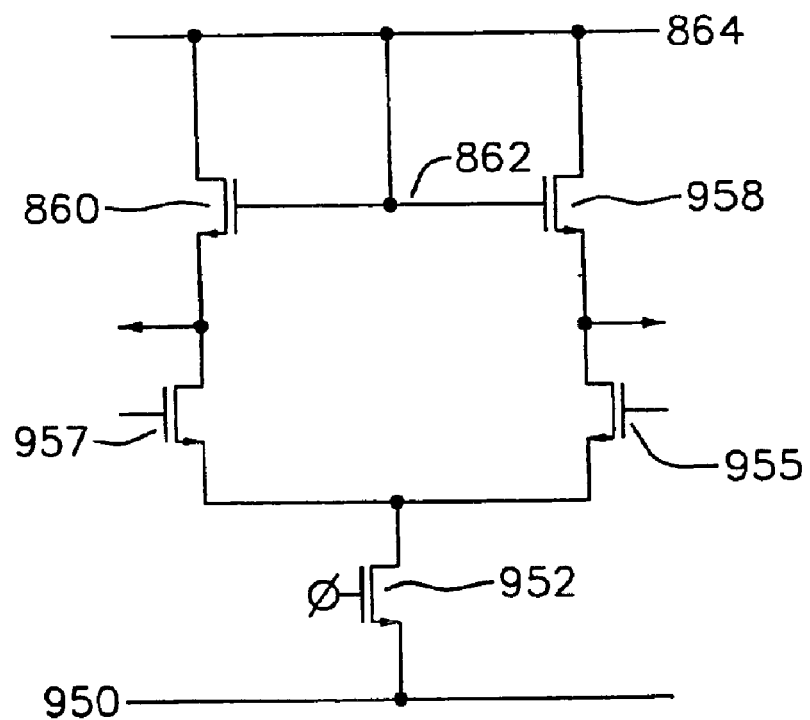
FIG. 16(a) is a block diagram of one core amplifier stage of the programmable multiple stage amplifier of FIG. 14 in accordance with an exemplary embodiment of the present invention.

FIG. 16(a) shows a schematic diagram for an exemplary embodiment of the differential amplifier used in the type II core amplifier. The differential input signal is fed to the gates of transistor amplifiers 955, 957. The amplified differential output signal is provided at the drains of the transistor amplifiers 955, 957. The gain of the transistor amplifiers is set by load transistors 958, 860, each connected between the drain of one of the transistor amplifiers and a power source. More particularly, the gain of the differential amplifier is determined by the ratio of the square root of transistor amplifiers-to-load transistors.

$$\text{Gain}(A) = \sqrt{\frac{w_i}{w_{in}}} \quad (40)$$

$$= \sqrt{\frac{200}{6}} \approx 5.8$$

The sources of the transistor amplifiers 955, 957 are connected in common and coupled to a constant current source transistor 952. In the described exemplary embodiment, the controller provides the bias to the gate of the transistor 952 to set the current.

Figure 16B:
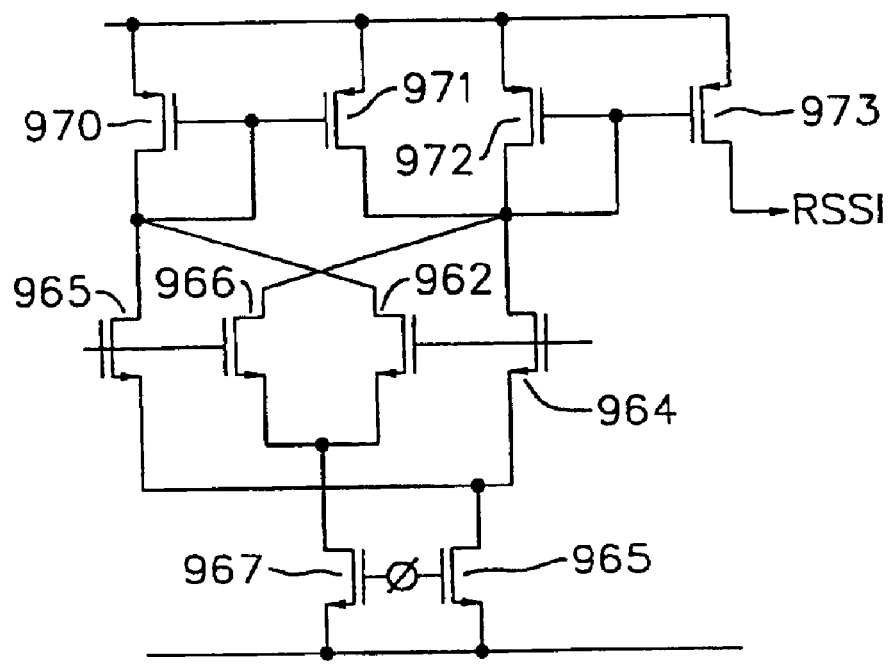
FIG. 16(b) is a block diagram of a full-wave rectifier of the of the programmable multiple stage amplifier of FIG. 14 in accordance with an exemplary embodiment of the present invention.

An exemplary embodiment of the full-wave rectifier with two unbalanced source coupled pairs cross-coupled is shown in FIG. 16(b). In this embodiment, the differential input signal is fed to an unbalanced pair of transistors. One of the differential input pairs is fed to the gates of the unbalanced transistor pair 968, 966 and the other differential input pair is fed to the gates of the other unbalanced transistor pair 964, 962. The drains of transistors 968, 962 are connected in common and provide one of the differential output pairs. The drains of transistors 964, 966 are connected in common and provide the other differential output pair. Transistors 968, 964 are connected in a common source configuration and coupled to a constant current source transistor 965. Transistors 962, 966 are also connected in a common source configuration with the common source connected to a current source transistor 967. The gates of the current sources 965, 967 are connected together. In the described exemplary embodiment, the controller provides the bias to the common gate connection to set the current.

Transistors 970 and 971 provide a current-mirror load to cross-coupled transistors 968, 962. Similarly, transistors 972, 973 provide a current-mirror load to cross-coupled transistors 962, 964. The current through the cross-coupled transistors 962, 964 is the sum of the current through the load transistor 972 and the current through the load transistor 971 which is mirrored from the load transistor 970. The current through the cross-coupled transistors 962, 962 is also mirrored to load transistor 973 for the RSSI output.

When the transistors 962, 964, 966, and 968 are operating in the saturation region, the following equations are shown for the differential output current $DI_{SQB1}$ where k is the ratio of the two unbalanced source-coupled transistors:

$$\text{if } \Delta I_{SQMI} = (I_{D1} + I_{D4}) - (I_{D2} + I_{D3}) \quad (41)$$

$$= 2(I_{DC} + I_{SQ})$$

$$= 2\frac{k-1}{k+1}I_o - 4\frac{k(k-1)\beta_N}{(k+1)^2}V_I^2$$

The input dynamic range of the full rectifier is then:

$$\text{if } \Delta I_{SQMI} = O, V_i = \pm \frac{\sqrt{I_o}}{\beta_N}\frac{\sqrt{k+1}}{2k} \quad (42)$$

The full-wave rectifier includes two unbalanced differential pairs with a unidirectional current output. One rectifier 976 taps each differential pair and sums their currents into a 10 kW resistor $R_L$.

The square law portion of equation (41) multiplied by the resistance provides the $\beta^2 S^2$ of equation (42):

$$\beta^2 S^2 = 4\frac{k(k-1)\beta_N}{(k+1)^2}V_i^2 R_L \quad (43)$$

By plugging the $V_i$ from equation (42) and replacing $\beta^2 S^2$ from equation (38), the following relation is obtained:

$$\frac{\Delta RSSI}{n} = 2\frac{k-1}{k+1}I_o R_L \quad (44)$$

For $\Delta RSSI = 1V$, n=7 stages, $R_L = 10000 \Omega$, and k=4, from the above equation $I_0$ is calculated to be 12 mA. Therefore, each rectifier will be biased with two 12 mA current sources (one 12 ma current source for the I signal and a second 12 ma current source for the Q channel). This results in an approximately logarithmic voltage, which indicates the received signal-strength (RSSI).

1.4 Complex IF Mixers

Figure 17A:
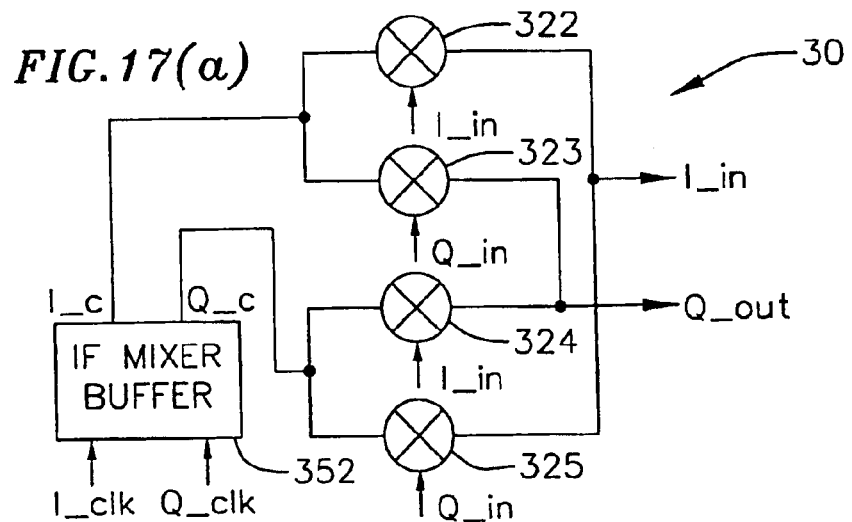
FIG. 17(a) is an IF mixer in accordance with an exemplary embodiment of the present invention.

The IF down conversion to baseband signal can be implemented using four fully balanced quadrature mixers as shown in FIG. 17(a). This mixer configuration includes both quadrature inputs from the programmable multiple stage amplifier and quadrature IF clocks from the LO generator. This configuration produces single sideband, quadrature baseband signals, with minimum number of spurs at the output. These characteristics aid in relaxing the baseband filtering as well as simplifying the demodulator architecture. An IF mixer buffer 352 buffers the IF clock (Clk_I, Clk_Q as shown in FIG. 17(a)).

Figure 17B:
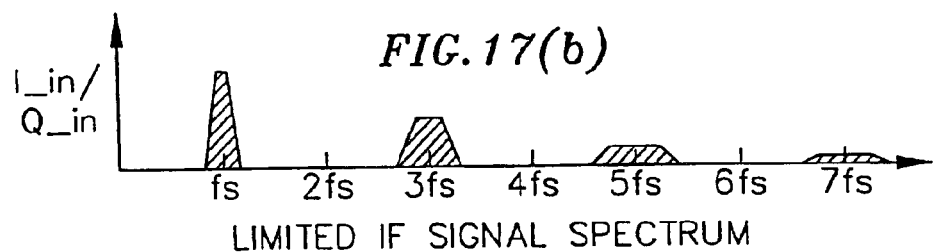
FIG. 17(b) is a graphical depiction of a frequency spectrum for the limited IF clocks into the mixer of FIG. 17(a) in accordance with an exemplary embodiment of the present invention.
Figure 17C:
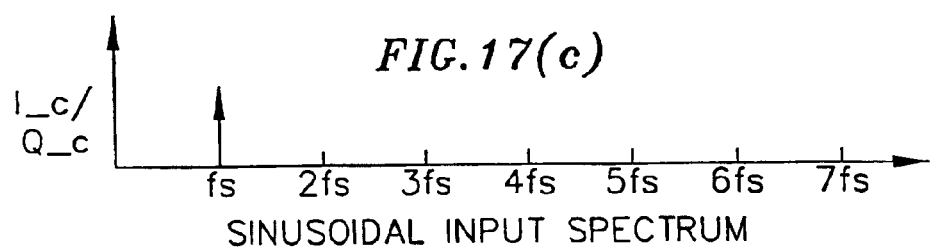
FIG. 17(c) is a graphical depiction of a frequency spectrum for the IF input into the mixer of FIG. 17(a) in accordance with an exemplary embodiment of the present invention.
Figure 17D:
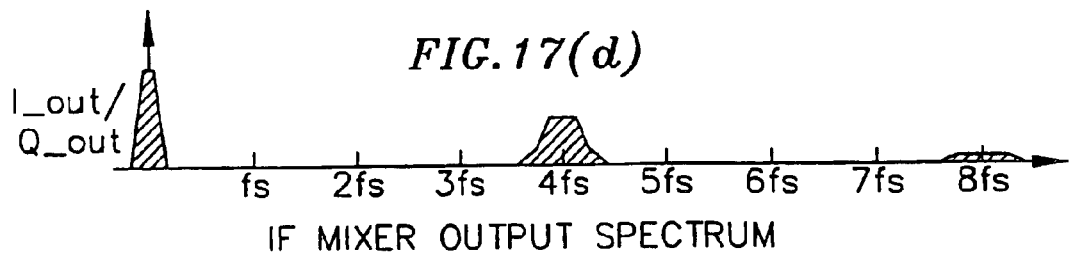
FIG. 17(d) is a graphical depiction of a frequency spectrum for the output of the mixer of FIG. 17(a) in accordance with an exemplary embodiment of the present invention.

The outputs of the limiters are coupled to the quadrature clocks of the IF mixers (L_in for mixer 322, I_in for mixer 323, Q_in for mixer 324, Q_in for mixer 325) and the IF clocks are coupled to the data input of the IF mixers. This configuration minimizes spurs at the output of the IF mixers because the signal being mixed is the IF clocks which is a clean sine wave, and therefore, has minimal harmonics. The limiting action of the programmable multiple stage amplifier on the I and Q data will have essentially no effect on the spurs at the output of the IF mixers. FIG. 17b shows the IF mixer clock signal spectrum which contains only odd harmonics. The IF signals do not have even harmonics in embodiments of the present invention using a fully differential configuration. The bandwidth of the m'th(=2n+1) harmonic is directly proportional to mfs, whereas its amplitude is inversely proportional to mfs. FIG. 17c shows the sinusoidal input spectrum of the IF clocks. FIG. 17d shows the IF mixer output spectrum.

1.5 Clock Generator

Figure 18:
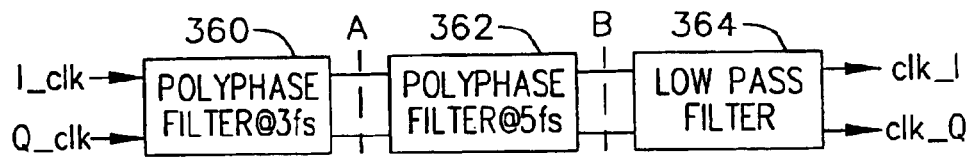
FIG. 18 is a clock generator in accordance with an exemplary embodiment of the present invention.
Figure 19A:
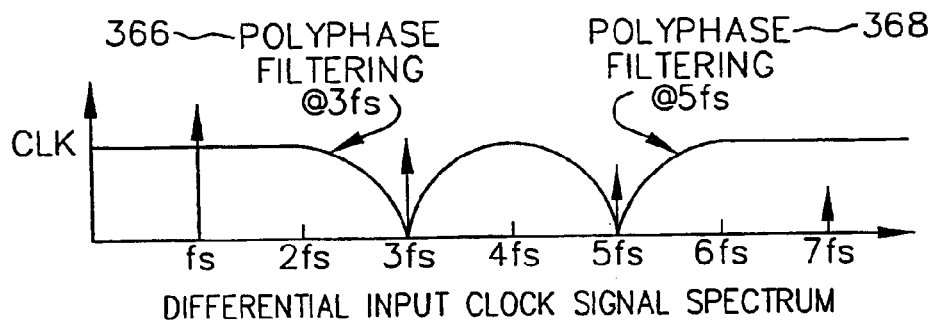
FIG. 19(a) is a graphical depiction of a clock signal spectrum input into the clock generator of FIG. 18 in accordance with an exemplary embodiment of the present invention.
Figure 19B:
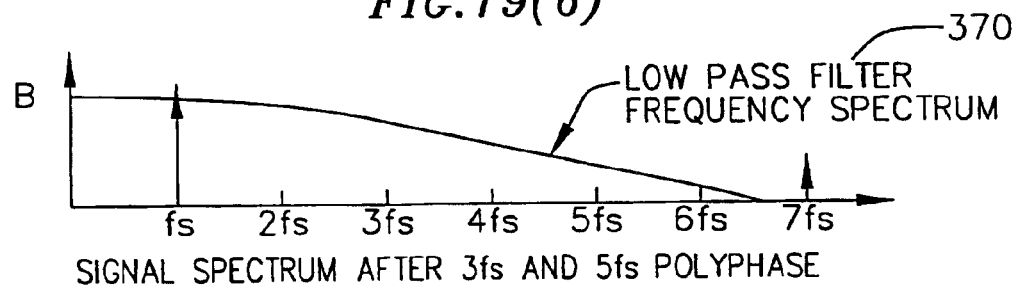
FIG. 19(b) is a graphical depiction of a signal spectrum at the output of a two second stage polyphase filter of the clock generator of FIG. 18 in accordance with an exemplary embodiment of the present invention.
Figure 19C:
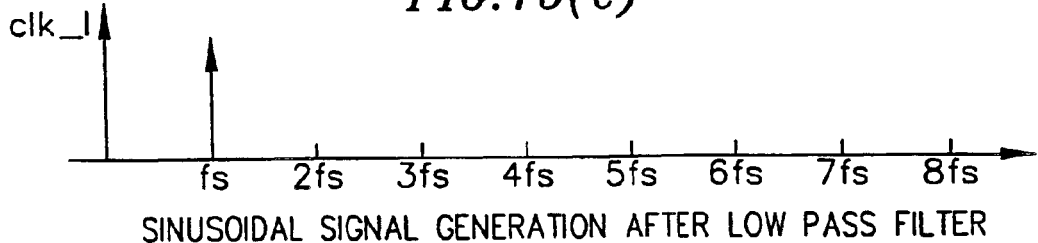
FIG. 19(c) is a graphical depiction of the signal spectrum output from a low pass filter of the clock generator of FIG. 18 in accordance with an exemplary embodiment of the present invention.

A clock generator can be used to generate the quadrature IF clocks (see FIG. 17(c)) for use in the complex mixer described above. The clock generator can be located in the receiver, or alternatively the LO Generator, and provides a clean sinusoidal IF from the square wave output of the divider in the LO Generator for downconverting the IF signal in the receiver path to baseband. FIG. 18 shows a block diagram and signal spectrum of a clock generator. A sinusoidal signal is generated from a square-wave using cascaded polyphase. FIG. 18 shows a clock generator block diagram. The clock generator outputs clk_I and clk_Q for the IF mixer buffer (see FIG. 17(c)). The clock generator includes a polyphase filter at 3fs 360, a polyphase filter at 5fs 362, and a low pass filter 364. FIG. 19a shows the IF clock signal spectrum from the divider output. FIG. 19b shows the spectrum after the 3fs 366 and 5fs 368 polyphase filters. FIG. 19c shows the sinusoidal signal generation after the low pass filter 364.

In fully integrated embodiments of the present invention, the controller can provide self calibration to generate precise signal levels with negligible dependency on the process variations. The two polyphase filters 360, 362 with RC calibration can be used to remove the first two odd harmonics of the signal. The remaining harmonics can be filtered with an on chip tunable low pass filter. The output of the clock generator block is a quadrature sinusoidal signal with controlled signal level. This spectrally clean signal is used at the input of complex IF mixers to downconvert the IF signal to baseband.

1.5.1 Polyphase Filter

Figure 19D:
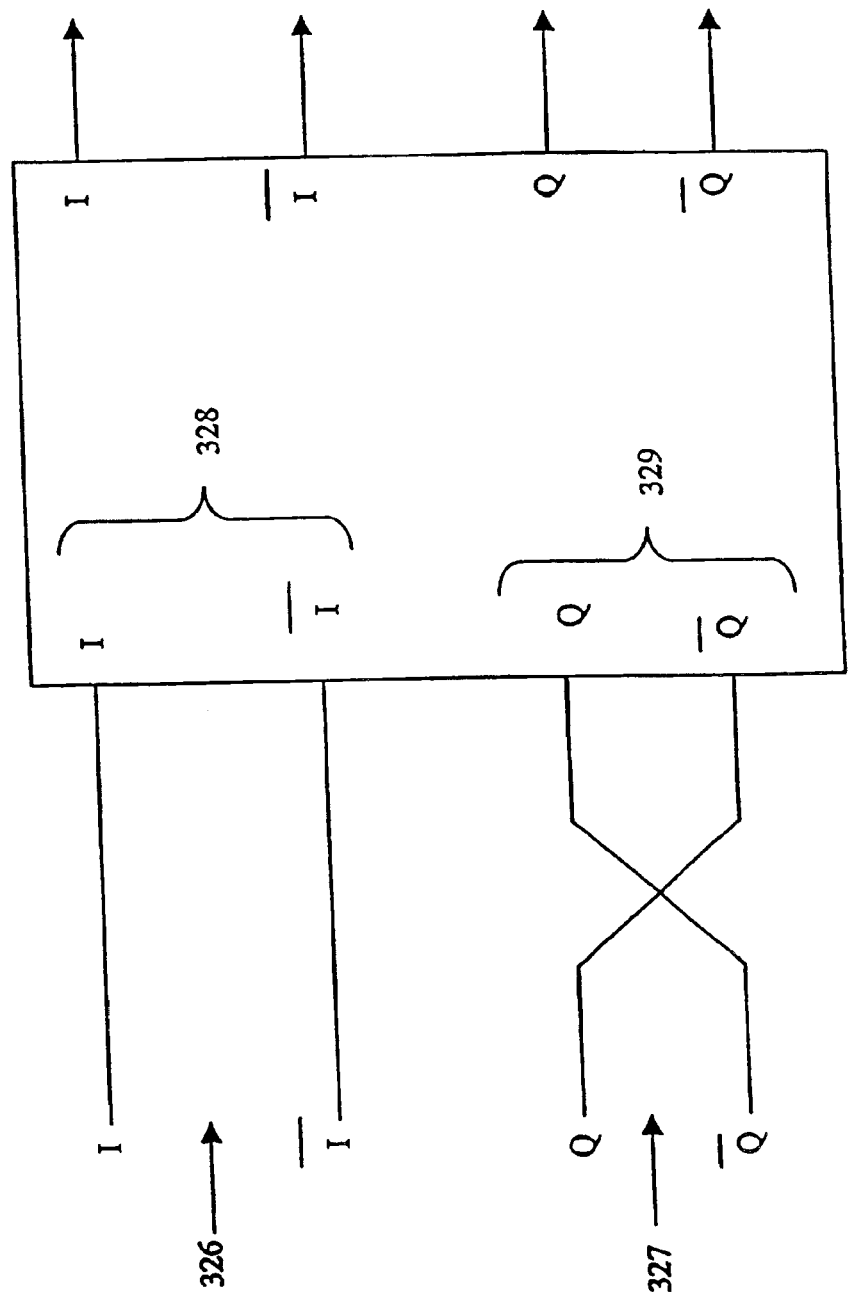
FIG. 19d is a block diagram of an exemplary polyphase filter.

An exemplary polyphase filter is shown in FIG. 19d. The polyphase filter is differential having a differential I input 328 and a differential Q input 329. In the described exemplary embodiment, the differential I signals 326 are coupled to the differential I inputs 328, but the differential Q signals 327 are coupled to their respective inverted Q inputs 329. In particular, the I signal is coupled to the I input, the I* signal is coupled to the I* input, the Q signal is coupled to the Q* input, and the Q* signal is coupled to the Q input. The inverse connection of the Q signal results in a notch frequency at the output at the zero of the polyphase filter. The same result can be achieved by inversely connecting the I signals to the I inputs while the Q signals maintain the sane polarity relative to the Q inputs to the polyphase filter.

The notch frequency can be programmed by the controller by shifting the zero of the polyphase filter. Referring back to FIG. 18, the controller programs the zero of first stage polyphase filter 360 to notch the 3fs at the I and Q output. The I and Q output of the first stage polyphase filter 360 is coupled to the second stage polyphase filter 362 with the Q outputs of the first stage polyphase filter inversely connected to the Q inputs of the second stage polyphase filter. With this configuration, the controller can program the zero of the second stage polyphase filter to notch the 5fs frequency of the I and Q output from the second stage polyphase filter. The low pass filter 364 can then be used to remove unwanted signals at frequencies above 5fs.

Figure 19E:
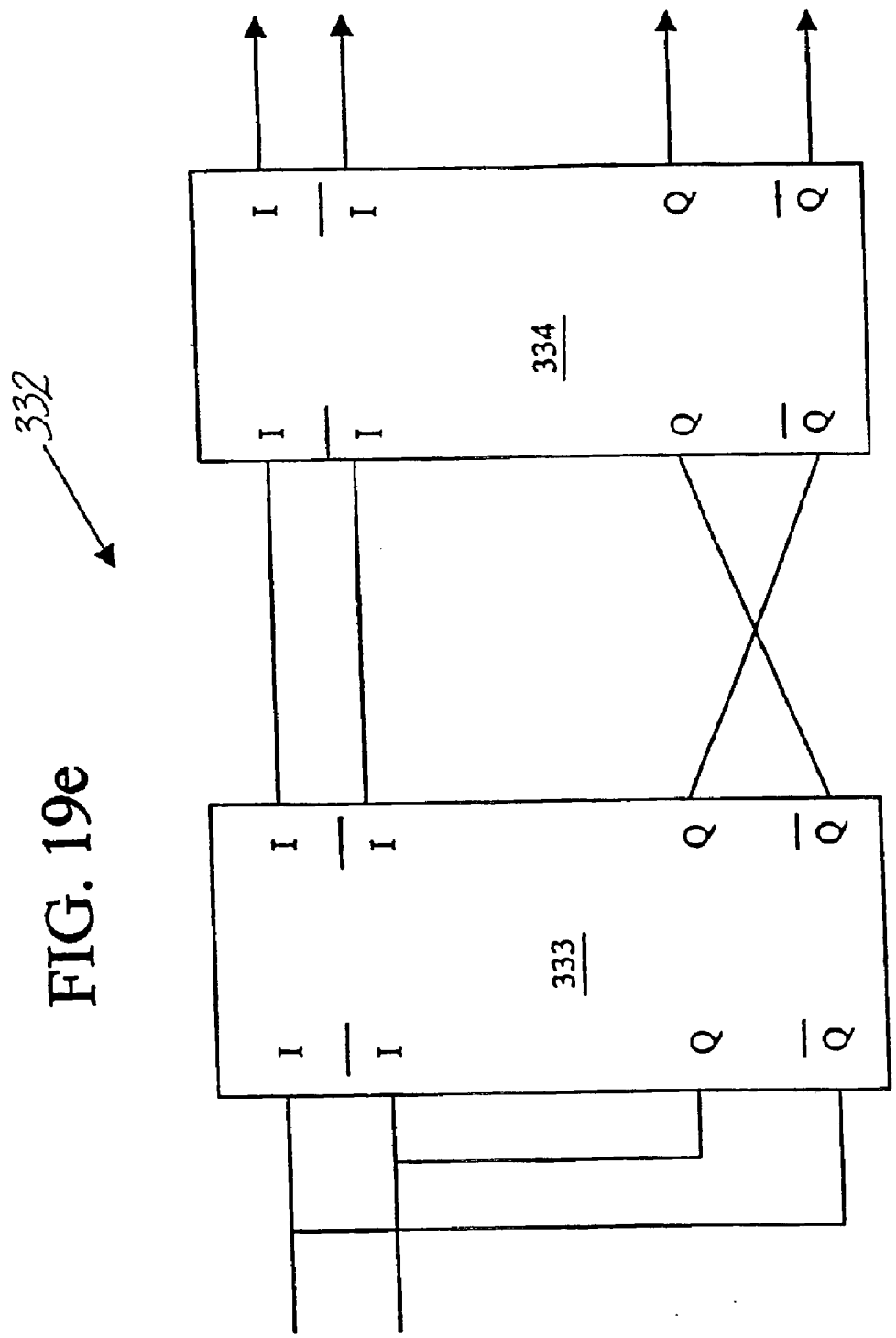
FIG. 19e is a block diagram of a polyphase filter including a two-stage polyphase filter.

Although the exemplary polyphase filter has been described in the context of a transceiver system using quadrature signals, the illustrated concepts are by no means limited to such systems. The polyphase filter can be used to notch undesired frequencies or spurious signals in various other systems such systems utilizing differential signals that are not quadrature. In such systems, the polyphase filter includes a two-stage polyphase filter 332 as shown in FIG. 19e. The first stage polyphase filter 333 generates a quadrature signal from a differential input signal at the zero of the polyphase filter. The second stage polyphase filter 334, with the Q signals inversely connected, has a notch frequency programed to reject the quadrature signal output from the first stage.

In the described exemplary system without quadrature signals, the differential input signal has one signal connected to both the I and Q* input of the first stage polyphase filter and the other signal connected to the I* and Q input of the first stage polyphase filter. The output of the first stage polyphase filter, which has been converted to a differential quadrature output at the zero of the polyphase, can now be connected to the second stage polyphase filter in the same manner as the polyphase filter described in connection with the transceiver using quadrature signals. That is, the polarity of the I outputs of the first stage can be maintained with respect to the I inputs to the second stage while the Q outputs of the first stage are inversely connected to the Q inputs of the second stage.

Figure 19F:
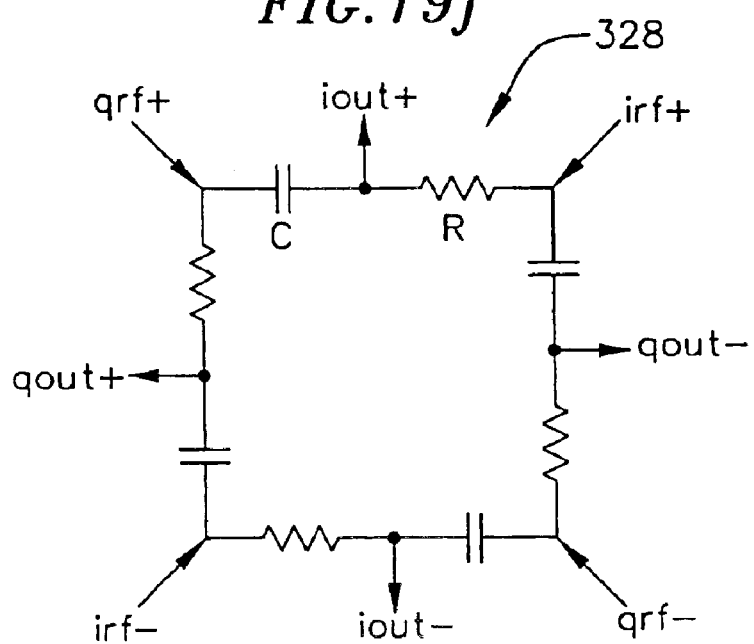
FIG. 19f is a schematic of an exemplary embodiment of a polyphase structure.

FIG. 19f is an exemplary embodiment of a polyphase structure. The polyphase structure 335 shows the differential signals as coupled from the previously described embodiments and is a passive RC structure. RC components are used in low and high pass filtering. They are also used them to shift the phase of the signals and, as described above, sometimes to generate quadrature signals.

Figure 19G:
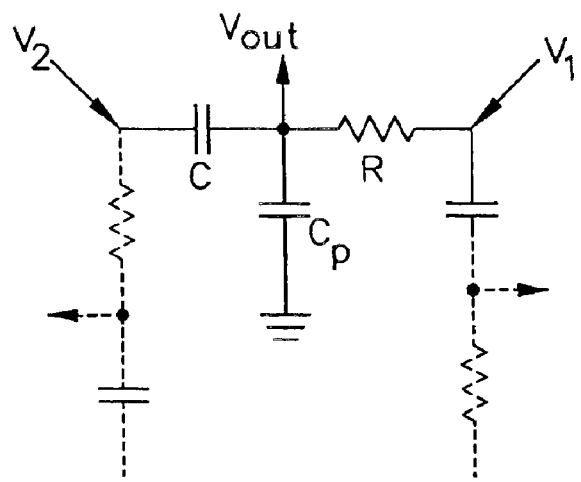
FIG. 19g is a schematic of a branch of the RC network of FIG. 19f

FIG. 19g is a branch of the RC network of FIG. 19f. Polyphase function is analyzed by looking at only one branch of the RC network as shown in with parasitic capacitance $C_p$. For the purposes of analysis, a differential input with a first signal at $V_1$ and a second signal at $V_2$ will be considered. The combined output $V_{OUT}$ of the polyphase is described by:

$$V_{out}=V_1(R(C_p+C)s+1)^{-1}+(V_2RCs)(R(C_p+C)s+1)^{-1}$$

The RC values can be selected for the desired poles and zeros by the following equations:

$$\omega_p=(R(C_p+C))^{-1}$$

$$\omega_0=(RC)^{-1}$$

1.6 Programmable Low Pass Filter

The first major spurs out of downconversion process is at 4 times the IF frequency. A self calibrated 4fs polyphase filter as described above can be used after the complex IF mixers to reduce the spurious and improve the linearity of the demodulator.

Following the polyphase filter, a quadrature lowpass filter can be used to remove unwanted spurs. The lowpass filter can be programmable and designed to minimize group delay distortion without sacrificing high frequency filtering characteristics.

In fully integrated embodiments of the present invention, the controller can provide on chip RC calibration to minimize any process variation. The programmability of the polyphase filter and the low pass filter adds a new degree of flexibility to the system; it can be used to accommodate different data bandwidths.

Figure 20A:
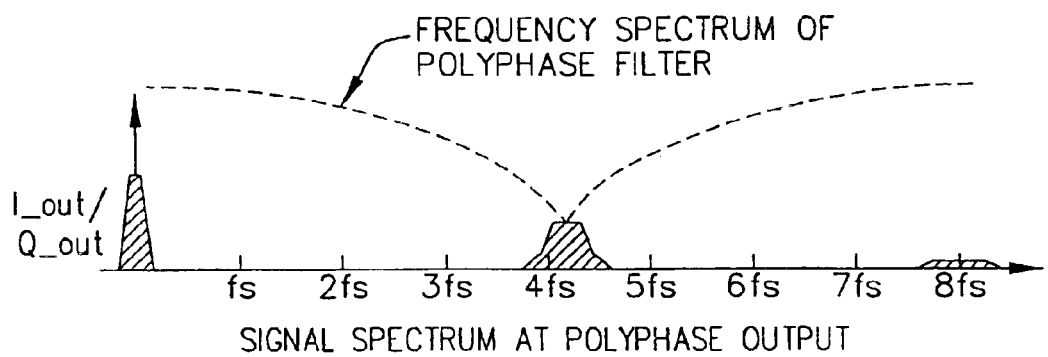
FIG. 20(a) is a graphical depiction of a signal spectrum at the input to a polyphase filter in accordance with an exemplary embodiment of the present invention.
Figure 20B:
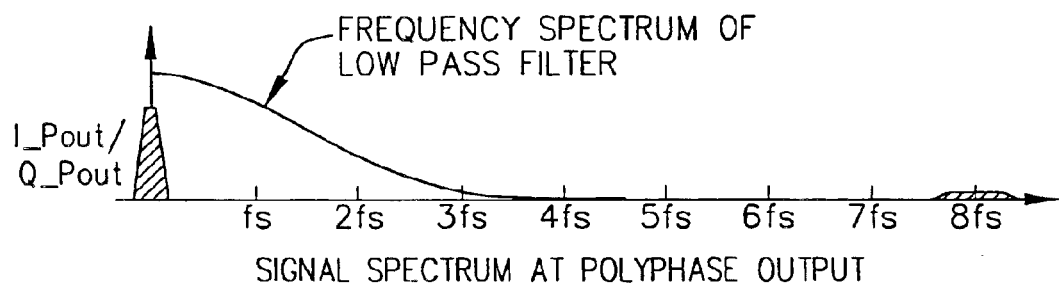
FIG. 20(b) is a graphical depiction of a signal spectrum at the output of the polyphase filter in accordance with an exemplary embodiment of the present invention.
Figure 20C:
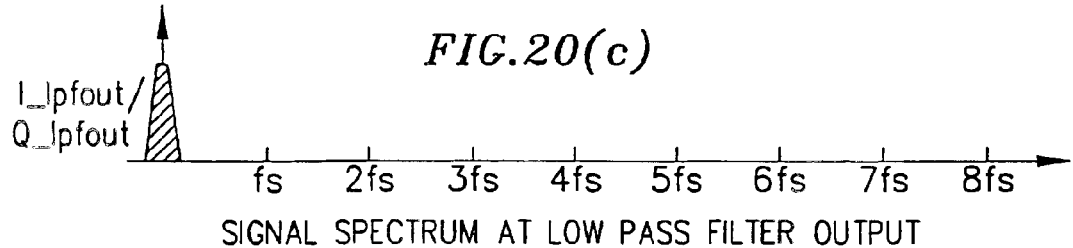
FIG. 20(c) is a graphical depiction of the signal spectrum output from a low pass filter of the polyphase filter in accordance with an exemplary embodiment of the present invention.

FIG. 20 shows a baseband spectrum filtering before the discriminator. FIG. 20(a) shows the signal spectrum at polyphase input, i.e., the frequency spectrum of the polyphase filter. FIG. 20(b) shows the signal spectrum at polyphase output, i.e. the frequency spectrum of the low pass filter. FIG. 20(c) shows the signal spectrum at the low pass filter output 1.7 High Data Rate Frequency Demodulator The demodulator may take on various forms to accommodate different modulation schemes. One embodiment of the demodulation used in connection with the present invention includes a low power, monolithic demodulator for high data rates in frequency modulated systems. This demodulator can provide data recovery for well over 1-MHz data rates.

The demodulator can be FSK or GMSK demodulator. FSK is digital frequency modulation. GMSK is a specific type of FSK. GMSK stands for Gaussian filtered FSK modulation, which means that GMSK has gaussian filtering at the output of frequency modulation. GMSK has more stringent requirements than FSK. The data rate is higher for GMSK and the modulation index is low for GMSK relative to FSK.

The described embodiment of the demodulator is a low power, fully integrated FSK/GMSK demodulator for high data rates and low modulation index. The FSK operates with the programmable gain stage amplifier as a limiter, and therefore, does not require oversampling clocks or complex AGC blocks.

Figure 21:
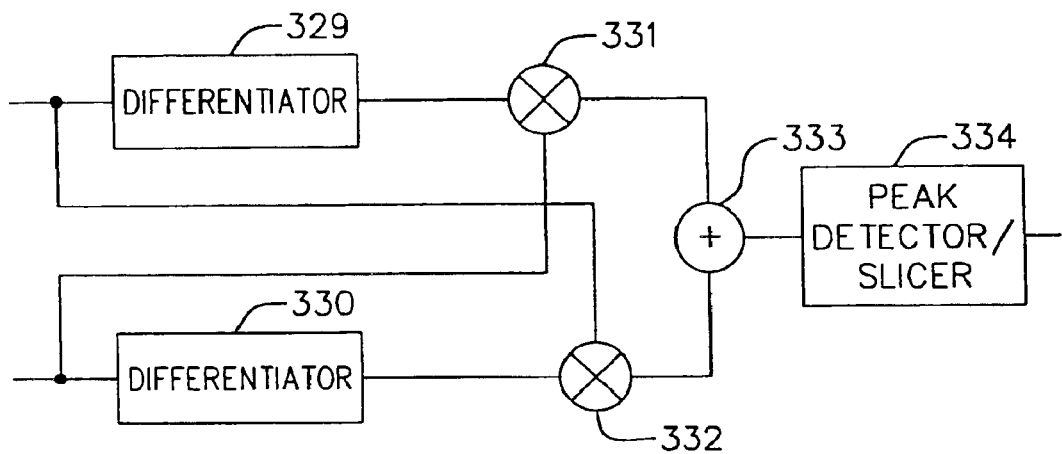
FIG. 21 is a block diagram of a demodulator in accordance with an exemplary embodiment of the present invention.

FIG. 21 is a block diagram of an exemplary high data rate frequency demodulator in accordance with the present invention. The demodulator performs a balanced quadrature demodulation. Differentiators 329, 330 convert the baseband signal to a signal having an amplitude proportional to the baseband signal frequency. One differentiator 329 converts the I signal and the other differentiator 330 converts the Q signal. The I signal output of the differentiator 329 is coupled to a multiplier 331 where it is multiplied by the Q signal input into the demodulator. The Q signal output of the differentiator 330 is coupled to a multiplier 332 where it is multiplied by the I signal input into the demodulator. The multipliers 331, 332 produce a single ended DC signal. The DC signals are summed together by summation circuit 333. A peak detector/slicer 334 digitizes the DC signal from the summation circuit, thereby producing discrete zeros and ones.

Figure 22:
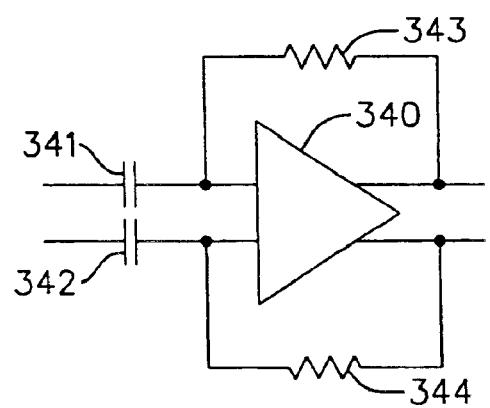
FIG. 22 is a block diagram of a differentiator of the demodulator of FIG. 21 in accordance with an exemplary embodiment of the present invention.

The frequency discrimination can be performed using a differentiator as shown in FIG. 22. A differential input signal is coupled to the input of an amplifier 340 through capacitors 341, 342. A feedback resistor 343, 344 is coupled between each differential output. Its operation is based on generating an output signal level linearly proportional to the incoming signal frequency. In other words, the higher the incoming frequency, the larger signal amplitude output by the differentiator. Therefore, it is desirable to have a spur free signal at the input of this stage. High frequency spurs can degrade the performance of the differentiator. By using the polyphase filter in conjunction with the lowpass filter (see FIG. 2) before the demodulator, a nearly ideal baseband signal is input to the differentiator. The capacitors 341, 342 in the signal path with the resistive feedback operation of the amplifier is proportional to the time derivative of the input. For a sinusoidal input, V(in)=A.sin($\omega$t), the output will be V(out):d/dt(V(in))=to.A.cos($\omega$t). Thus, the magnitude of the output increases linearly with increasing frequency.

The controller provides RC calibration to keep the differentiation gain process invariant. In order to reduce the effect of any high frequency coupling to the differentiator input, the differentiator gain is flattened out for frequencies beyond the band of interest. In addition to frequency discrimination, the differentiation process adds a 90 degrees phase shift to the incoming signal. This phase shift is inherent to differentiation process. Since the output is in quadrature phase with the input (except for differing amplitude), cross multiplication of the input and output results in frequency information.

Figure 23:
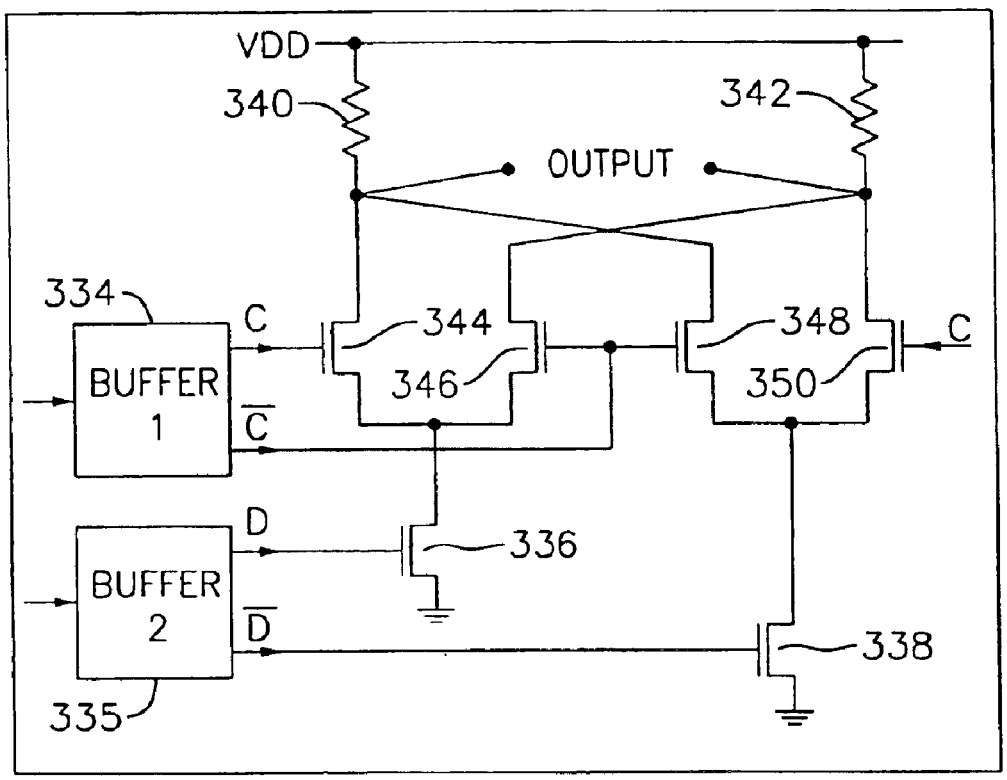
FIG. 23 is a block diagram of a multiplier of the demodulator of FIG. 21 in accordance with an exemplary embodiment of the present invention.

FIG. 23 shows an exemplary analog multiplier 331, 332 with zero higher harmonics in accordance with the present invention. Buffers one 334 and two 335 are added to a Gilbert cell to linearize the voltage levels. Buffers one 334 and two 335 convert the two inputs into two voltage levels for true analog multiplication using a Gilbert cell. The Gilbert cell is comprised of transistors 336, 338, resistors 340, 342 and cross-coupled pairs of transistors 344, 346 and transistors 348, 350.

By cross multiplying the input and the output signals to the differentiator, the amplitude information is generated. Since the signals are at baseband, it can be difficult to filter out any spurs resulting from the multiplication process. Linearized buffers can be used to minimize spurs by providing a near ideal analog multiplier. On chip calibration can also be used to control the multiplication gain and to minimize process variation dependency. In order to accommodate high data rates such as 1 MHz and beyond, all the stages should have low phase delays. In addition, matching all the delays in quadrature signals can be advantageous.

The output of the multiplier is a single ended DC signal which is a linear function of the frequency. This analog output can represent multilevel FSK with arbitrary modulation index. The minimum modulation index is only limited by wireless communication fundamentals.

Figure 24:
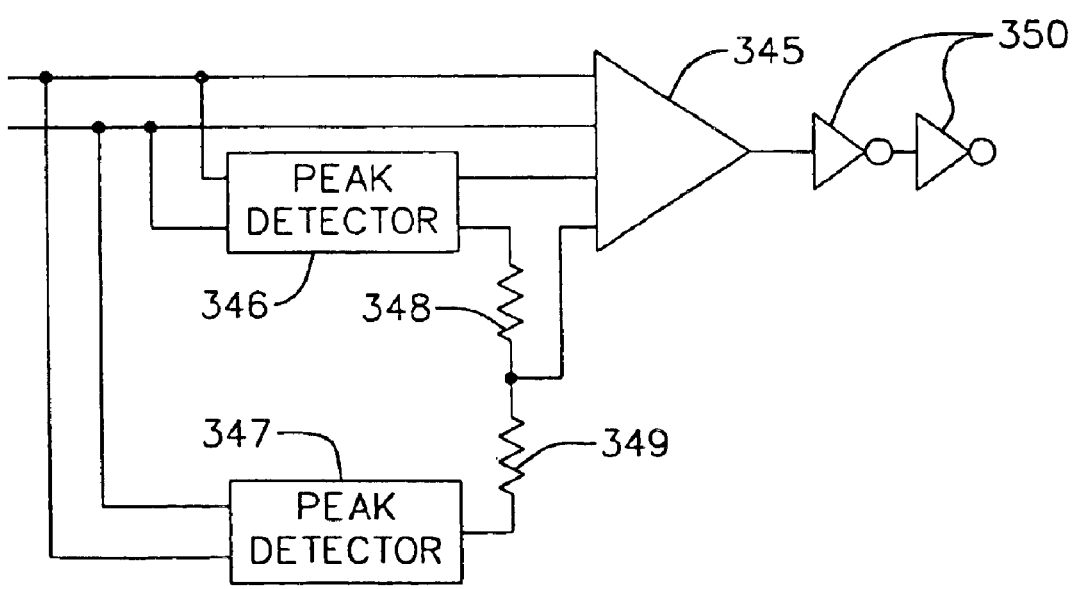
FIG. 24 is a block diagram of a peak detector/slicer of the demodulator of FIG. 21 in accordance with an exemplary embodiment of the present invention.

An exemplary peak detector/slicer for frequency data detection is shown in FIG. 24. The differential input signal is coupled to a peak detector 346 which detects the high peak. The differential input signal is also coupled to a second peak 347 detector which detects the low valley of the signal. The outputs of the peak detectors are coupled to a resistor divider network 348, 349 to obtain the average of the output signal. The average signal output from the resistor divider network is used as the calibrated zero frequency to obviate frequency offset problems due to the frequency translation process from IF to baseband.

A differential amplifier 345 is used to digitize the frequency information by comparing the differential input signal with the calibrated zero frequency. The output of the amplifier is a logic "1" if the baseband frequency is greater than the calibrated zero frequency and a logic "0" if the baseband frequency is less than the calibrated zero frequency. The output is amplified through several inverters 350 which in turn generate digital rail to rail output.

2.0. Transmitter 2.1 Differential Power Amplifier

Figure 25:
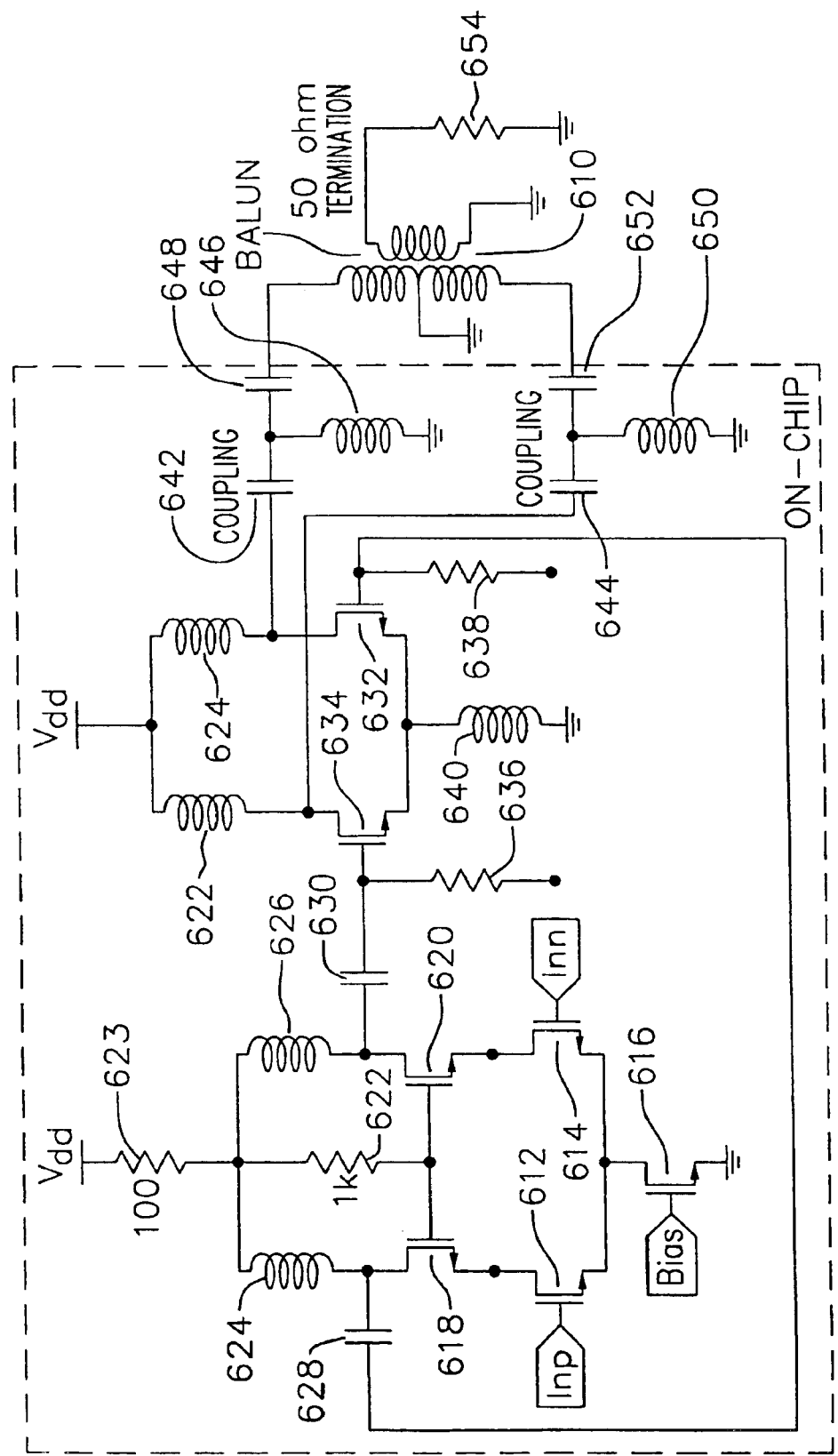
FIG. 25 is a block diagram of a differential power amplifier in accordance with an exemplary embodiment of the present invention.

In an exemplary embodiment of the invention, the PA is a differential PA as shown in FIG. 25. The symmetry of the differential PA in conjunction with other features supports implementation in a variety of technologies including CMOS. The described embodiment of the differential PA can be a fully integrated class A PA. A balun 610 is used to connect the PA to an antenna or a duplexer. The balun converts the differential signal to a single-ended output The described embodiments of the differential PA is a two stage device. The two stages minimize backward leakage of the output signal to the input stage. As those skilled in the art will appreciate, any number of stages can be implemented depending on the particular application and operating environment. Equal distribution of gain between the two stages helps prevents oscillation by avoiding excess accumulation of gain in one stage. A cascode architecture may be incorporated into the PA to provide good stability and insulation.

The input stage or pre-amplifier of the power amplifier includes an input differential pair comprising amplifying transistors 612, 614. Transistor 616 is a current source that biases the input differential pair. The presence of a current source provides many positive aspects including common mode rejection. The current is controlled by the voltage applied to the gate of transistor 616. The gate voltage should be chosen to prevent the transistor 616 from operating in the triode region. Triode operation of transistor 616 has a number of drawbacks. Primarily, since transistor 616 is supposed to act as a current source, its operation in the triode region can cause distortion in the current flowing into the transistor 612 and the transistor 614, and consequently gives rise to nonlinearity in the signal. Secondly, the triode behavior of transistor 616 will depend on temperature and process variations. Therefore, the circuit operation will vary over different process and temperature corners.

Cascode transistors 618, 620 provide stability by isolating the output from the input. As a result, no change in the input impedance occurs over frequency. The gates of the cascode transistors 618, 620 devices are biased through a bond wire. A resistor 622 in series with the gates of the cascode transistors prevents the inductance associated with the bonding from resonating with the input capacitive of the transistors, thereby improving stability. The resistor 622 in combination with the gates of transistors 618, 620 also improves common mode rejection and makes the transistor input act like a virtual ground at RF. Resistor 623 isolates the power supply from the PA and provides common mode rejection by increasing the symmetry of the differential PA. Inductors 624, 626 tune out the capacitance at the drains of the transistors 618, 620. At the tuning frequency, the impedance seen at the drains of the transistors 618, 620 is high, which provides the high gain at the tuning frequency.

The differential output of the input stage is provided at the drains of the cascode transistors 618, 620 to AC coupling capacitors 628, 630. Capacitor 628 couples the drain of transistor 618 with the gate of transistor 632. Capacitor 630 couples the drain of transistor 620 with the gate of transistor 634. The transistors 632, 634 provide amplification for the second stage of the PA. Resistors 636, 638 are biasing resistors for biasing the transistors 632, 634.

In the output stage of the PA, the current level is higher and the size of the current source should be increased to maintain the same bias situation. However, large tail devices can lower the common mode rejection. Accordingly, instead of a current source, an inductor 640 can be used to improve the headroom. The inductor 640 is a good substitute for a current source. The inductor 640 is almost a short circuit at low frequencies and provides up to 1Kohm of impedance at RF. By way of example, a 15 nH inductor with proper shielding (to increase the Q) and a self-resonance frequency close to 4.5 GHz can be used for optimum high frequency impedance and sufficient self-resonance.

Inductors 622, 624 tune out the capacitance at the drains of transistors 632, 634. Capacitors 642, 644 are AC coupling capacitors. Inductors 646 and capacitor 648 match the output impedance of the PA to the antenna, by way of example, 50 Ω. Similarly, inductors 650 and capacitor 652 match the output impedance of the PA to the antenna Balun 610 is a differential to single-ended voltage converter. Resistance 654 is representative of the load resistance.

Capacitances associated with bias resistors may also be addressed. Consider a typical distributed model for a polysilicon ("poly" for short) resistor. Around 4fF to substrate can be associated with every kilo-ohm of resistance in a poly resistor. This means that, for example in a 20Kohm resistor, around 80fF of distributed capacitance to the substrate exists. This can contribute to power loss because part of the power will be drained into the substrate. One way of biasing the input stage and the output stage is through a resistive voltage divider as shown in FIG. 26(a). The biasing of the input stage is shown for the transistor 616 in FIG. 25, however, those skilled in the art will readily appreciate that the same biasing circuit can be used for the transistor 614 (FIG. 25). One drawback from this approach, however, is that the gate of the transistor will see the capacitance from the two resistors 658, 660 of the voltage divider. Capacitor 662 is a coupling capacitor, which couples the previous stage to the voltage divider. Switch 664 is for powering down the stage of the power amplifier that is connected to the voltage divider. The switch 664 is on in normal operation and is off in power down mode.

FIG. 26(b) is similar to FIG. 26(a), except that FIG. 26(b) includes resistor 666. DC-wise the FIG. 26(a) and FIG. 26(b) circuits are the same. However, in AC, not only is the resistance seen from the gates of transistors 634, 632 towards the resistive bias network bigger, but the capacitance is smaller because the capacitance is caused by resistor 666 and not resistors 660, 658. Since there is less capacitance, there is less loss of the signal. From FIG. 25, transistors 618, 620 in the input stage and transistors 632, 634 in the output stage can be biased by the resistive voltage divider shown in FIG. 26(b).

FIG. 27 shows an exemplary bias circuit for the current source transistor 616 of FIG. 25. To fix the bias current of the circuit over temperature and process variation, a diode-connected switch transistor 672 may be used with a well-regulated current 670. The voltage generated across the diode-connected transistor 672 is applied to the gate of the current source transistor 616. Because of the mirroring effect of this connection and since all transistors move in the same direction over temperature and process corners, the mirrored current will be almost constant. The reference current is obtained by calibration of a resistor by the controller. The calibrated resistor can be isolated from the rest of the PA to prevent high frequency coupling through the resistor to other transceiver circuits. As those skilled in the art will appreciate, the exemplary bias circuit is not limited to the current source transistor of the PA and may be applied to other transistors requiring accurate biasing currents.

FIG. 28 shows an exemplary power control circuit. The power control circuit can provide current scaling. The power control circuit changes power digitally by controlling the bias of the current source transistor 616 of the first differential pair 612, 614 in the PA (FIG. 25). The power control circuit can be used in any application requiring different power levels. The power control is done by applying different voltage levels to the gate of the current source in the first stage (input stage or preamplifier) of the PA. A combination of current adjustment in both stages (input stage and output stage) of the PA can also be done. Different voltage levels are generated corresponding to different power levels.

In one embodiment of the invention, the power control circuit has four stages as shown in FIG. 28. Alternatively, the power control circuit can have any number of stages corresponding to the number of power levels needed in an application.

The power control circuit includes transistor pairs in parallel. Transistors 674, 676, 678, 680 are switch transistors and are coupled to diode-connected transistors 682, 684, 686, 688, respectively. The switch transistors 674, 676, 678, 680 are coupled to a current source 670. Each diode-connected transistor 682, 684, 686, 688 can be switched into the parallel combination of by turning its respective switching transistor on. Conversely, any diode-connected transistor can be removed from the parallel combination by turning its respective switch transistor off. The current from the current source 670 is injected into a parallel combination of switch transistors 674, 676, 678, 680. The power level can be incremented or decremented by switching one or more switch transistors into the parallel combination. By way of example, a decrease in the power level can be realized by switching a switch transistor into the parallel combination. This is equivalent to less voltage drop across the parallel combination, which in turn corresponds to a lower power level. A variety of stages are comprehended in alternative embodiments of the invention depending on the number of power levels needed for a given application. A thermometer code from the controller can be applied to the power control circuit according to tag which the power level is adjusted.

As described above, the output of the PA can be independently matched to a 50 ohm load. The matching circuit (inductors 646, 650 and capacitors 648, 652) is connected to the balun. Any non-ideality of the balun, bond wire impedance, pin/PCB capacitance, and other parasitics can be absorbed by the matching circuits. High-Q inductors can be used where possible. The loss in efficiency may also be tolerable with low power applications.

2.2 Single-Ended Differential Power Amplifier

Figure 29:
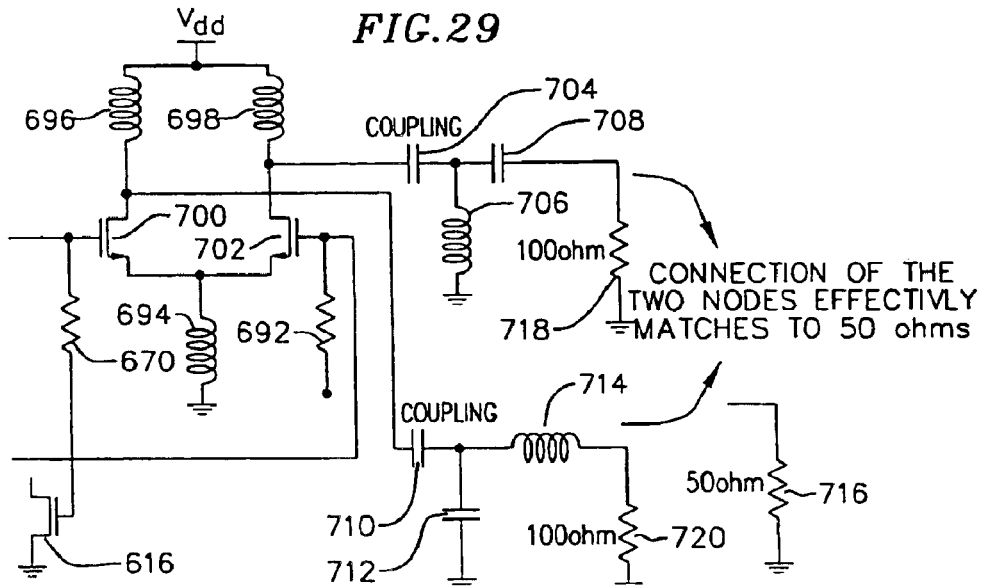
FIG. 29 is an electrical diagram of a single-ended differential power amplifier in accordance with an exemplary embodiment of the present invention.

In another embodiment of the present invention, the balun can be eliminated by a single-ended to differential PA. FIG. 29 shows the output stage of a single-ended to differential PA. The output stage includes resistors 690, 692, inductors 694, 696, 698, and transistors 700, 702. Coupling capacitor 704 couples the output stage to an LC circuit, the LC circuit including inductor 706 and capacitor 708. Coupling capacitor 710 couples the second stage to a CL circuit, the CL circuit comprising capacitor 712 and inductor 714. The transistors 700, 702 provide amplification of the differential signal applied to the output stage of the PA. The output of the amplifying transistors 700, 702 produces two signals 180 degrees out of phase. The LC circuit is used to match the first output to a 100 ohm load 718 and to shift the phase of the signal by 90 degrees. The CL circuit is deployed to match the second output to a 100 ohm load 720, and to shift the phase of the signal in the opposite direction by 90 degrees. Since the two outputs were out of phase by 180 degrees at the beginning and each underwent an additional 90 degrees of shift (in opposite directions) the two signals appearing across the two 100 ohm loads will be in phase. In an ideal situation, they will also be of similar amplitudes. This means that the two nodes can be connected together to realize a single-ended signal matched for a 50 ohm load 716.

Unlike the differential PA, the differential to single-ended configuration does not enjoy the symmetry of a fully differential path. Accordingly, with respect to embodiments of the present invention integrated into a single IC, the effect of bond wires should be considered. Because of stability and matching issues, a separate ground (bond wire) for the matching circuit should be used. The bond wires should be small and the matching should be tweaked to cancel by their effect.

The bias current to the amplifying transistors 700, 702 for embodiments of the present invention integrated into a single IC can be set in a number of ways, including by way of example, the bias circuit shown in FIG. 27. The voltage generated across the diode-connected transistor 672 is applied to the gate of the amplifying transistor 700. A similar bias circuit can be used for biasing the amplifying transistor 702.

Alternatively, the bias circuit of the amplifying transistors 700, 702 for single IC embodiments can be set with a power control circuit as shown in FIG. 28. The current source is connected directly the amplifying transistor 700. By incrementally switching the diode-connected transistors 682, 684, 686, 688 into the parallel combination, the voltage applied to the gate of the amplifying transistor 700 is incrementally pulled down toward ground. Conversely, by incrementally switching the diode-connected transistors 682, 684, 686, 688 out of the parallel combination, the voltage applied to the gate of the amplifying transistor 700 is incrementally pulled up toward the source voltage (not shown). A similar power control circuit can be used with the amplifying transistor 702.

2.3. Digitally Programmable CMOS PA with On-Chip Matching

In another embodiment of the present invention, a PA is integrated into a single IC with digitally programmable circuitry and on-chip matching to an external antenna, antenna switch, or similar device. FIG. 30 shows an exemplary PA with digital power control. This circuit comprises two stages. The input stage provides initial amplification and acts as a buffer to isolate the output stage from the VCO. The output stage is comprised of a switchable differential pair to steer the current towards the load. The output stage also provides the necessary drive for the antenna. The power level of the output stage can be set by individually turning on and off current sources connected to each differential pair.

Transistors 722, 724 provide initial amplification. Transistor 726 is the current source that biases the transistors 722, 724. Inductors 728, 730 tune out the capacitance at the drains of the transistors 722, 724. At the tuning frequency, the impedance seen at the drains is high, which provides high gain at the tuning frequency.

Capacitors 732, 736 are AC coupling capacitors. Capacitor 732 couples the drain of he transistor 724 with the gate of transistor 734. Capacitor 736 couples the drain of transistor 722 with the gate of transistor 738. Resistors 740, 742 are biasing resistors for biasing the gates of the transistors 734, 738. Transistors 734, 738 are amplifying transistors in the output stage of the PA. Transistor pairs 744, 746, transistor pairs 748, 750, and transistor pairs 752, 754 each provide additional gain for the signal. Each pair can be switched in or out depending on whether a high or low gain is needed. For maximum gain each transistor pair in the output stage of the PA will be switched on. The gain can be incrementally decreased by switching out individual Hi transistor pairs. The PA may have more or less transistor pairs depending on the maximum gain and resolution of incremental changes in the gain that is desired.

Transistor 756 has two purposes. First, it is a current source that biases transistors 734, 738. Second, it provides a means for switching transistors 734, 738 in and out of the circuit to alter the gain of the output stage amplifier. Each transistors 758, 760, 762 serves the same purpose for its respective transistor pair. A digital control, word from the controller can be applied to the gates of the transistors 756, 758, 760, 762 to digitally set the power level. This approach provides the flexibility to apply ramp up and ramp down periods to the PA, in addition to the possibility of digitally controlling the power level. The drains of the transistors 756, 758, 760, 762 are connected to a circuit that serves a twofold purpose: 1) it converts the differential output to single ended output, and 2) it matches the stage to external 50 ohm antenna to provide maximum transferable gain.

Inductors 764, 766 tune out the capacitance at the drains of transistors 752, 754. Capacitor 768 couples the PA to the load 770. Inductor 772 is a matching and phase-shift element, which advances the phase of the signal by 90°. Capacitor 794 is a matching and phase-shift element, which retards the phase of the signal by 90°. Capacitor 796 is the pad capacitance. The bonding wire 798 bonds the PA to the load resistance 770 (e.g., the antenna).

2.4 Phase Lock Loop

Although a direct conversion transmitter has been primarily described thus far, many of the concepts disclosed herein are equally applicable to transmitters utilizing an IF architecture. In one embodiment of the present invention, an offset phase lock loop (PLL) is employed with such an architecture.

Figure 30A:
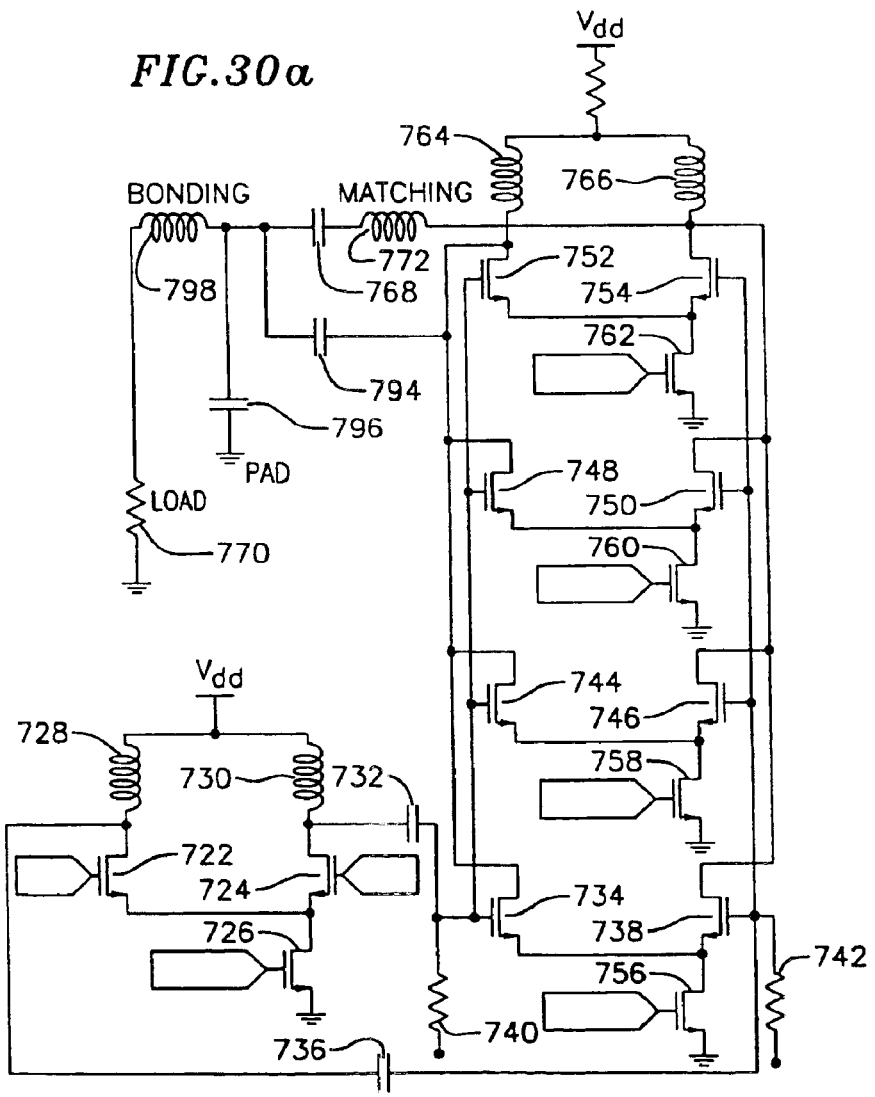
FIG. 30(a) is an electrical diagram of digitally programmable CMOS power amplifier in accordance with an exemplary embodiment of the present invention.
Figure 30B:
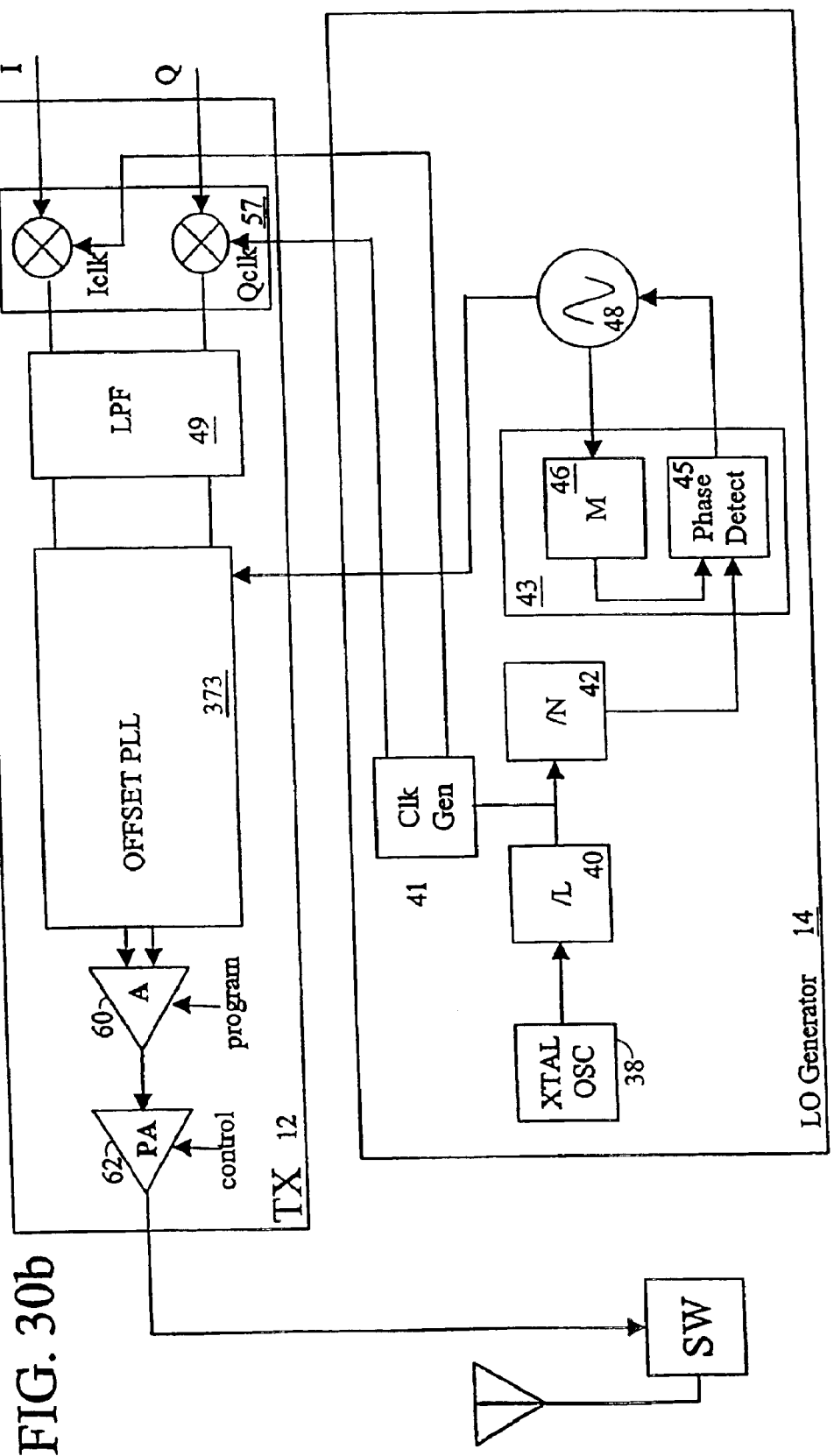
FIG. 30(b) is a block diagram of an alternative embodiment of the transmitter and local oscillator generator of FIG. 2.

FIG. 30B is a block diagram of a transmitter and local oscillator generator having an IF architecture. The transmitter comprises base band input I and Q signals coupled to a complex mixer 57 having IF outputs coupled to a low pass filter 49. Outputs of the low pass filter are coupled to an offset PLL 373. RF outputs of the offset PLL are coupled to a programmable gain amplifier 60. The output of the programmable gain amplifier 60 is coupled to a power amplifier 62. The output of the power amplifier 62 is coupled to an antenna switch and in turn to an antenna.

Complex mixer 57 requires Iclk and Qclk local oscillator signals. An alternative local oscillator generator 14 provides these signals from a polyphase circuit 59. The polyphase receives its input from a clock generator circuit 41. VCO 48 is coupled to the CMOS offset PLL.

Offset PLL's advantageously tend to provide out of band filtering through the presence of the PLL loop. Thus, out of band noise in the transmitter tends to be reduced with an offset PLL. Typical offset PLL's require off-chip VCO's. When integrated on a CMOS substrate the previously described on-chip VCO may be utilized to provide an offset PLL completely integrated onto a single IC. The offset PLL is typically configured with a VCO running at a high frequency. The signal is typically a high level signal and tends to pull other on chip VCO's running in close frequencies. To eliminate pulling, down conversion mixers with lower clock frequencies than the VCO are utilized.

Figure 30C:
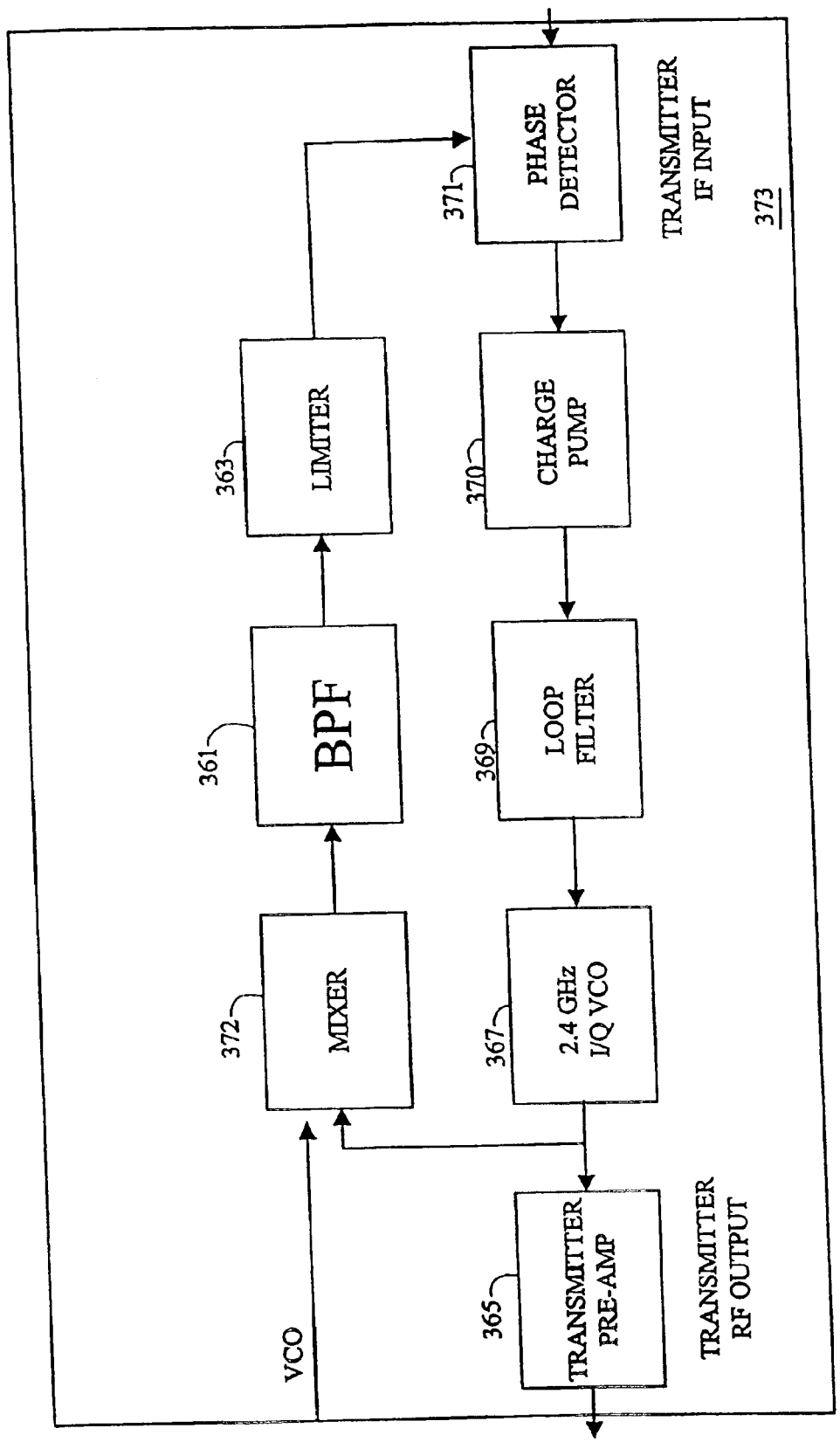
FIG. 30(c) is a block diagram of a CMOS offset PLL.

FIG. 30C is a block diagram of an offset PLL. A transmitter IF input is coupled to a first input of a phase detector 371 which is in turn coupled to a charge pump 370. The charge pump 370 is coupled to a loop filter 369 which is in turn coupled to a 2.4 gigahertz I/Q VCO, 376. The output of the 2.4 gigahertz I/Q VCO is simultaneously coupled to a transmitter preamp 365 and a mixer 373.

The transmitter pre-amp output forms a transmitter RF output. Returning to the mixer 372, the output of the mixer is coupled to the input of a bandpass filter 361. The output of the bandpass filter is coupled to a second phase detector input. The circuit is integrated onto a CMOS semiconductor substrate. In an alternative offset PLL embodiment, the mixer 372 is replaced by a subsampling mixer, and is suitable for use on, or off a CMOS substrate.

Figure 30D:
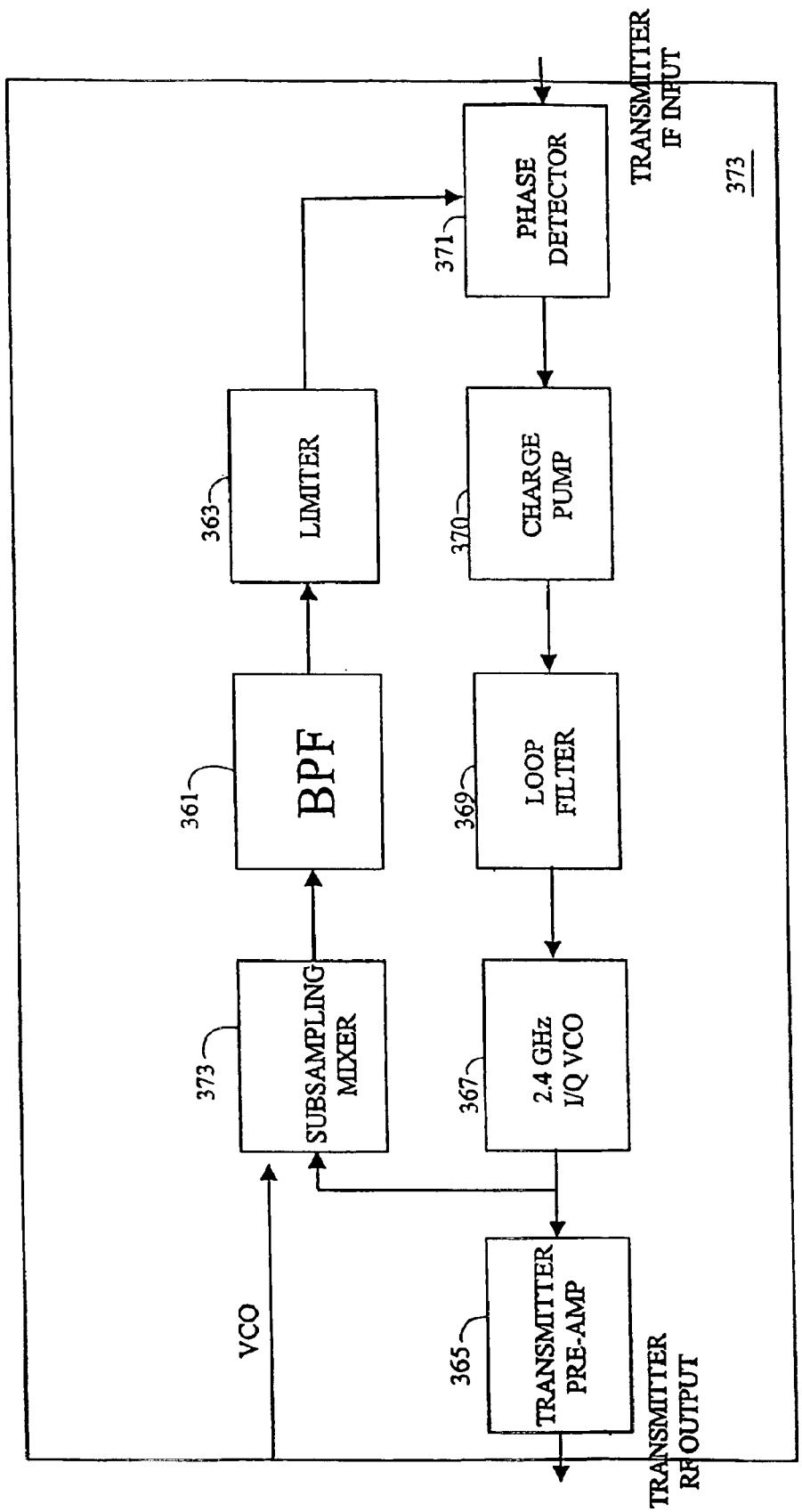
FIG. 30(d) is a block diagram of an offset PLL architecture utilizing a subsampling mixer.

FIG. 30D is a block diagram of an offset PLL architecture utilizing a subsampling mixer 373. All other components are interconnected as previously described in FIG. 30C. An offset PLL transmitter utilizes subsampling in the PLL loop to translate the RF frequency of the VCO to an IF frequency. The subsampling mixer is used in order to allow the loop to work properly at very high frequency while decreasing power consumption. The subsampling PLL's VCO runs at a frequency of $F_{out}/N$ (N=3, 5, . . . ). Proper operation is maintained if the VCO 367 covers a wide range of frequencies of approximately 1 gigahertz bandwidth.

2.4.1 Subsampling Mixer

Figure 30E:
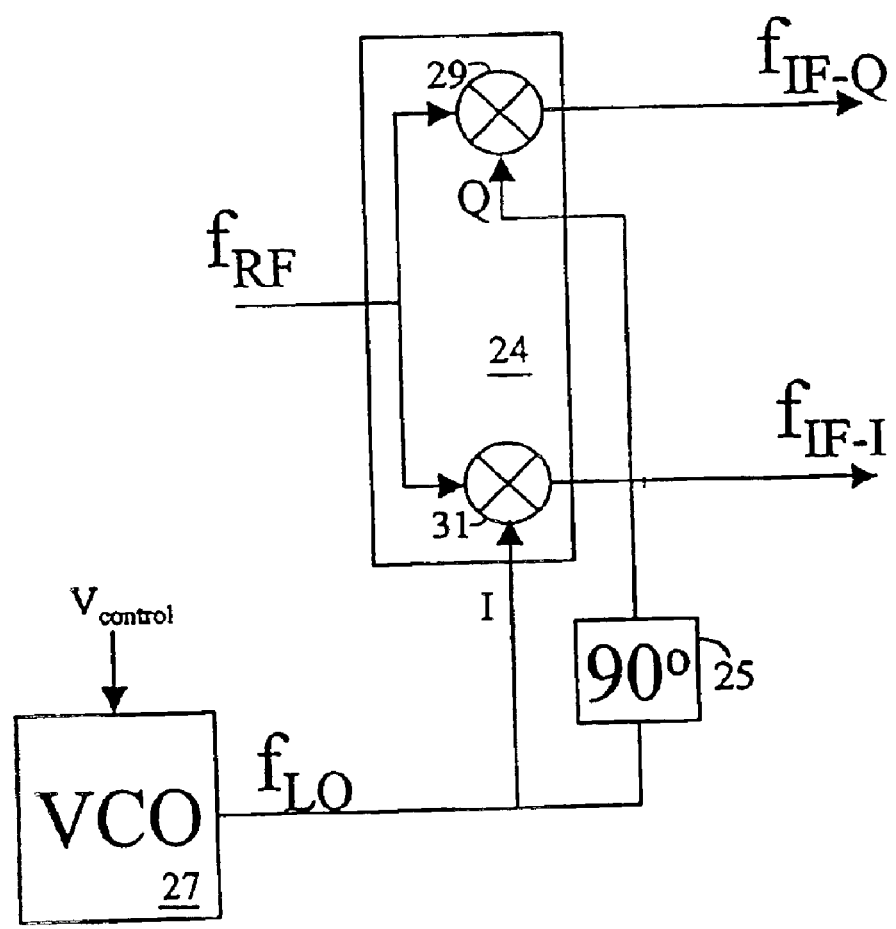
FIG. 30(e) is a block diagram illustrating frequency conversion and an I/Q mixer circuit.

FIG. 30e is a block diagram illustrating frequency conversion and an I/Q mixer circuit 24. Typically, such a mixer circuit is utilized to mix down a high frequency signal $f_{RF}$ to a lower intermediate frequency $f_{IF-Q}$, $f_{IF-I}$. To accomplish the complex mixing, I/Q mixer 24 includes conventionally constructed mixer circuits 29 and 31. The RF signal $f_{RF}$ is split and simultaneously fed to the RF inputs of mixer circuits 29 and 31.

Local oscillator signals I and Q are at the same frequency and in quadrature relation to each other. Quadrature signals are typically generated as shown by taking a local oscillator signal $f_{LO}$ and introducing a ninety degree phase shift as shown in block 25. Thus, as shown, signal $f_{LO}$ is coupled to the I port of mixer 31, and signal $f_{LO}$ with a ninety degree phase shift introduced by phase shifter 25 is coupled to the Q port of mixer 29. The signal $f_{LO}$ is typically generated by a voltage controlled oscillator (VCO) 27 that produces a variable frequency output $f_{LO}$ in proportion to a variable control voltage $V_{control}$. I/Q mixer 24 thus produces a pair of intermediate frequency outputs at a lower frequency than the input RF signal $f_{RF}$ that are in quadrature relation to each other $f_{IF-Q}$, $f_{IF-I}$.

Figure 30F:
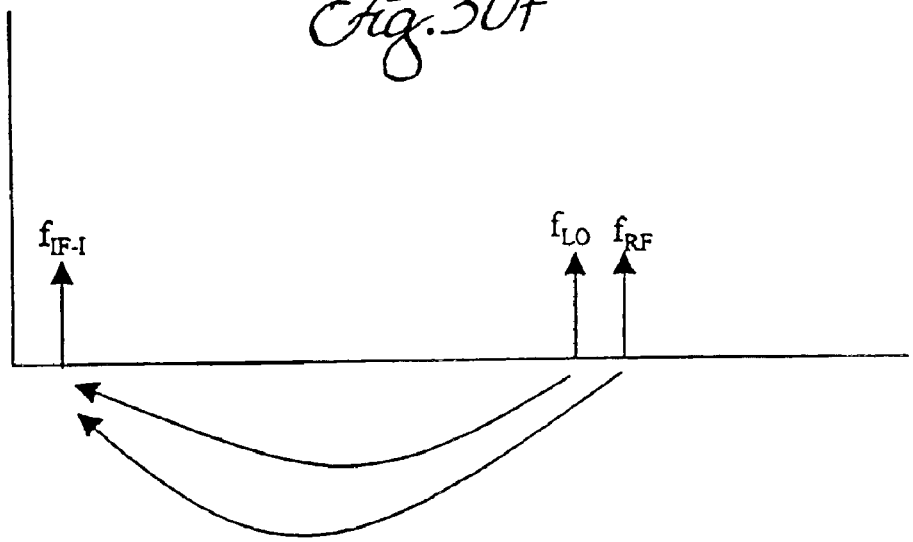
FIG. 30(f) illustrates a typical mixing process.

FIG. 30f illustrates a typical mixing process. Typically to mix a radio frequency $f_{RF}$ to an intermediate frequency $f_{IF-I}$ a local oscillator frequency $f_{LO}$ is chosen such that the mixing process will produce an intermediate frequency at a difference frequency of the RF frequency $f_{RF}$ minus the local oscillator frequency $f_{LO}$.

It is often desirable to utilize a low IF frequency. To create a low IF frequency, the LO and RF signals are nearly equal in frequency. Running a VCO that produces the local oscillator frequency close to the radio frequency causes a problem known as VCO pulling. In VCO pulling, the VCO frequency changes with variations in output power.

Figure 30G:
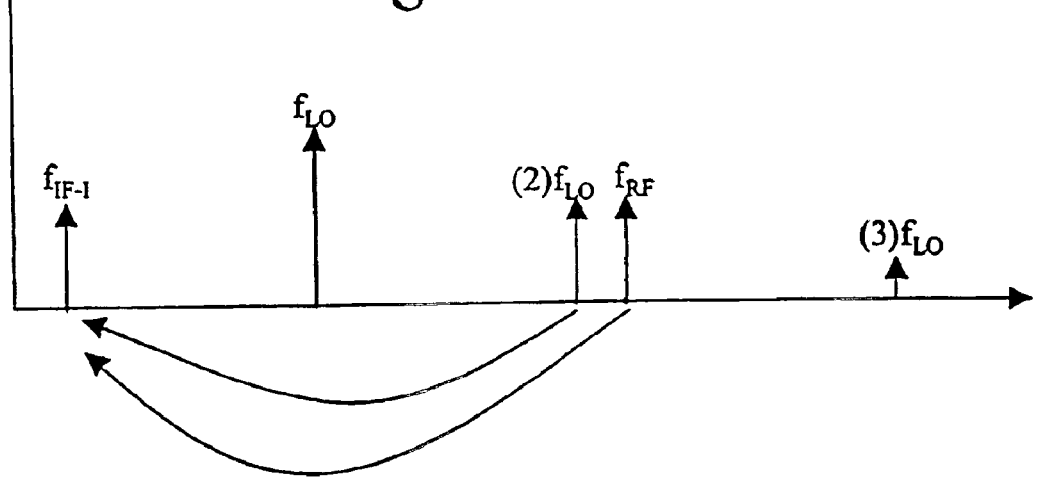
FIG. 30(g) illustrates a frequency conversion scheme that tends to minimize the adverse effects due to frequency pulling and additionally tends to provide the benefit of reduced power consumption.

FIG. 30g illustrates a frequency conversion scheme that tends to minimize the adverse effects due to frequency pulling and additionally tends to provide the benefit of reduced power consumption. The technique is referred to as subsampling and utilizes harmonics of the local oscillator to translate the RF frequency to an intermediate frequency. Utilizing subsampling techniques in a subsampling mixer tends to lower circuit power consumption by running a VCO at a lower frequency. In the subsampling technique, a VCO outputs a local oscillator signal at a fundamental frequency $f_{LO}$ that typically includes harmonics at integral multiples of the fundamental frequency $f_{LO}$. These frequencies are denoted $(2)f_{LO}$, $(3)f_{LO}$, and so on. The VCO is adjusted such that one of the harmonics falls close to the radio frequency, $f_{RF}$, such that the desired intermediate frequency is produced. The second harmonic is shown as being utilized for mixing with the RF signals. However, those skilled in the art will appreciate that other higher order harmonics may equivalently be utilized to mix the radio frequency signal down to a desired intermediate frequency.

Figure 30H:
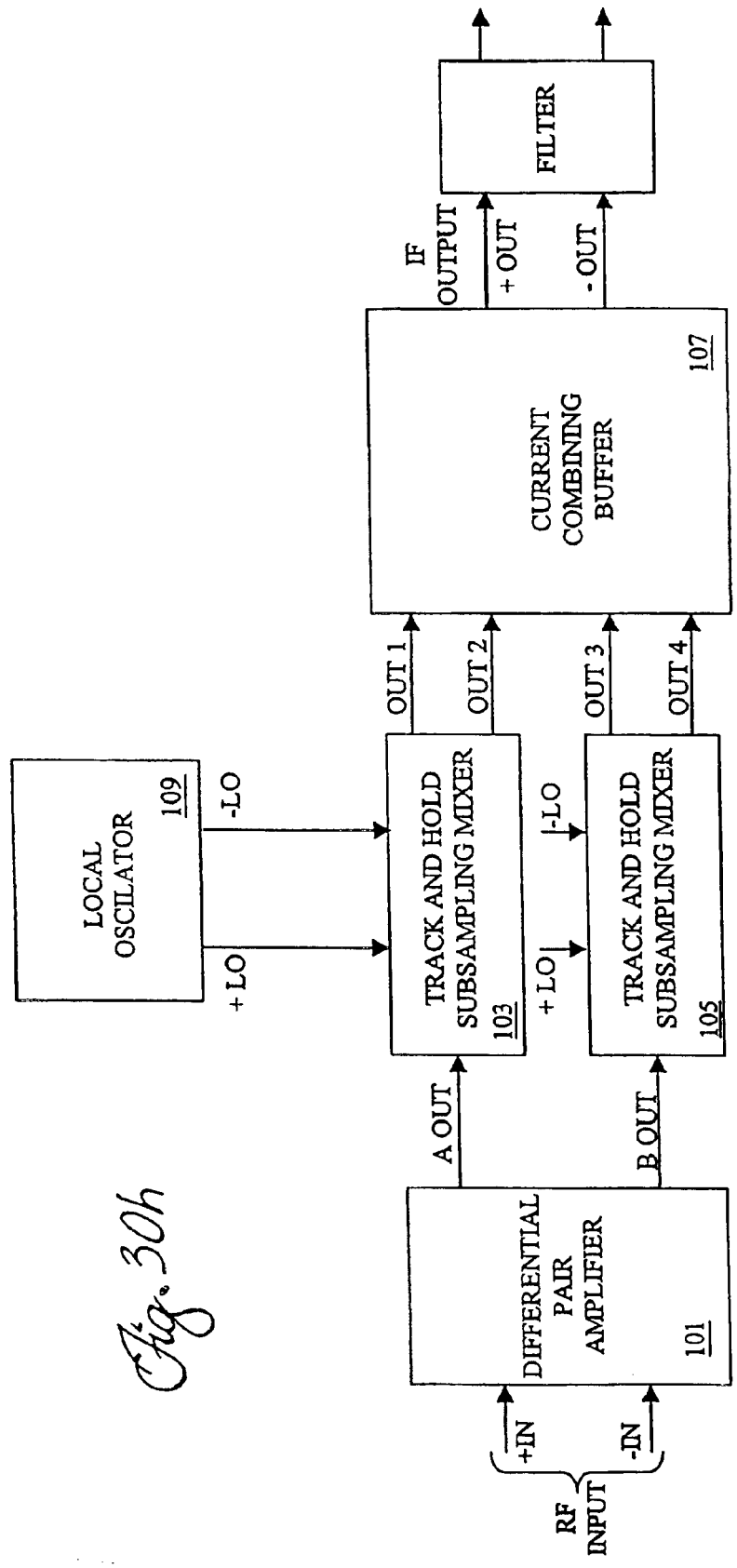
FIG. 30(h) is a block diagram of a first embodiment of a subsampling mixer for high frequencies.

Two embodiments of subsampling mixers are described in the following paragraphs. The first embodiment utilizing a track and hold is shown in FIG. 30h. In the first embodiment a high frequency buffer amplifier 101 drives the subsampling switches contained in the track and hold subsampling mixers 103, 105, and finally the outputs of the track and hold subsampling mixers are combined and amplified in an IF, or current combining, buffer 107. The current combining buffer is designed to reject local oscillator feed-through and alias images around the local oscillator frequency.

Figure 30I:
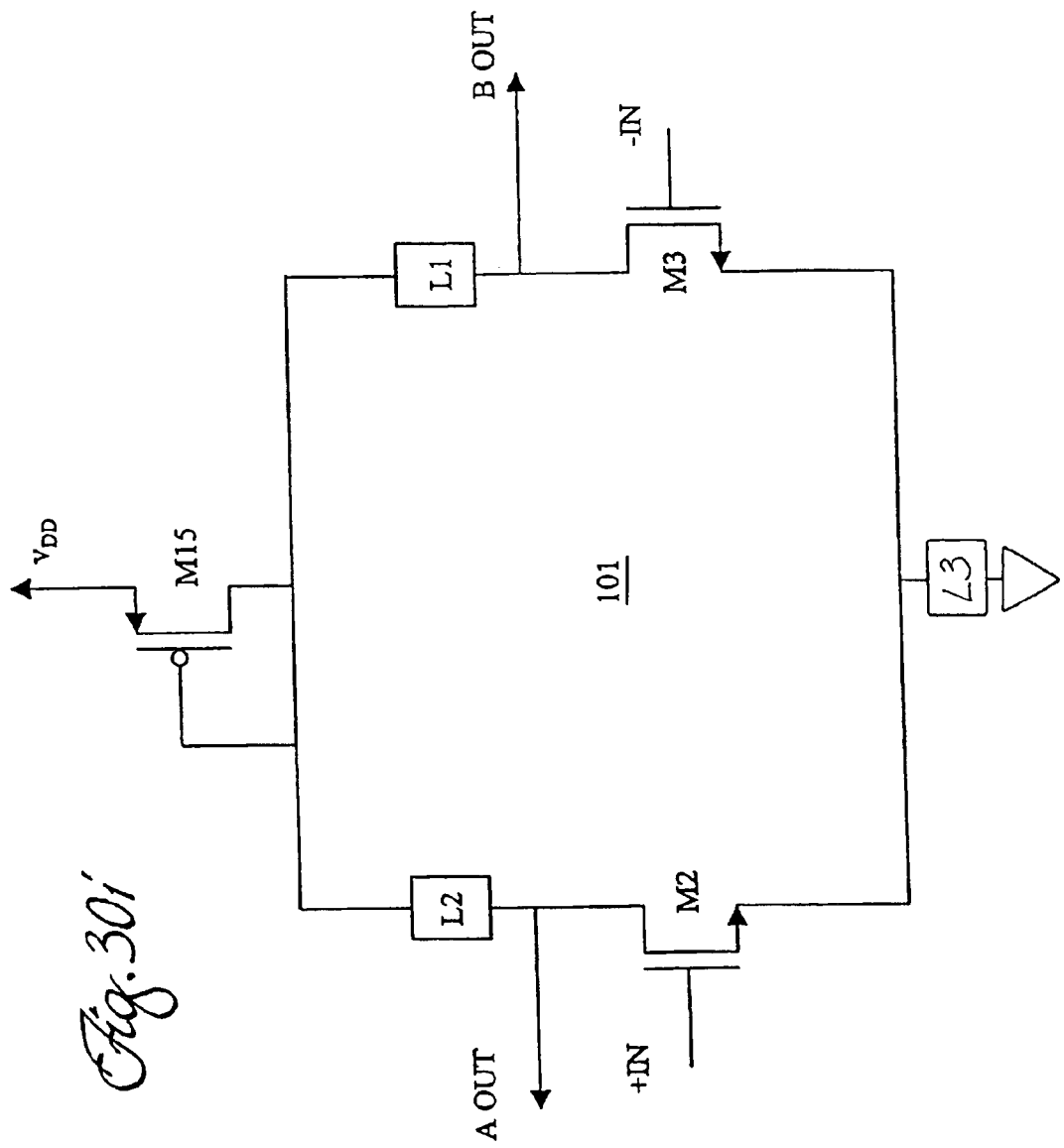
FIG. 30(i) is a schematic diagram of the differential pair amplifier.
Figure 30K:
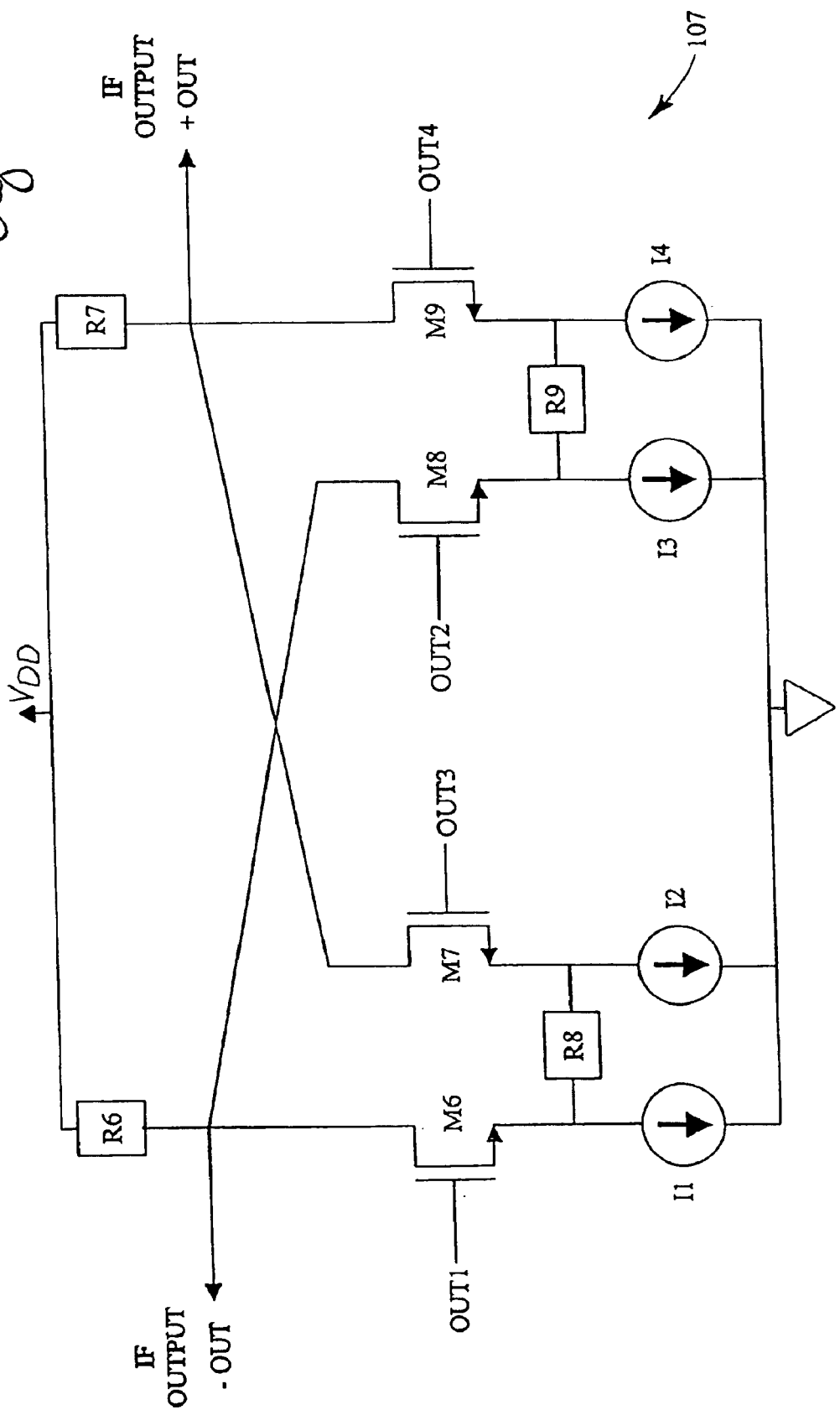
FIG. 30(k) is a schematic of a current combining circuit.
Figure 301:
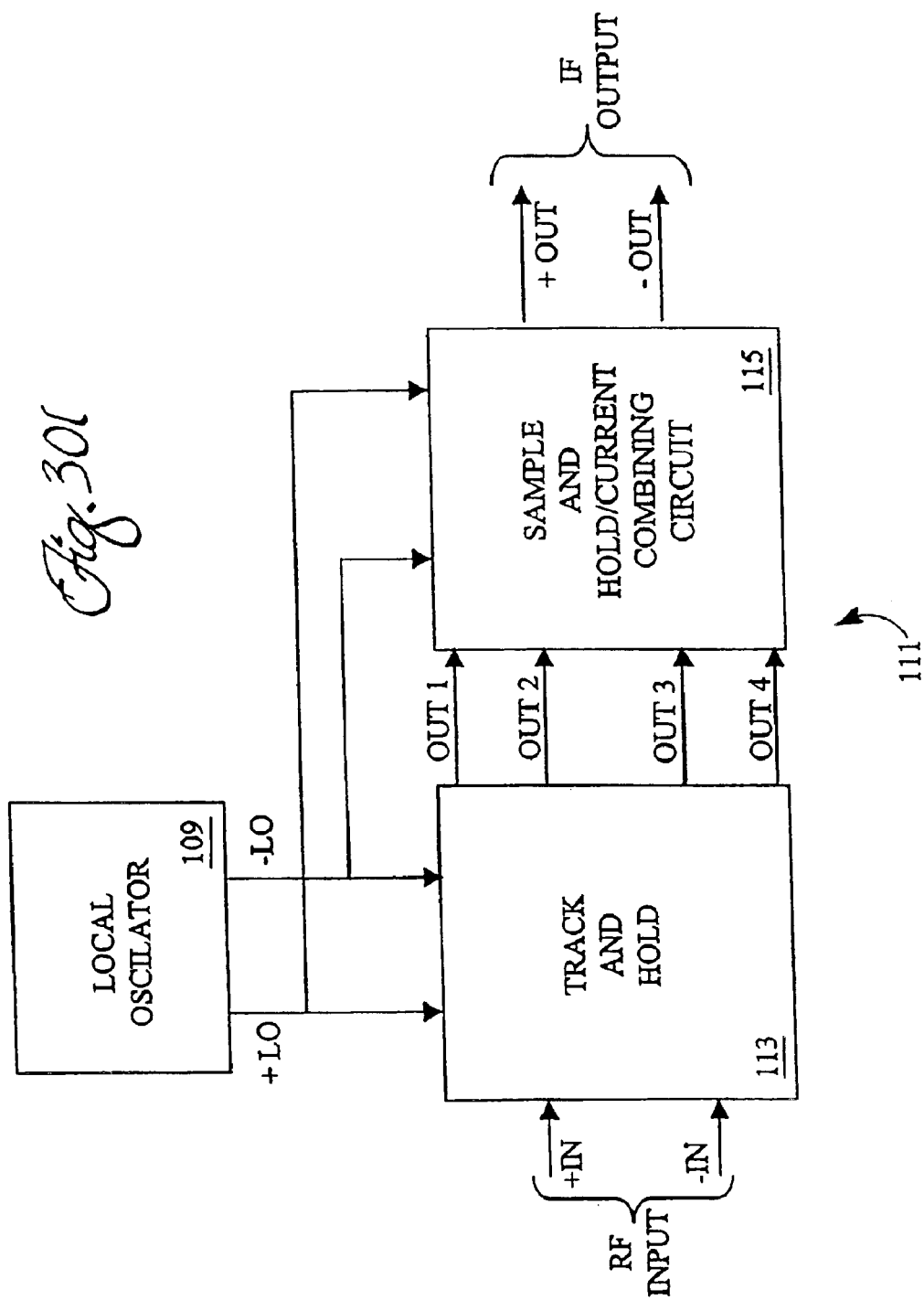

The second embodiment is a subsampling architecture utilizing a sample and hold as shown in FIG. 30k. In the embodiment of FIG. 30k two amplifiers 113, 115 are periodically switched on and off. The differential outputs of the local oscillator 109 control the switching. A complete sampling function is provided through two track and hold stages having opposite clocks in block 113. Subsampling takes place in RF amplifiers and a subsequent IF buffer 115. In the second embodiment LO feed-through tends to be reduced as well as aliased images around the local oscillator frequency. The second embodiment also provides low pass filtering through application of a sampling function.

FIG. 30h is a block diagram of a first embodiment of a subsampling mixer for high frequencies. A differential RF input +IN, −IN is applied to a differential pair amplifier 101. The differential pair amplifier produces two outputs A OUT, B OUT. Differential pair amplifier output A OUT is applied to a track and hold subsampling mixer 103. Also applied to the track and hold subsampling mixer 103 is a differential local oscillator signal +LO, −LO. The track and hold subsampling mixer 103 produces two outputs OUT 1 and OUT 2.

Differential pair amplifier 101 output B OUT is applied to a second track and hold subsampling mixer 105. Also applied to the second track and hold subsampling mixer 105 is the differential local oscillator 109 output +LO and −LO. The second track and hold subsampling mixer has two outputs OUT 3 and OUT 4.

The four outputs OUT 1, OUT 2, OUT 3, and OUT 4 are applied to a current combining buffer 107. Current combining buffer 107 produces a differential IF output +OUT −OUT.

FIG. 30i is a schematic diagram of the differential pair amplifier 101. The differential pair amplifier converts a differential voltage input +IN, −IN to a current output signal A OUT, B OUT. Differential pair amplifier 101 provides signal gain and tends to prevent loading in subsequent stages.

A supply voltage $V_{DD}$ is coupled to the drain of PMOS transistor M15. The gate of PMOS transistor M15 is coupled to its source. The source of M15 is also coupled to a first terminal of inductor L2 and a first terminal of inductor L1. The second terminal of inductor L2 defines the output connection A OUT.

The second terminal of inductor L2 is also coupled to the drain of transistor M2. The gate of transistor M2 defines input terminal +IN. The source of M2 is coupled to a first terminal of an inductor L3. The second terminal of inductor L3 is coupled to a ground reference.

The second terminal of inductor L1 defines the output terminal B OUT. The second terminal of inductor L1 is also coupled to the drain of FET M3. The gate of FET M3 defines the input connection −IN. The source of M3 is coupled to the first terminal of inductor L3.

Transistor M15 is configured as a conventional level shifting diode. Accordingly, other means known to those skilled in the art of shifting a voltage level may be provided in place of transistor M15.

Equivalently, other types of differential pair amplifiers that provide a gain and buffering effect may be substituted for the differential pair amplifier 101 as previously described. For example, bipolar transistors or other types of field effect transistors may be substituted for transistors M2 and M3 depending upon the type of integrated circuit substrate being utilized when integrating buffer amplifier 101 on a single integrated circuit Inductors L1 and L2 tend to provide a more truly differential distribution of currents and voltages in the buffer amplifier 101. In an embodiment the self-resonant frequency of inductors L1 and L2 is chosen to be the same as the frequency of operation of the circuit.

FIG. 30j is a schematic diagram of the first and second track and hold subsampling mixer circuits 103, 105. The frequency conversion is achieved in the track and hold subsampling mixers. The track and hold subsampling mixers 103 and 105 are identically constructed. The operation of the track and hold subsampling mixer will be explained in terms of track and hold subsampling mixer 103. The connections for track and hold subsampling mixer 105 are indicated in the figure the connections for track and hold subsampling mixer 103 are indicated in parenthesis.

Local oscillator signals +LO and −LO are utilized to activate transistor switches M4 and M5. Capacitor C4 and C5 are charged to a voltage that is representative of a wave-form being sampled, A OUT, when either switch M4 or M5 allows a sample of the wave-form to pass through it. Operation of switches M4 and M5 are complimentary. Thus, when switch M4 if on the "on" state, switch M5 is on the "off" state and vice versa.

Input signal A OUT (B OUT) is simultaneously coupled to the sources of transistors M4 and MS. The gate of transistor M4 is coupled to differential local oscillator signal +LO. The an gate of transistor M5 is coupled to differential local oscillator signal −LO. The drain of M4 is coupled to a first terminal of capacitor C4, and forms output OUT 1 (OUT 3). The second terminal of capacitor C4 is coupled to ground. The drain of transistor M5 is coupled to a first terminal of capacitor C5 and forms output signal OUT 2 (OUT 4). The second terminal of capacitor C5 is coupled to ground.

When transistors M4 and M5 are in the "on" state, a series resonant circuit is formed between capacitor C4 coupled through the "on" state resistance of transistor M4 to inductor L2 of FIG. 30i. Capacitor C5 of FIG. 30j is coupled through the "on" resistance of FET M5 to inductor L1 of FIG. 30i. The selection of switching transistors M4 and M5 a short channel-length having as wide a channel width as possible tends to be desirable to maintain a low impedance. A resistance in series with L1 and C4, for example, tends to undesirably degrade the circuit Q. Improved performance tends to be achieved when inductor L1 and capacitor C4 are selected to have a resonant frequency the same as the frequency of operation of the circuit. The previous discussion also applies to switching transistor M5 and capacitor C5.

FIG. 30k is a schematic of the current combining buffer 107. In the current combining buffer four voltage signals OUT 1, OUT 2, OUT 3, and OUT 4 are converted to current signals and combined to form a differential IF output +OUT, −OUT. In producing the desired currents, signals OUT 1 and OUT 3 are paired together as are signals OUT 2 and OUT 4. Signals having differing phases are paired together (OUT 1, OUT 3) (OUT 2, OUT 4).

A voltage source $V_{DD}$ is coupled to a first terminal of resistor R6 and a first terminal of resistor R7. A second terminal of resistor R6 forms IF output −OUT. A second terminal of resistor R7 forms IF output +OUT. The second terminal of R6 is also coupled to the drain of field effect transistor M6. The gate of transistor M6 forms input OUT 1. The second terminal of resistor R6 is also coupled to the drain of field effect transistor M8. The gate of transistor M8 defines input, OUT 2. The second terminal of resistor R7 is coupled to the drain of field effect transistor M7. The gate of transistor M7 defines the input signal, OUT 3. The second terminal of resistor R7 is also coupled to the drain of field effect transistor M9. The gate of transistor M9 defines input, OUT 4. The source of M6 is coupled to the source of M7 through resistor R8. The source of M8 is coupled to the source of M9 through resistor R9.

In addition, the source of M6 is coupled to a first terminal of conventionally constructed current source I1. The second terminal of current source I1 is coupled to ground. The source of transistor M7 is coupled to a first terminal of a conventionally constructed current source I2. The second terminal of current source I2 is coupled to ground. The source of transistor M8 is coupled to a first terminal of conventionally constructed current source I3. The second terminal of I3 is coupled to ground. The source of transistor M9 is coupled to a first terminal of conventionally constructed current source I4. The second terminal of current source I4 is coupled to ground.

FIG. 30*l* is a block diagram of a second embodiment of a Subsampling Mixer for high frequencies. An RF input +IN, −IN is coupled to a track and hold circuit 113. The track and hold circuit includes three outputs OUT 1, OUT 2, OUT 3, and OUT 4. Track and hold outputs OUT 1 through OUT 4 are applied to a sample and hold and current combining circuit 115. The sample and hold and current combining circuit provides IF outputs +OUT and −OUT.

The conventionally constructed local oscillator providing differential outputs +LO and −LO is used to clock track and hold circuit 113 and the sample and hold and current combining circuit 115. Differential signals +LO and −LO are simultaneously applied to the track and hold circuit 113 and the sample hold and current combining circuit 115.

The linearity of the first embodiment tends to be improved over that of the second embodiment. However, the sample and hold 115 of the second embodiment when analyzed in the frequency domain pushes all of the distortion products to a low frequency where they may be filtered out. The second embodiment also tends to provide a stronger signal than the first. A strong signal makes the second embodiment desirable for use in a PLL circuit over the first embodiment.

Figure 30M:
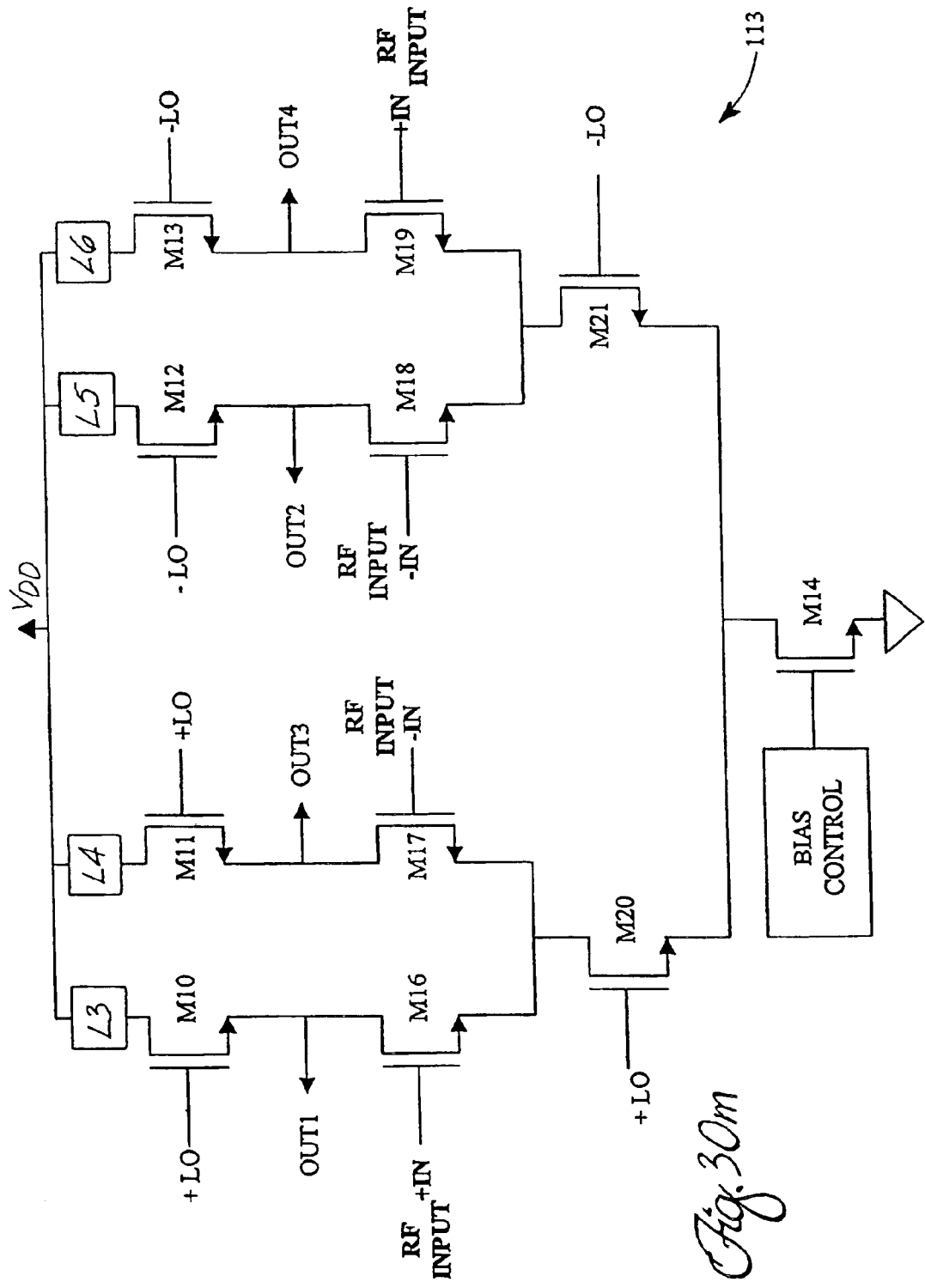
FIG. 30(m) is a schematic diagram of a track and hold circuit.

FIG. 30*m* is a schematic diagram of a track and hold circuit 113. In the track and hold circuit a buffer amplifier has been incorporated in the design. Field effect transistor differential pairs M16, M17 and M18, M19 are included in the buffer circuit. Field effect transistor pairs M10, M11 and M12, M13 are utilized in the sample hold circuit. One sample and hold pair of transistors is activated while the other pair is deactivated. Activation or deactivation of a sample and hold circuit is achieved through transistor switches M20 and M21. Field effect transistor switches M20 and M21 are gated by +LO and −LO respectively. Local oscillator signals +LO and −LO are running at a low frequency. Thus, each sample and hold circuit will sample for a relatively long period of time while it is activated.

Voltage source $V_{DD}$ is coupled to the first terminals of inductors L3, L4, L5, and L6. The drains of field effect transistors M10, M11, M12, and M13 are coupled to the second terminals of L3, L4, L5, and L6 respectively. The gates of transistors M10 and M11 are simultaneously driven by local oscillator signal +LO. The gates of transistors M12 and M13 are simultaneously driven by local oscillator signal −LO. The sources of transistors M10, M11, M12, and M13 define circuit outputs OUT 1, OUT 3, OUT 2, and OUT 4 respectively. The sources of transistors M10, M11, M12, and M13 are also coupled to the drains of field effect transistors M16, M17, M18, and M19 respectively.

RF input +IN is simultaneously coupled to the gates of M16 and M19. RF input −IN is simultaneously coupled to the gates of transistors M17 and M18. The sources of transistor M16 and M17 are coupled together and to a drain of field effect transistor M20. The sources of transistors M18 and M19 are coupled together and to the drain of field effect transistor M21. The gate of transistor M20 is coupled to local oscillator signal +LO. The gate of transistor M21 is coupled to local oscillator signal −LO. The sources of M20 and M21 are coupled together and to the drain of a field effect transistor M14 configured as a conventional current source. The gate of M14 is driven by a conventional bias control circuit and the source of M14 is coupled to ground.

Figure 30N:
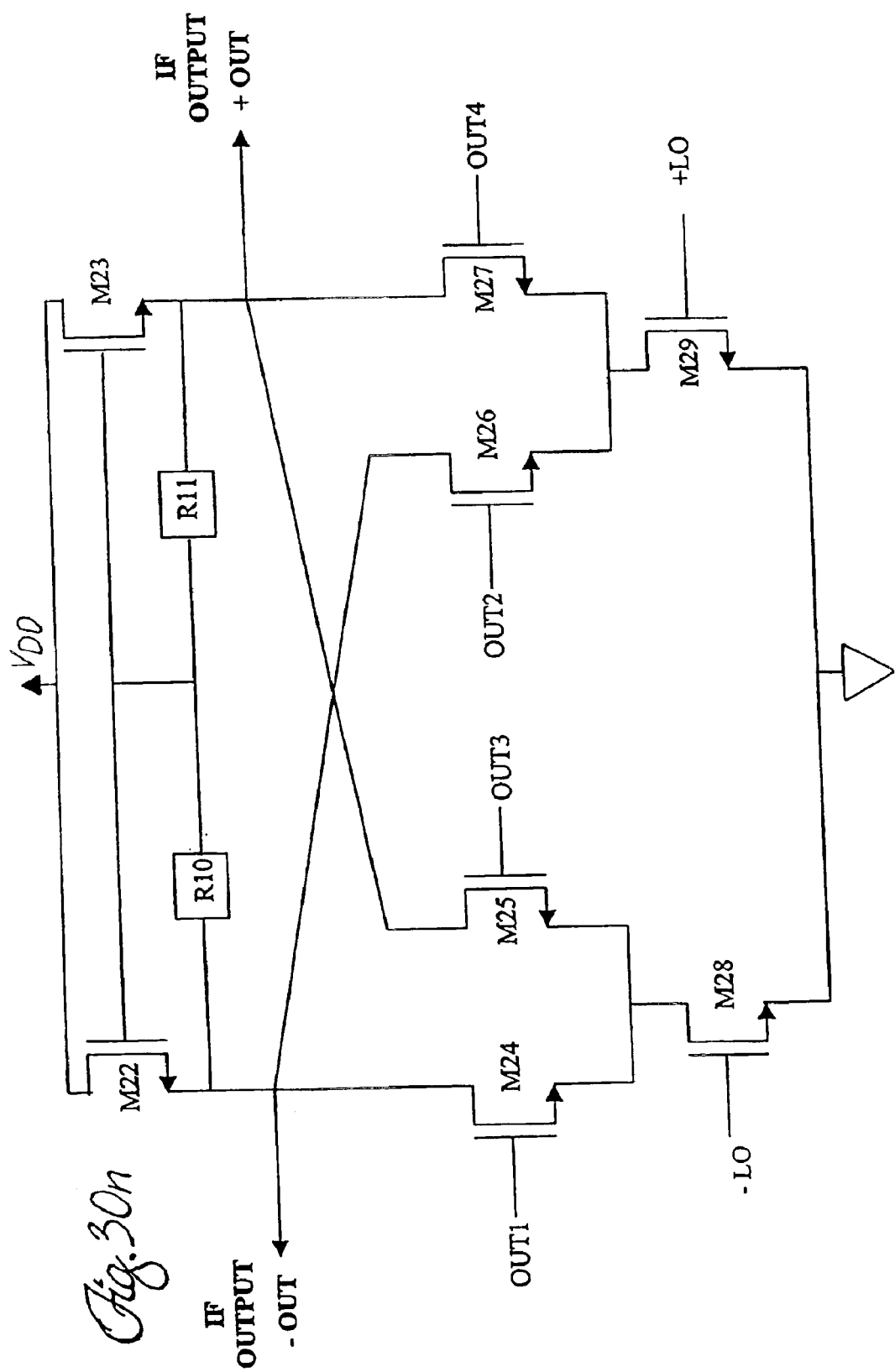
FIG. 30(n) is a schematic diagram of the sample and hold and current combining circuit.

FIG. 30*n* is a schematic diagram of the sample and hold and current combining circuit 115. Field effect transmitters M22 and M23 are configured in a conventional common mode feedback circuit incorporating resisters 410 and 411. As previously described local oscillator signals −LO and +LO are used to gate the sample and hold circuit.

Voltage source $V_{DD}$ is coupled to the drains of transistor M22 and M23. The gate of transistor M22 is coupled to the gate of transistor M23, and a first terminal on resistor R10 and a first terminal of resister R11. The second terminal of resister R10 is coupled to the source of transistor M22. The second terminal of resister R11 is coupled to the source of M23. The source of M22 defines the IF output, −OUT. The source of transistor M23 defines the IF output +OUT. The source of M22 is coupled to the drain of field effect transistor M24, and also to the drain of field effect transistor M26. The source of transistor M23 is coupled to the drain of field effect transistor M27, and to the drain of field effect transistor M25. The gate of transistor M24 is coupled to the input signal OUT 1. The gate of transistor M25 is coupled to the input signal OUT 3. The gate of transistor M26 is coupled to the input signal OUT 2. The gate of transistor M27 is coupled to the input signal OUT 4. The source of M24 is coupled to the source of M25 and to the drain of field effect transistor M28. The source of transistor M26 is coupled to the source of transistor M27, and to the drain of field effect transistor M29. The gate of transistor M28 is coupled to local oscillator signal −LO. The gate of transistor M29 is coupled to the local oscillator signal +LO. The source of M28 is coupled to the source of M29 and to ground.

3.0 Local Oscillator

Figure 31A:
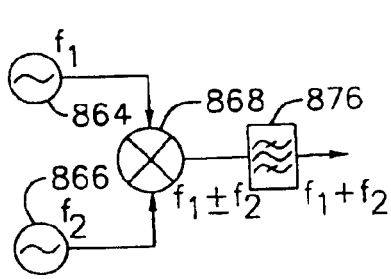
FIG. 31(a) is a block diagram of a local oscillator (LO) architecture in accordance with an exemplary embodiment of the present invention.

In embodiments of the present invention utilizing a low-IF or direct conversion architecture, techniques are implemented to deal with the potential disturbance of the local oscillator by the PA. Since the LO generator has a frequency which coincides with the RF signal at the transmitter output, the large modulated signal at the PA output may pull the VCO frequency. The potential for this disturbance can be reduced by setting the VCO frequency far from the PA output frequency. To this end, an exemplary embodiment of the LO generator produces RF clocks whose frequency is close to the PA output frequency, as required in a low-IF or direct-conversion architectures, with a VCO operating at a frequency far from that of the RF clocks. One way of doing so is to use two VCO 864, 866, with frequencies of $f_1$ and $f_2$ respectively, and mix 868 their output to generate a clock at a higher frequency of $f_1+f_2$ as shown in FIG. 31(*a*). With this approach, the VCO frequency will be away from the PA output frequency with an offset equal to $f_1$ (or $f_2$). A bandpass filter 876 after the mixer can be used to reject the undesired signal at $f_1-f_2$. The maximum offset can be achieved when $f_1$ is close to $f_2$.

Figure 31B:
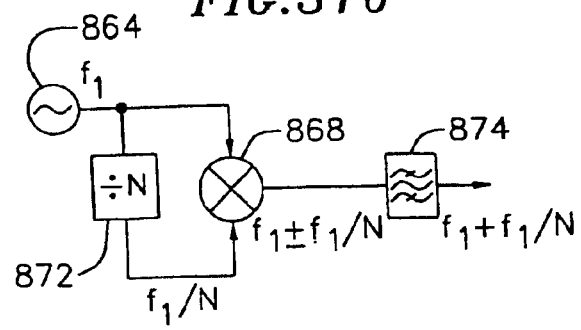
FIG. 31(b) is a block diagram of an LO architecture in accordance with another exemplary embodiment of the present invention.

An alternative embodiment for generating RF clocks far away in frequency from the VCO is to generate $f_2$ by dividing the VCO output by N as shown in FIG. 31(b). The output of the VCO 864 (at $f_1$) is coupled to a divider 872. The output of the divider 872 (at $f_2$) is mixed with the VCO at mixer 868 to produce an RF clock frequency equal to: $f_{LO}=f_1'(1+1/N)$, where $f_1$ is the VCO frequency. A bandpass filter 874 at the mixer output can be used to reject the lower sideband located at $f_1-f_1/N$.

Figure 32:
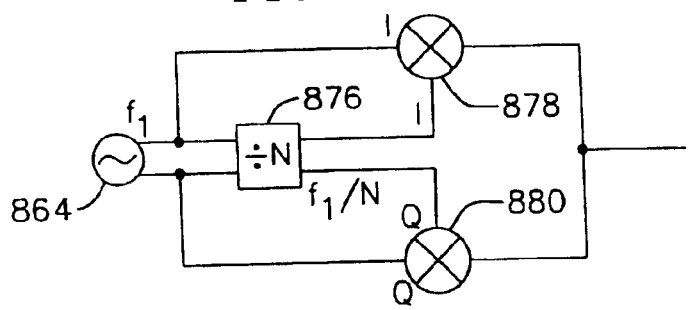
FIG. 32 is a block diagram of a LO architecture in accordance with an alternative exemplary embodiment of the present invention.

In another embodiment of the present invention, a single sideband mixing scheme is used for the LO generator. FIG. 32 shows a single sideband mixing scheme. This approach generates I and Q signals at the VCO 864 output. The output of the VCO 864 is coupled to a quadrature frequency divider 876 should be able to deliver quadrature outputs. Quadrature outputs will be realized if the divide ratio (N) is equal to two to the power of an integer ($N=2^n$). The I signal output of the divider 876 is mixed with the I signal output of the VCO 864 by a mixer 878. Similarly, the Q signal output of the divider 876 is mixed with the Q signal output of the VCO 864 by a mixer 880.

Although a single sideband structure uses two mixers, this should not double the mixer power consumption, since the gain of the single sideband mixer will be twice as much. By utilizing a Gilbert cell (i.e., a current commutating mixer) for each mixer 878, 880, the addition or subtraction required in a single sideband mixer can be done by connecting the two mixers 878, 880 outputs and sharing a common load (e.g., an LC circuit). The current from the mixers is added or subtracted, depending on the polarity of the inputs, and then converted to a voltage by an LC load (not shown) resonating at the desired frequency.

Figure 33A:
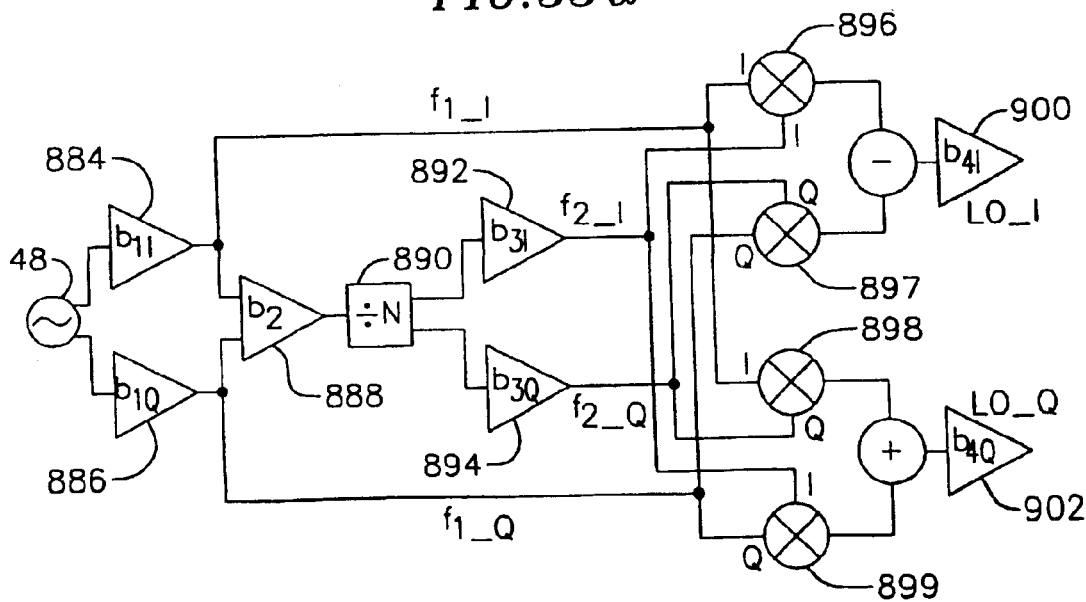
FIG. 33(a) is a block diagram of a LO architecture in accordance with an yet another exemplary embodiment of the present invention.
Figure 33B:
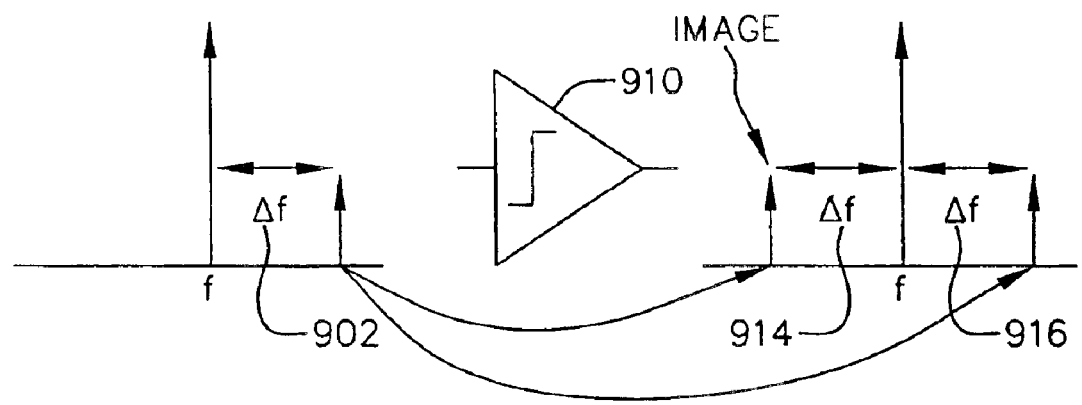
FIG. 33(b) is a block diagram of a limiting buffer for the LO architecture of FIG. 33 in accordance with an exemplary embodiment of the present invention.

FIG. 33 shows an LO generator architecture in accordance with an embodiment of the present invention. This architecture is similar to the architecture shown in FIG. 32, except that the LO generator architecture in FIG. 33 generates I-Q data. In a low-IF system, a quadrature LO is desirable for image rejection. In the described embodiment, the I and Q outputs of the VCO can be applied to a pair of single sideband mixer to generate quadrature LO signals. A quadrature VCO 48 produces I and Q signals at its output. Buffers are included to provide isolation between the VCO output and the LO generator output. The buffer 884 buffers the I output of the VCO 48. The buffer 886 buffers the Q output of the VCO 48. The buffer 888 combines the I and Q outputs of the buffers 884, 886. The signal from the buffer 888 is coupled to a frequency divider 890 where it is divided by N and separated into I and Q signals. The I-Q outputs of the divider 890 are buffered by buffer 892 and buffer 894. The I output of the divider 890 is coupled to a buffer 892 and the Q signal output of the divider 890 is coupled to a buffer 894. A first mixer 896 mixes the I signal output of the buffer 892 with the I signal output of the buffer 884. A second mixer 897 mixes the Q signal output from the buffer 894 with Q signal output from the buffer 886. A third mixer 898 mixes the Q signal output of the buffer 894 with the I signal output of the buffer 884. A fourth mixer 899 mixes the I signal output from the buffer 892 with the Q signal output from the buffer 886. The outputs of the first and second mixers 896, 897 are combined and coupled to buffer 900. The outputs of the third and fourth mixers 898, 899 are combined and coupled to buffer 902. LC circuits (not shown) can be positioned at the output of each buffer 900, 902 to provide a second-order filter which rejects the spurs and harmonics produced due to the mixing action in the LO generator.

Embodiments of the present invention which are integrated into a single IC may employ buffers configured as differential pairs with a current source to set the bias. With this configuration, if the amplitude of the buffer input is large enough, the signal amplitude at the output will be rather independent of the process parameters. This reduces the sensitivity of the design to temperature or process variation.

The lower sideband signal is ideally rejected with the described embodiment of the LO generator because of the quadrature mixing. However, in practice, because of the phase and amplitude inaccuracy at the VCO and divider outputs, a finite rejection is obtained. In single IC fully integrated embodiments of the present invention, the rejection is mainly limited to the matching between the devices on chip, and is typically about 30–40 dB. Since the lower sideband signal is $2\times f_1/N$ away in frequency from the desired signal, by proper choice of N, it can be further attenuated with on-chip filtering.

A Because of the hard switching action of the buffers, the mixers will effectively be switched by a square-wave signal. Thus, the divider output will be upconverted by the main harmonic of VCO ($f_1$), as well as its odd harmonics ($n \times f_1$), with a conversion gain of 1/n. In addition, at the input of the mixer, because of the nonlinearity of the mixers, and the buffers preceding the mixers, all the odd harmonics of the input signals to the mixers will exist. Even harmonics, both at the LO and the input of the mixers can be neglected if a fully balanced configuration is used. Therefore, all the harmonics of VCO ($n \times f_1$) will mix with all the harmonics of input ($m \times f_2$), where $f_2$ is equal to $f_1/N$. Because of the quadrature mixing, at each upconversion only one sideband appears at the mixer output. Upper or lower sideband rejection depends on the phase of the input and LO at each harmonic. For instance, for the main harmonics mixed with each other, the lower sideband is rejected, whereas when the main harmonic of the VCO mixes with the third harmonic of the divider output signal, the upper sideband is rejected. Table 1 gives a summary of the cross-modulation products up to the $5^{th}$ harmonic of the VCO and input. In each product, only one sideband is considered, since the other one is attenuated due to quadrature mixing, and is negligible.

All the spurs are at least $2 \times f_1/N$ away from the main signal located at $f_1 \times (1+1/N)$. The VCO frequency will be $f_1/N$ away from the PA output. Thus, by choosing a smaller N better filtering can be obtained. In addition, the VCO frequency will be further away from the PA output frequency. The value of N, and the quality factor (Q) of the resonators (not shown) positioned at the output of each component determine how much each spur will be attenuated. The resonator quality factor is usually set by the inductor Q, and that depends merely on the IC technology. Higher Q provides better filtering and lower power consumption.

TABLE 1

Cross-Modulation Products at the LO Generator Output

| | $1^{st}:f_1/N$ | $3^{rd}:3f_1/N$ | $5^{th}:5f_1/N$ |
| --- | --- | --- | --- |
| $1^{st}:f_1$ | $f_1 \times (1 + 1/N)$ | $f_1 \times (1 - 3/N)$ | $f_1 \times (1 + 5/N)$ |
| $3^{rd}:3f_1$ | $f_1 \times (3 - 1/N)$ | $f_1 \times (3 + 3/N)$ | $f_1 \times (3 - 5/N)$ |
| $5^{th}:5f_1$ | $f_1 \times (5 + 1/N)$ | $f_1 \times (5 - 3/N)$ | $f_1 \times (5 + 5/N)$ |

The maximum filtering is obtained by choosing N=1. Moreover, in this case, the frequency divider is eliminated. This lowers the power consumption and reduces the system complexity of the LO generator. However, the choice of N=1 may not be practical for certain embodiments of the present invention employing a low-IF receiver architecture with quadrature LO signals. The problem arises from the fact that the third harmonic of the VCO (at $3f_1$) mixed with the divider output (at $f_1$) also produces a signal at $2f_1$ which has the same frequency as the main component of the RF clock output from the LO generator. With the configuration shown in FIG. 33, the following relations hold for the main harmonics:

$$\text{Cos}(\omega_1 t)\cdot\text{Cos}(\omega_1 t)-\text{Sin}(\omega_1 t)\cdot\text{Sin}(\omega_1 t)\rightarrow\text{Cos}(2\omega_1 t) \quad (45)$$

and $$\text{Cos}(\omega_1 t)\cdot\text{Sin}(\omega_1 t)+\text{Sin}(\omega_1 t)\cdot\text{Cos}(\omega_1 t)\rightarrow\text{Sin}(2\omega_1 t) \quad (46)$$

which show that at the output of the mixers, quadrature signals at twice the VCO frequency exist. For the VCO third harmonic mixed with the divider output, however, the following relations hold:

$$\text{Cos}(\omega_1 t)\cdot 1/3\ \text{Cos}(3\omega_1 t)-\text{Sin}(\omega_1 t)\cdot 1/3\ \text{Sin}(3\omega_1 t)\rightarrow -1/3\ \text{Cos}(2\omega_1 t) \quad (47)$$

and $$\text{Cos}(\omega_1 t)\cdot 1/3\ \text{Sin}(3\omega_1 t)-\text{Sin}(\omega_1 t)\cdot 1/3\ \text{Cos}(3\omega_1 t)\rightarrow -1/3\ \text{Sin}(2\omega_1 t) \quad (48)$$

The factor 1/3 appears in the above equations because the third harmonic of a square-wave has an amplitude which is one third of the main harmonic. Comparing equation (46) with equation (48), the two products are added in equation (46), while they are subtracted in equation (47). The reason is that for the main harmonic of the VCO, quadrature outputs have phases of 0 and 90°, whereas for the third harmonic, the phases are 0 and 270°. The same holds true for equation (45) and equation (47). The two cosines in equation (45) and equation (47), when added, give a cosine at $2\omega_1$ with an amplitude of 2/3, yet the two sinewaves in equation (46) and equation (48) when added, give a component at $2\omega_1$ with an amplitude of 4/3. Therefore, a significant amplitude imbalance exists at the I and Q outputs of the mixers. When these signals pass through the nonlinear buffer at the mixers output, the amplitude imbalance will be reduced. However, because of the AM to PM conversion, some phase inaccuracy will be introduced. The accuracy can be improved with a quadrature generator, such as a polyphase filter, after the mixers. A polyphase filter, however, is lossy, especially at high frequency, and it can load its previous stage considerably. This increases the LO generator power consumption significantly, and renders the choice of N=1 unattractive for embodiments of the present invention employing a low-IF receiver architecture with quadrature LO signals.

For N=2, the LO generator output will have a frequency of $1.5f_1$, and the closest spurs will be located $\pm f_1$ away from the output. These spurs can be rejected by positioning LC filters (not shown) at the output of each circuit in the LO generator. A second-order LC filter tuned to $f_0$, with a quality factor Q, rejects a signal at a frequency of f as given in the following equation:

$$|H(f)| = \frac{\frac{f}{Qf_0}}{\sqrt{\left[1-\left(\frac{f}{f_0}\right)^2\right]^2+\left(\frac{f}{Qf_0}\right)^2}} \quad (49)$$

The following discussion changes based on the Q value. Considering a Q of about 5 for the inductor, with $f_0=1.5f_1$, the spur located at $2.5f_1$ is rejected by about 15 dB by each LC circuit. This spur is produced at the LO generator output due to the mixing of the VCO third harmonic (at $3f_1$) with the divider output (at $0.5f_1$). This signal is attenuated by 10 dB since the third harmonic of a square-wave is one third of the main harmonic, 15 dB at the LC resonator at the mixers output tuned to $1.5f_1$, and another 15 dB at the output of the buffers (900, 902 in FIG. 33). This gives a total rejection of 40 dB. When applied to the mixers in the transmitter, this LO generator output will upconvert the baseband data to $2.5f_1$. With LC filters (not shown) positioned at the upconversion mixers and PA output in the transmitter, another 15+15=30 dB rejection is obtained (FIG. 33).

The spur located at $0.5f_1$ is produced because of the third harmonic of the divider output (at $1.5f_1$) is mixed with the VCO output (at $f_1$). Because of the hard switching action at the divider output, the third harmonic is about 10 dB lower than the main harmonic at $0.5f_1$. The buffer at the divider output tuned to $0.5f_1$ (892, 8943 in FIG. 33), rejects this signal by about 22 dB (equation (24)). This spur can be further attenuated by LC circuits at the mixer and its buffer output by (2)(22)=44 dB. The total rejection is 76 dB.

FIG. 33(a) shows a signal passing through a limiting buffer 910 (such as the buffers implemented in the LO generator). When a large signal at a frequency of f accompanied with a small interferer at a frequency of $\Delta f$902 away pass through a limiting buffer, at the limiter output the interferer produces two tones$\pm\Delta f$914, 916 away from the main signal, each with 6 dB lower amplitude. Therefore, the spur at $2.5f_1$ will actually be 10+15+15+6=46 dB attenuated when it passes through the buffer, instead of the 40 dB calculated above. It will also produce an image at $0.5f_1$ which is 10+15+22+6=53 dB lower than the main signal. This will dominate the spur at $0.5f_1$ because of the third harmonic of the divider mixed with the VCO signal, which is more than 75 dB lower than the main signal.

Since the buffer is nonlinear, another major spur at the LO generator output is the third harmonic of the main signal located at $3\times 1.5f_1$. This signal will be 10+22=32 dB lower than the main harmonic. The 22 dB rejection results from an LC circuit (not shown) tuned to $1155f_1$ (equation (49)) in the buffer. This undesired signal will not degrade the LO generator performance, since even if a perfect sinewave is applied to upconversion (or downconversion) mixers, due to hard switching action of the buffer, the mixer is actually switched by a square-wave whose third harmonic is only 10 dB lower. Thus, if a nonlinear PA is used in the transmitter, even with a perfect input to the PA, the third harmonic at the transmitter output will be 10+22+10=42 dB lower. The first 10 dB is because the third harmonic of a square-wave is one third of the main one, the 22 dB is due to the LC filter at the PA output, and the last 10 dB is because the data is spread in the frequency domain by three times. Any DC offset at the mixer input in the transmitter is upconverted by the LO, and produces a spur at $f_1$. This spur can be attenuated by 13 dB for each LC circuit used (equation (49)). In addition, the signal at the mixer input in the transmitter is considerably larger (about 10–20 times) than the DC offset. Thus the spur at $f_1$ will be about 13+13+26=52 dB lower than the main signal. All other spurs given in Table 1 are more than 55 dB lower at the LO generator output. The dominant spur is the one at $2.5f_1$ which is about 46 dB lower than the main signal.

Choosing N>2 may not provide much benefit for single IC embodiments of the present invention with the possible exception that the on-chip filtering requirements may be relaxed. When using an odd number for N, further disadvantages may be realized because the divider output will not be in quadrature thereby preventing single sideband mixing.

In addition, for N>2 the divider becomes more complex and the power consumption increases. Nevertheless, in certain applications, N=4 may be selected over N=2 so that the divider quadrature accuracy will not depend on the duty cycle of the input signal.

When choosing N equal to $2^n$, such as N=2, quadrature signals are readily available at the divider output despite quadrature phase inaccuracies at the output of the VCO. Assume that the VCO outputs have phase of 0 and 90°+q, where q is ideally 0, and that the divider produces perfect quadrature outputs. At the LO generator outputs the following signals exist:

$$V_{out_I} = \text{Cos}(\omega_2 t) \cdot \text{Cos}(\omega_1 t + \theta) - \text{Sin}(\omega_2 t) \cdot \text{Sin}(\omega_1 t) \quad (50)$$

and $$V_{out_Q} = \text{Cos}(\omega_2 t) \cdot \text{Sin}(\omega_1 t) + \text{Sin}(\omega_2 t) \cdot \text{Cos}(\omega_1 t + \theta) \quad (51)$$

where $\omega_1$ is the VCO radian frequency, and $\omega_2$ is the divider radian frequency, equal to $0.5\omega_1$. By simplifying equation (25) and equation (26), the signals at the output of mixers will be:

$$V_{out\_I} = \quad (52)$$
$$-\text{Sin}\left(\frac{\theta}{2}\right) \cdot \text{Sin}\left((\omega_1 - \omega_2)t + \frac{\theta}{2}\right) + \text{Cos}\left(\frac{\theta}{2}\right) \cdot \text{Cos}\left((\omega_1 + \omega_2)t + \frac{\theta}{2}\right) \text{ and}$$

$$V_{out\_Q} = \quad (53)$$
$$-\text{Sin}\left(\frac{\theta}{2}\right) \cdot \text{Cos}\left((\omega_1 - \omega_2)t + \frac{\theta}{2}\right) + \text{Cos}\left(\frac{\theta}{2}\right) \cdot \text{Sin}\left((\omega_1 + \omega_2)t + \frac{\theta}{2}\right)$$

The above equations show that regardless of the value of θ, the outputs are always in quadrature. However, other effects should be evaluated. First, a spur at $\omega_1 - \omega_2 = 0.5\omega_1$ is produced at the output. This spur can be attenuated by 2×22=44 dB by the LC filters at the mixer and its buffer outputs. Thus, for 60 dB rejection, the single sideband mixers need to provide an additional 16 dB of rejection (about 0.158). Based on equation (53), tan(θ/2)=0.158, or θ≈18°, phase accuracy of better than 18° can generally be achieved. Second, phase error at the VCO output lowers the mixer gain (term Cos(θ/2) in equation (52) or (53)). For a phase error of 18°, the gain reduction is, however, only 0.1 dB, which is negligible. For θ=90° (a single-phase VCO), both sidebands are equally upconverted at the mixer output. However, the LC filters reject the lower sideband by about 44 dB. The mixer gain will also be 3 dB lower. This will slightly increase the power consumption of the LO generator. If θ=180° (the VCO I and Q outputs are switched), the lower sideband is selected, and the desired sideband is completely by rejected.

Similarly, the LO generator will not be sensitive to the phase imbalance of the divider outputs if the VCO is ideal. However, if there is some phase inaccuracy at both the divider and VCO outputs, the LO generator outputs will no longer be in quadrature. In fact, if the VCO output has a phase error of $q_1$ and the divider output has a phase error of $q_2$, the LO generator outputs will be:

$$V_{out\_I} = -\text{Sin}\left(\frac{\theta_1 - \theta_2}{2}\right) \cdot \text{Sin}\left((\omega_1 - \omega_2)t + \frac{\theta_1 - \theta_2}{2}\right) + \quad (54)$$
$$\text{Cos}\left(\frac{\theta_1 + \theta_2}{2}\right) \cdot \text{Cos}\left((\omega_1 + \omega_2)t + \frac{\theta_1 + \theta_2}{2}\right) \text{ and}$$

-continued
$$V_{out\_Q} = -\text{Sin}\left(\frac{\theta_1 + \theta_2}{2}\right) \cdot \text{Cos}\left((\omega_1 - \omega_2)t + \frac{\theta_1 - \theta_2}{2}\right) + \quad (55)$$
$$\text{Cos}\left(\frac{\theta_1 - \theta_2}{2}\right) \cdot \text{Sin}\left((\omega_1 + \omega_2)t + \frac{\theta_1 + \theta_2}{2}\right)$$

This shows that the outputs still have phases of 0 and 90°, but their amplitudes are not equal. The amplitude imbalance is equal to:

$$\frac{\Delta A}{A} = 2\frac{\text{Cos}\left(\frac{\theta_1 + \theta_2}{2}\right) - \text{Cos}\left(\frac{\theta_1 - \theta_2}{2}\right)}{\text{Cos}\left(\frac{\theta_1 + \theta_2}{2}\right) + \text{Cos}\left(\frac{\theta_1 - \theta_2}{2}\right)} = 2\tan\left(\frac{\theta_1}{2}\right) \times \tan\left(\frac{\theta_2}{2}\right) \quad (56)$$

If $\theta_1$ and $\theta_2$ are small and have an equal standard deviation, that is, the phase errors in the VCO and divider are the same in nature, then the output amplitude standard deviation will be:

$$\sigma_A \approx \frac{(\sigma_\theta)^2}{2} \quad (57)$$

where $\sigma_A$ is the standard deviation of the output amplitude, and $\sigma_\theta$ the phase standard deviation in radians. Equation (57) denotes that the phase inaccuracy in the VCO and divider has a second order effect on the LO generator. For instance, if $\theta_1$ and $\theta_2$ are on the same order and about 10°, the amplitude imbalance of the output signals will be only about 1.5%. In this case, the lower sideband will be about 15 dB rejected by the mixers, which will lead to a total attenuation of about 22+22+15=59 dB. This shows that the LO generator is robust to phase errors at the VCO or divider outputs, since typically phase errors of less than 5° can be obtained on chip.

Phase errors in the divider can originate from the mismatch at its output. Moreover, for N=2, if the input of the divider does not have a 50% duty cycle, the outputs will not be in quadrature. Again, the deviation from a 50% duty cycle in the divider input signal may be caused due to mismatch. Typically, with a careful layout, this mismatch is minimized to a few percent. The latter problem can also be alleviated by improving the common-mode rejection of the buffer preceding the divider (888 in FIG. 33). One possible way of doing so is to add a small resistor at the common tail of the inductors in the buffer. For a differential output, this resistor does not load the resonator at the buffer output, since the inductors common tail is at AC ground. A common-mode signal at the output is suppressed however, since this resistor degrades the LC circuit quality factor. The value of the resistor should be chosen appropriately so as not to produce a headroom problem in the buffer.

Figure 34:
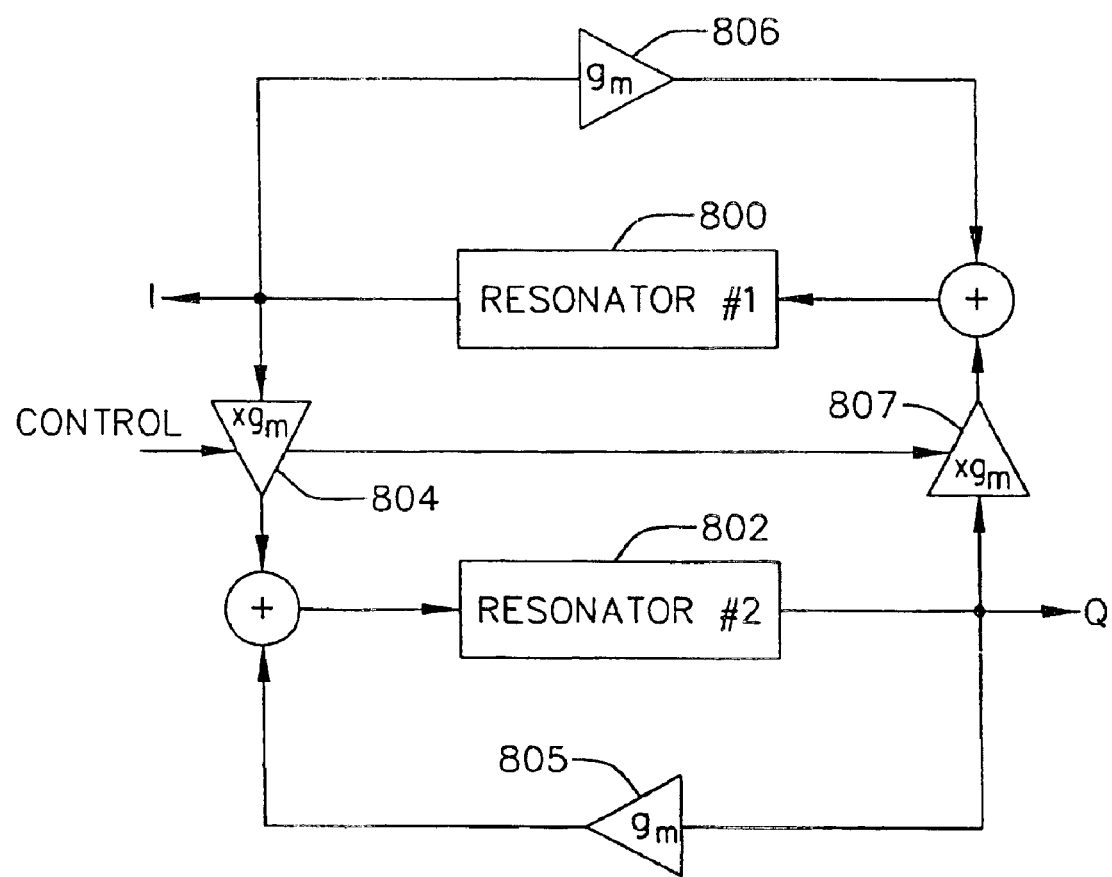
FIG. 34 is a block diagram of a wide tuning range voltage controlled oscillator (VCO) in accordance with an exemplary embodiment of the present invention.

Embodiments of the present invention that are fully integrated onto a single IC can be implemented with a wide tuning range VCO with constant gain. In a typical IC process, the capacitance can vary by 20%. This translates to a 10% variation in the center frequency of the oscillator. A wide tuning range can be used to compensate for variation. Variations in temperature and supply voltage can also shift the center frequency. To generate a wide tuning range, two identical oscillators can be coupled together as shown in FIG. 34. This approach forces the oscillation to be dependent on the amount of coupling between the two oscillators.

In the described exemplary embodiment of the VCO shown in FIG. 34, the tuning curve is divided into segments with each segment digitally selected. This approach ensures a sufficient amount of coupling between the two oscillators for injection lock. In addition, good phase noise performance is also obtained. The narrow frequency segment prevents the gain of the VCO from saturating. The segmentation lowers the VCO gain by the number of segments, and finally by scaling the individual segments, a piecewise linear version of the tuning curve is made resulting in a constant gain VCO.

Figure 35:
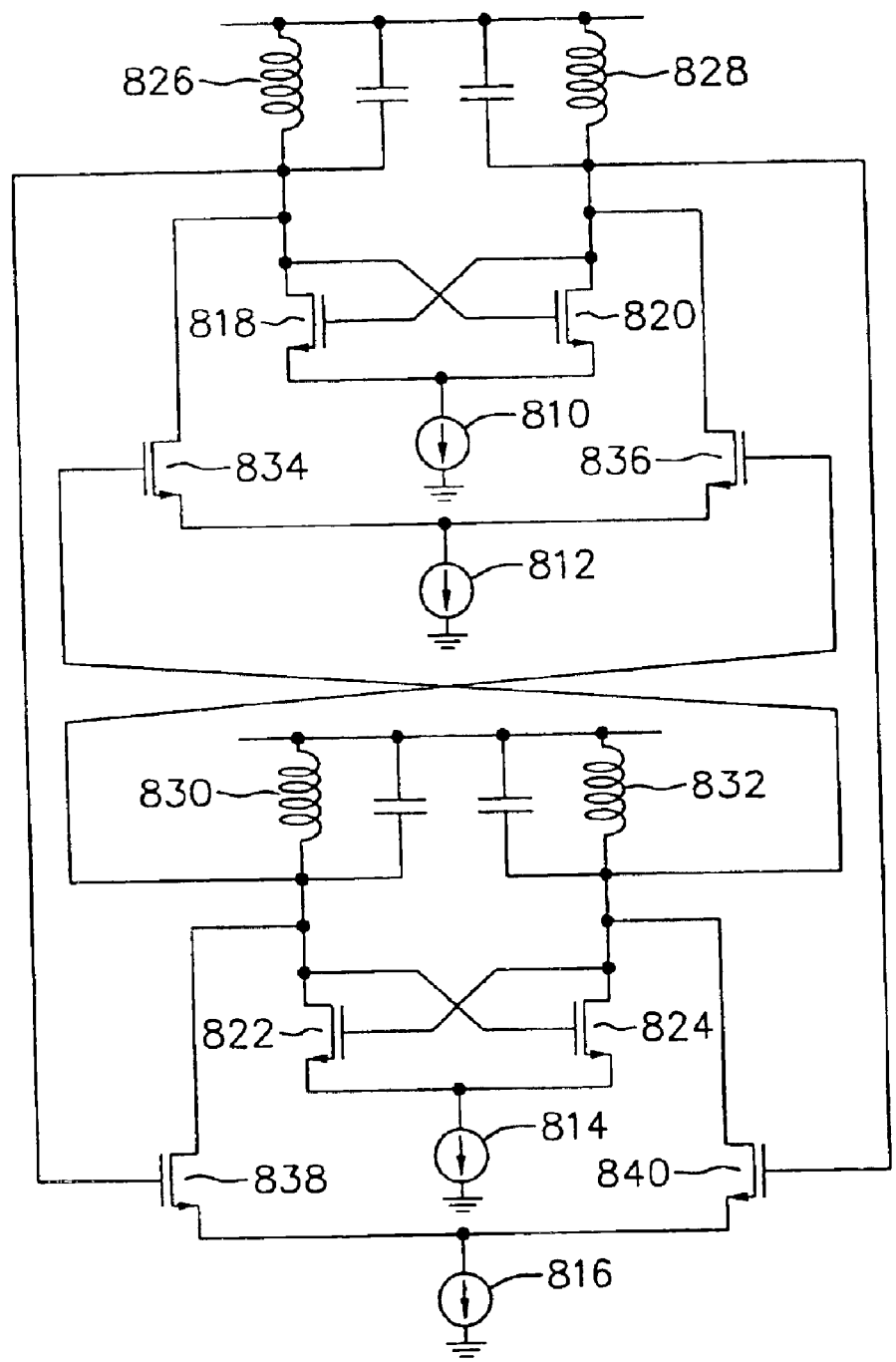
FIG. 35 is an electrical diagram of the wide tuning range VCO of FIG. 34 in accordance with an exemplary embodiment of the present invention.

FIG. 34 shows a block diagram of the wide tuning range VCO comprising two coupled oscillators where the amount of coupling transconductance is variable. The wide tuning range VCO comprises two resonators 800, 802 and four transconductance cells, $g_m$ cells 804, 806, 808, 810. The transconductance cells are driver that converts voltage to current. The transconductance cells used to couple the oscillators together have a variable gain. The first VCO 800 provides the I signal and the second VCO provides the Q signal. The output of the first VCO 800 and the output of the second VCO 802 are coupled to transconductance cells 806, 807, respectively, combined, and fed back to the first VCO 800. The transconductance cell 807 used for feeding back the output of the second VCO to the first VCO is a programmable variable gain cell. Similarly, the output of the second VCO 802 and the output of the first VCO 800 are coupled to transconductance cells 805, 804, respectively, combined, and fed back to the second VCO 802. The transconductance cell 804 used for feeding back the output of the first VCO to the second VCO is a programmable variable gain cell. The gain of the programmable variable gain transconductance cells 804, 807 can be digitally controlled from the controller FIG. 35 shows a schematic block diagram of the wide-tuning range VCO described in connection with FIG. 34. The wide-tuning range VCO includes individual current sources 810, 812, 814, 816, cross-coupled transistors 818, 820 with resonating inductors 826, 828, and cross-coupled transistors 822, 824 with resonating inductors 830, 832. Two differential pairs couple the two sets of oscillators. Differential pair 834, 836 are coupled to the drains of transistors 824, 822, respectively. Differential pair 838, 840 are coupled to the drains of transistors 818, 820. Tank #1 comprises inductors 826 and 828. Tank #2 comprises inductors 830 and 832.

Transistors 818 and 820 form a cross-coupled pair that injects a current into tank #1 that is exactly 180 degrees out of phase with V1. Likewise, transistors 822 and 824 form a cross-coupled pair that injects a current into tank #2 that is exactly 180 degrees out of phase with V2. The first set of coupling devices 834, 836 injects a current into tank #2 that is in-phase with V1. The second set of coupling devices 838, 840 injects a current into tank #1 that is in phase with V2. The tank impedances causes a frequency dependent phase shift. By varying the amplitude of the coupled signals, the frequency of oscillation changes until the phase shift through the tanks results in a steady-state solution. Varying the bias of the current source controls the gm of the coupling devices. Current sources 812, 816 provide control of VCO tuning. Current sources 810, 814 provide segmentation of the VCO tuning range.

Figure 36A:
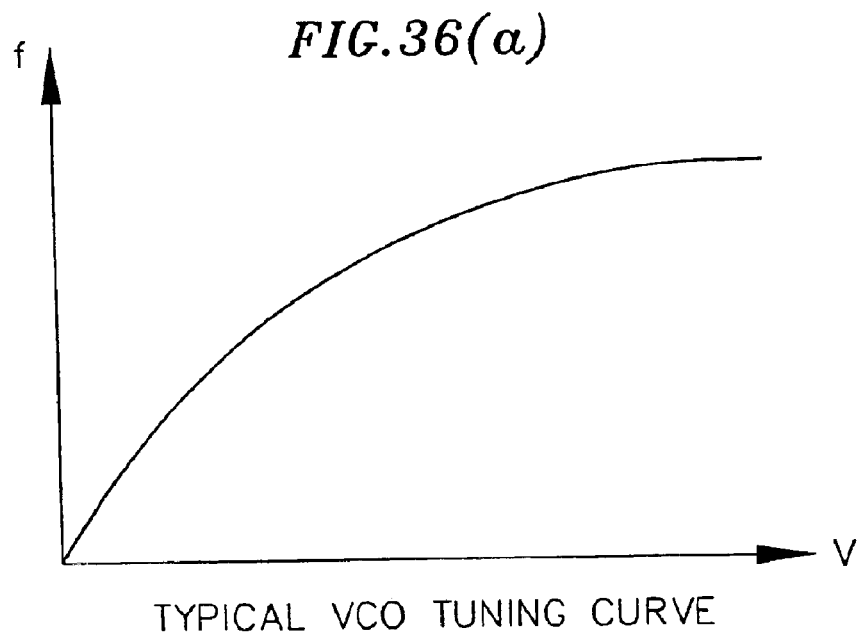
FIG. 36(a) is a graphical depiction showing a typical VCO tuning curve.
Figure 36B:
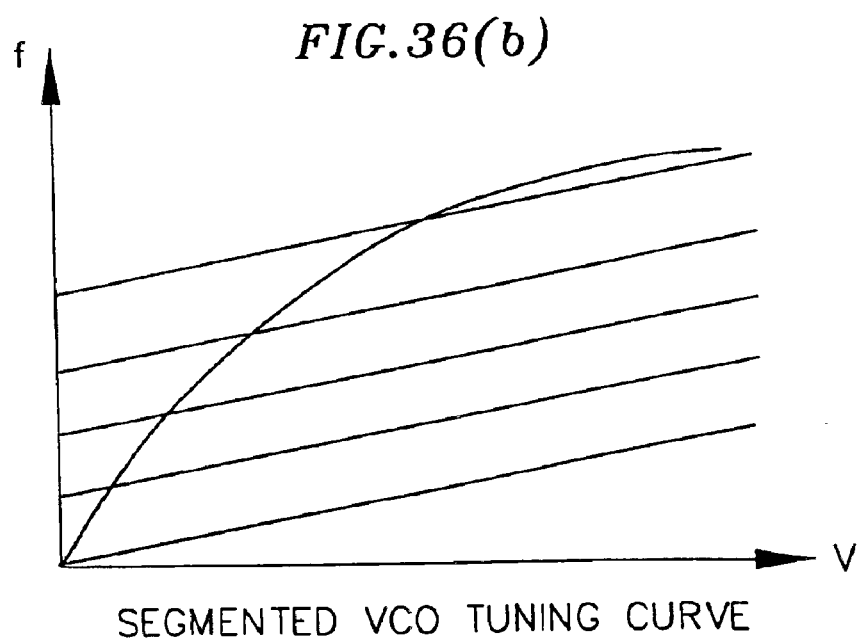
FIG. 36(b) is a graphical depiction of a segmented VCO tuning curve in accordance with an exemplary embodiment of the present invention.

FIG. 36(a) shows the typical tuning curve of the wide tuning range VCO before and after segmentation. The horizontal axis is voltage. The vertical axis is frequency. FIG. 36(b) shows how segmentation is used to divide the tuning range and linearize the tuning curve. The linear tuning curves correspond to different VCO segments. The slope of the linear tuning curves is a result control of VCO tuning. The horizontal axis is voltage. The vertical axis is frequency.

Figure 37A:
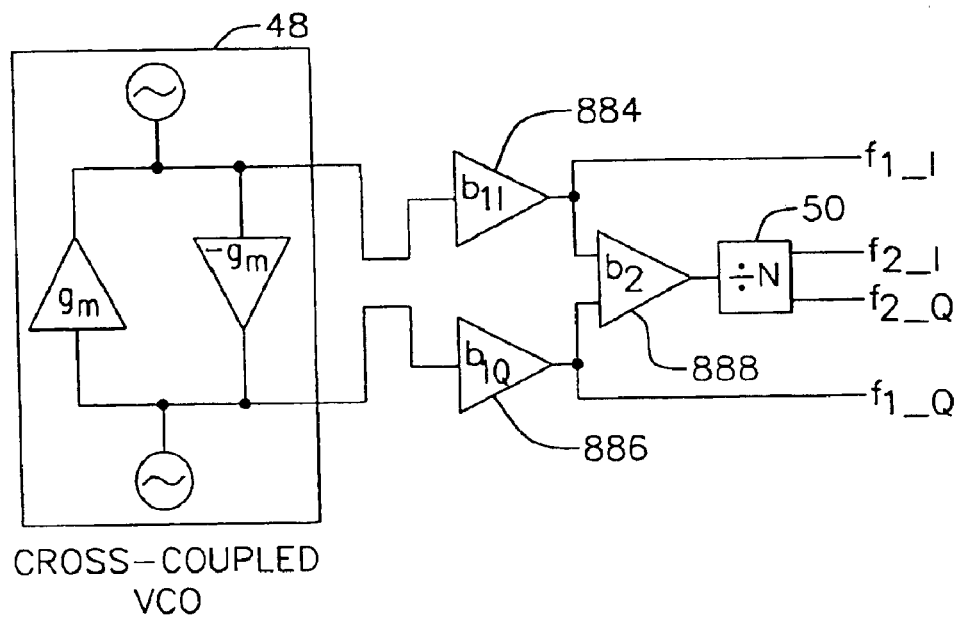
FIG. 37(a) is a block diagram of a cross-coupled VCO in combination with a frequency divider in accordance with an exemplary embodiment of the present invention.

FIG. 37(a) shows how the VCO of FIG. 34 can be connected to the divider before being upconverted to the RF clock frequency in the LO generator. The I output signal of the VCO is coupled to buffer 884 and the Q output signal of the VCO is coupled to buffer 886. Buffer 888 combines the I-Q data from the buffer 884 and the buffer 886 to obtain a larger signal. The large signal is coupled to a divider 50 where it is divided in frequency by N to get quadrature signals.

Figure 37B:
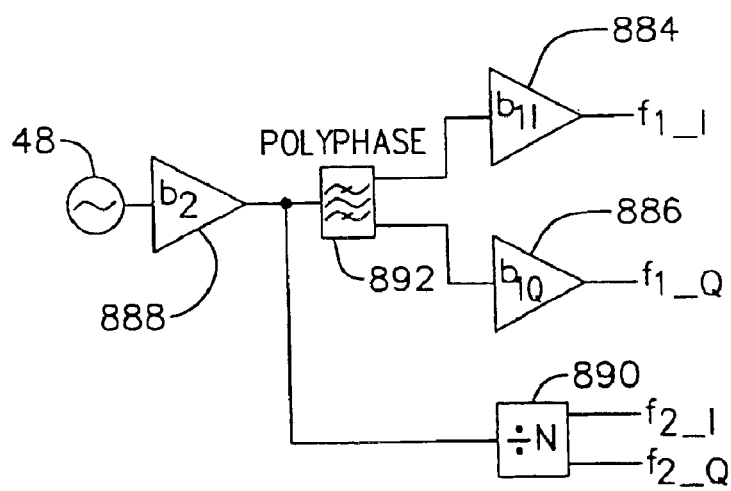
FIG. 37(b) is a block diagram of a VCO in combination with a divider and polyphase circuit in accordance with an exemplary embodiment of the present invention.

In another embodiment of the present invention, a polyphase filter 892 follows a single-phase VCO as shown in FIG. 37(b). This approach uses a single phase VCO 48 with a polyphase filter 892 to get quadrature signals. The output of the VCO 48 is coupled to a buffer 888. The buffer provides sufficient drive for the polyphase filter 892.

A multiple stage polyphase filter can be used to obtain better phase accuracy at a certain frequency range. Embodiments of the present invention that are fully integrated into a single IC, the required frequency range is mainly set by the process variation on the chip and the system bandwidth.

Any amplitude imbalance in the signals at the VCO and divider output will only cause a second order mismatch in the amplitude of the LO generator signals, and the output phase will remain 0 and 90°. If the standard deviation of the amplitude imbalance at the VCO and divider are the same and equal to $\sigma_a$, then the standard deviation of the LO generator output amplitude imbalance ($\sigma_A$) will be:

$$\sigma_A = \frac{(\sigma_a)^2}{2} \tag{58}$$

The reason phase inaccuracy is more emphasized here is that because of the limiting stages in the LO generator and the hard switching at the mixers LO input, most of the errors will be in phase, rather than amplitude.

Although the phase or amplitude inaccuracy at the mixers input or LO has only a second order effect on the LO generator, any mismatch at the mixers outputs or the following stages will directly cause phase and amplitude imbalance in the LO generator outputs. This mismatch will typically be a few percent, and will not adversely impact the transceiver performance, since in god a low-IF or direct conversion architectures the required image rejection is usually relaxed.

4.0 Controller

Figure 38:
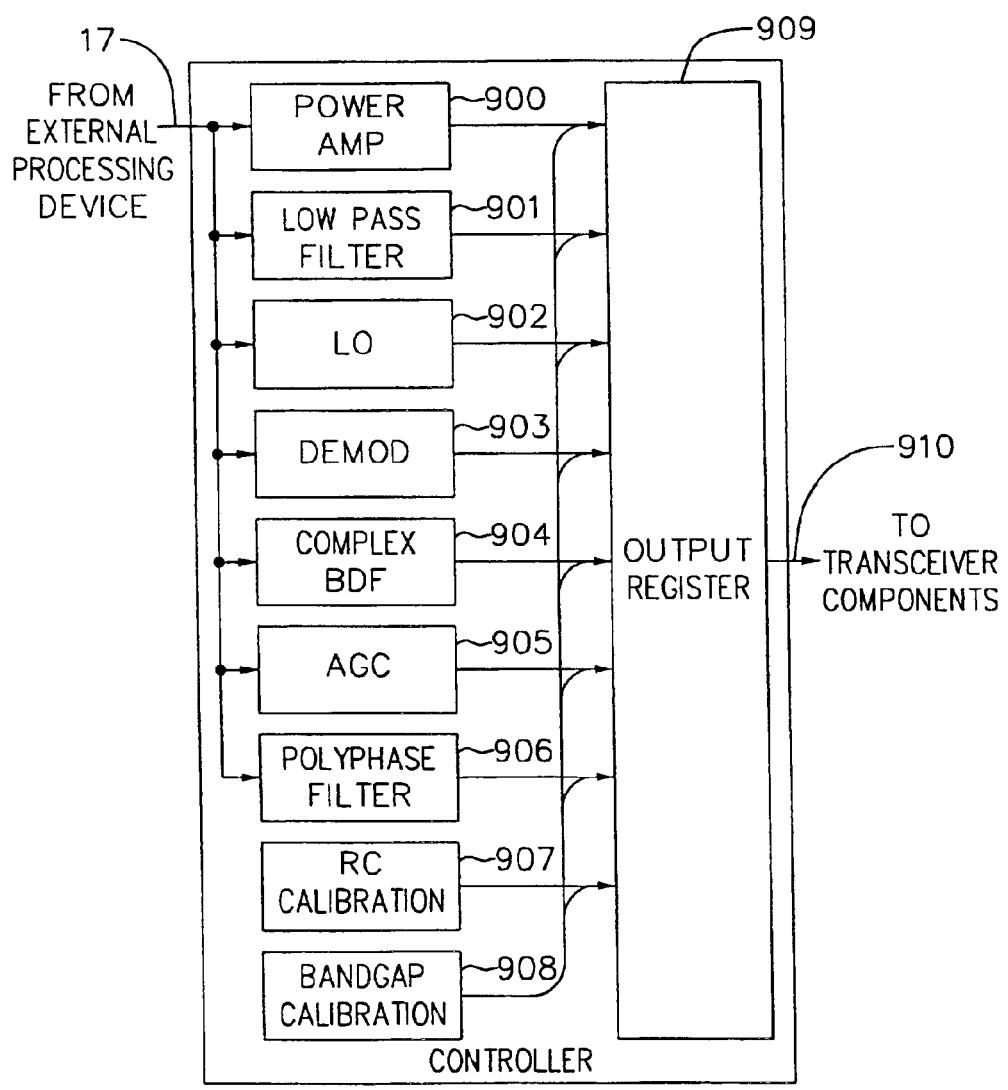
FIG. 38 is a block diagram of a controller in accordance with an exemplary embodiment of the present invention.

The controller performs adaptive programming and calibration of the receiver, transmitter and LO generator (see FIG. 2). An exemplary embodiment of the controller in accordance with one aspect of the present invention is shown in FIG. 38. A control bus 17 provides two way communication between the controller and the external processing device (not shown). This communication link can be used to externally program the transceiver parameters for different modulation schemes, data rates and IF operating frequencies. In the described exemplary embodiment, the external processing device transmits data across the control bus 17 to a bank of addressable registers 900–908 in the controller. Each addressable register 900–908 is configured to latch data for programming one of the components in the transmitter, receiver LO generator. By way of example, the power amplifier register 900 is used to program the gain of the power amplifier 62 in the transmitter (see FIG. 2). The LO register 902 is used to program the IF frequency in the LO generator. The demodulator register 903 is used to program the demodulator for FSK demodulation, or alternatively in the described exemplary embodiment, program the A/D converter to handle different modulation schemes.

The AGC: register 905 programs the gain of the programmable multiple stage amplifier when in the AGC mode. The filter registers 901, 904, 906 program the frequency and bandwidth of their respective filters.

The transmission of data between the external processing device and the controller can take on various forms including, by way of example, a serial data stream parsed into a number of data packets. Each data packet includes programming data for one of the transceiver components accompanied by a register address. Each register 900–908 in the controller is assigned a different address and is configured to latch the programming data in the each data packet where the register address in that data packet matches its assigned address.

The controller also may include various calibration circuits. In the described exemplary embodiment, the controller is equipped with an RC calibration circuit 907 and a bandgap calibration circuit 908. The RC calibration circuit 907 can compensate an integrated circuit transceiver for process, temperature, and power supply variations. The bandgap calibration circuit can be used by the receiver, transmitter, and LO generator to set amplifier gains and voltage swings.

The programming data from the addressable registers 900–908 and the calibration data from the RC calibration circuit 907 and the bandgap calibration circuit 908 are coupled to an output register 909. The output register 909 formats the programmability and calibration data into a data packets. Each data packet includes a header or preamble which addresses the appropriate transceiver component. The data packets are then transmitted serially over a controller bus 910 to their final destination. By way of example, the output register 909 packages the programing data from the power amplifier register 900 with the header or preamble for the power amplifier and outputs the packaged data as the first data packet to the controller bus 910.

The second data packet generated by the output register 909 is for the programmable low pass filter in the transmitter. The second data packet includes two data segments each with its own header or preamble. The first segment consists of both programmability and calibration data. Because the programmability feature requires a large dynamic range as far as programming the programmable low pass filter to handle different frequency bands, and the calibration feature is more of a fine tuning function of the programmable low pass filter once tuned requiring a much smaller dynamic range, a single digital word containing both programming and calibration information can be used with the most significant bits (MSB) having the programming information and the least significant bits (LSB) having the calibration information. To this end, the output register 909 combines the output of the low pass filter register 901 with the output of the RC calibration circuit 907 with the low pass filter register output constituting the MSBs and the RC calibration circuit output constituting the LSBs. A header or preamble is attached to the combined outputs identifying the data packet for RC calibration of the programmable low pass filter in the transmitter. Similarly, the second segment of the second data packet is generated by combining the low pass filter register output (as the MSBs) with the bandgap calibration circuit output (as the LSBs) and attaching a header or preamble identifying the data packets for bandgap calibration of the programmable low pas filter.

The third data packet generated and transmitted by the output register 909 can program the dividers in the LO generator to produce different IF frequencies in response to a frequency-hopping algorithm executed by the external processing device (not shown) to avoid IF frequencies where spurious noise signals are present. By way of example, the external processing device can cause the transceiver to sweep various IF frequencies by transmitting various data sets across the control bus 17 to the LO generator register 902, the complex BFP register 904 and the polyphase filter register 906. Portions of each data set will be loaded into the appropriate registers, packaged accordingly, and coupled to the output register 909. More particularly, the LO generator register 902 will generate the third data packet, the complex BFP register 904 will generate the fifth data packet, and the polyphase register 906 will generate the seventh data packet. These data packets will be delivered to the output register 909 where they can be transmitted to the appropriate transceiver components for programming. For each data set that is programmed into the respective transceiver component, a new IF frequency can be established.

This approach provides a methodology for the external processing device to learn and a optimize its if frequency selection to avoid spurs, harmonics and digital noise. For each IF frequency programmed into the transceiver components, the external processing device can measure the strength of the spurious signals. The external processing device can then make a decision about which IF to use and program the transceiver components to the one with the minimum noise signal strength.

The external processing device can employ a variety of algorithms during the frequency-hopping mode. By way of example, two transceivers in communication with each other is one approach. A first transceiver acts as a master and a second transceiver acts as a slave. The master transceiver receives a slave's response to a previously transmitted signal. The external processing device for the master examines the bit error measurement and subsequently programs the IF to provide the best performance.

The third data packet can be a single segment of data with a header or preamble identifying the LO generator for programming each divider. Alternatively, the third data packet can include any number of data segments with, in one embodiment, different programming data for each divider in the LO generator. Each data segment would include a header or preamble identifying a specific divider in the LO generator.

The fourth data packet generated and transmitted by the output register 909 could include the programming data output from the demodulator register 904 with the appropriate header or preamble.

The output of the complex bandpass filter register 904 can be combined with the output from the RC calibration circuit 907 to form the first segment of the fifth data packet. The output of the complex bandpass filter register 904 can also be combined with the output of the bandgap calibration circuit 908 to form the second segment of the fifth data packet. Each segment can have its own header or preamble indicating the type of calibration data for the complex bandpass filter.

The sixth data packet generated and transmitted by the output register 909 can be the output data from the AGC register 905 accompanied by a header or preamble identifying the data packet for the programmable multiple stage amplifier in the receiver.

The output of the polyphase filter register 906 can be combined with the output from the RC calibration circuit 907 to form the first segment of the seventh data packet. The output of the polyphase filter register 906 can also be combined with the output of the bandgap calibration circuit 908 to form the second segment of the seventh data packet. Each segment can have its own header or preamble indicating the type of calibration data for the polyphase filter.

Finally, the output register 907 can configure additional data packets from the output of the RC calibration circuit 907 and, in separate data packets, the output of the bandgap calibration circuit 908 with appropriate headers or preambles.

As those skilled in the art will appreciate, other data transmission schemes can be used. By way of example, the separate output registers for each transceiver component could be used. In this embodiment, each output register would be directly connected to one or more transceiver components.

4.1 RC Calibration Circuit

RC calibration circuits can provide increased accuracy for improved performance. Embodiments of the present invention that are integrated into a single IC can utilize RC calibration to compensate for process, temperature, and power supply variation. For example, variations in the absolute value of the RC circuit in a complex filter can limit the amount of rejection that the filter can provide. In the described exemplary embodiments of the present invention, an RC calibration circuit in the controller can provide dynamic calibration of every RC circuit by providing a control word to the transmitter, receiver and LO generator.

Figure 39:
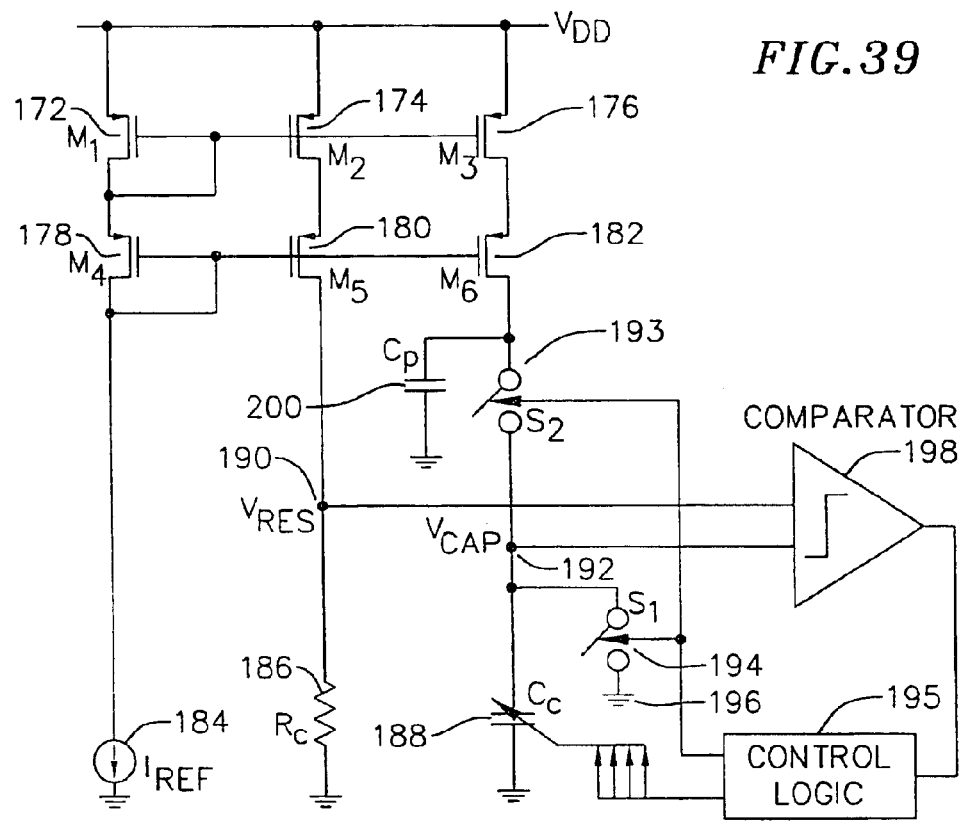
FIG. 39 is an electrical diagram of an RC calibration circuit in accordance with an exemplary embodiment of the present invention.

FIG. 39 shows an exemplary RC calibration circuit in accordance with an embodiment of the present invention. The calibration circuit uses the reference clock from the LO generator to generate a 4-bit control word using a compare-and-increment loop until an optimum value is obtained. The 4-bit control provides an efficient technique for calibrating the RC circuits of the transceiver with a maximum deviation from its optimal value of only 5%.

Transistors 172, 174, 176, 178, 180, 182 form a cascode current source with a reference current $I_{REF}$ 184. With the gates of the transistors 172 and 178 tied to their respective sources, a fixed reference current $I_{REF}$ 184 can be established. By tying the gates of the transistors 174, 180 to the gates of the transistors 172, 178, respectively, the current through resistor $R_C$ 186 can be mirrored to $I_{REF}$ 184. Similarly, by tying the gates of the transistors 176, 182 to the gates of the transistors 174, 180, respectively, the current through resistor $R_C$ 186 can be mirrored to a tunable capacitor $C_C$ 188. The calibration circuit tunes the absolute value of the RC to a desired frequency by using this cascode-current source to provide identical currents to the on-chip reference resistor $R_C$ 186 and to the tunable capacitor $C_C$ 188 generating the voltages $V_{RES}$ 190 and $V_{CAP}$ 192, respectively. Embodiments of the present invention that are integrated into a single IC can use an off-chip reference resistor $R_c$ to obtain greater calibration accuracy. The current through the tunable capacitor is controlled by a logic control block 195 via switch $S_2$ 193. During the charging phase, switch $S_2$ 193 is closed and switch $S_1$ is open to charge the tunable capacitor $C_C$ 188 to $V_{CAP}$. The voltage held on the tunable capacitor 188 $V_{CAP}$ is then compared, using a latched comparator 198, to a voltage generated across the reference resistor 186. The value of the tunable capacitor $C_c$ 188 is incremented in successive steps by the logic control block 195 until the voltage held by the tunable capacitor $C_C$ matches the voltage across the reference resistor 186, at which point the 4-bit control word for optimal calibration of the RC circuits for the transmitter, receiver, and LO generator is obtained. More particularly, once the voltage $V_{CAP}$ reaches the voltage $V_{RES}$, the output of the comparator output 198 switches. The switched comparator output is detected by the control logic 195. The control logic 195 opens switch $S_2$ 193 and closes switch $S_1$ 194 causing the tunable capacitor 188 $C_C$ to discharge. The resultant 4-bit control word is latched by the control logic 195 and coupled to the transceiver, receiver, and LO generator.

$C_p$ 200 compensates for the parasitic capacitance loading of the capacitive branch. By choosing $C_c$ 188 to be much larger than $C_p$ 200, the voltage error at node $V_{CAP}$ 192 caused by charging the parasitic capacitance becomes negligible.

The clock signals used by the calibration circuit are generated by first dividing the reference clock down in frequency, and then converting the result into different phases for the charging, comparison, increment, and discharging phases of calibration. Embodiments of the present invention that are integrated onto a single IC can obtain an accurate RC value because capacitor scaling and matching on the same integrated circuit can be well-controlled with proper layout technique. The described RC calibration circuit provides an RC-tuning range of approximately +40%, which is sufficient to cover the range of process variation typical in semiconductor fabrication.

4.2 RC Calibration Circuit using Polyphase filtering

An RC calibration circuit using polyphase filtering is an alternative method for calibrating RC circuits in the transmitter, receiver, and LO generator. The RC calibration using polyphase filtering circuit includes an auto-calibration algorithm in which the capacitors or the RC circuits in the transceiver, receiver and LO generator can be calibrated with a control word generated by comparing the signal attenuation across two tunable polyphase filters. The calibrated RC value obtained as a result of this algorithm is accurate to within ±5% of its optimal value.

Figure 40:
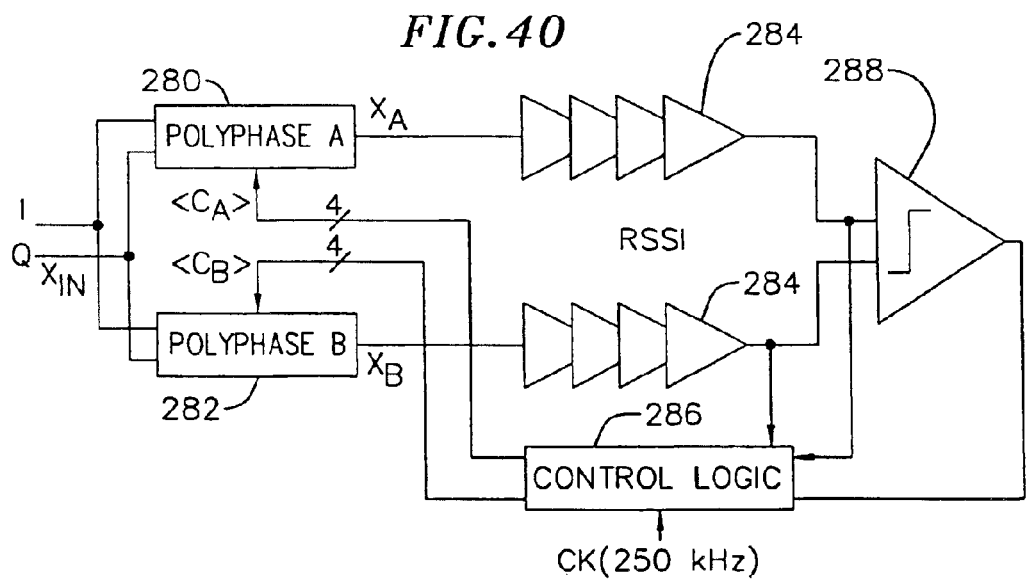
FIG. 40 is a block diagram of an RC calibration circuit using polyphase in accordance with an exemplary embodiment of the present invention.

FIG. 40 shows an exemplary embodiment of the RC calibration circuit using polyphase filtering. The RC calibration circuit uses the reference clock from the LO generator to adjust the RC value in two polyphase filters 280, 282 in successive steps until an optimum value has been selected. In this process, the two polyphase filters 280, 282 provide signal rejection that is dependent upon the value of $\omega=(RC)^{-1}$ to which they are tuned by control logic 286. Initially, the first filter (Polyphase A) 280 is tuned to a frequency less than the frequency of the reference clock (reference frequency), and the second filter (Polyphase B) 282 is tuned to a frequency greater than the reference frequency by control logic 286. The signals at the outputs of the polyphase filters are detected with a received-signal-strength indicator (RSSI) block 284, 285 in each path. A filter is coupled to RSSI block 284 and the polyphase B filter is coupled to RSSI block 285.

With an input dynamic range of 50 dB, the RSSI circuit is designed to detect the levels of rejection provided by the polyphase filtering. The outputs of RSSI block 284 and RSSI block 285 are coupled to a comparator 280 where the level of signal rejection of each polyphase filter is compared by comparator 280. The outputs of the RSSI blocks are also coupled to the control logic 286. The control logic 286 determines from the RSSI outputs which polyphase filter has a lower amount of signal suppression. Then, the control logic 286 adjusts the frequency tuning of that filter in an incremental step via the control logic 286. This is done by either increasing the tuned frequency of the first filter (polyphase A) filter 280, or by decreasing the tuned frequency of the second filter (polyphase B) 282 by changing the appropriate 4-bit control word. This process continues in successive steps until the 4-bit control word in each branch are identical, at which point, the RC values of the two polyphase filters are equal. This results in a change of state of the comparator 288 output. The change in state of the comparator output disables the control logic 286 locking up the 4-bit control word for optimum calibration of the RC circuits in the transmitter, receiver and LO generator. The 4-bit control word provides a maximum deviation of only ±5%.

In the described exemplary embodiment, the frequency of the input signal $X_{IN}$ is derived from the reference frequency and is chosen to be, by way of example, 2 MHz. This input signal $X_{IN}$ is obtained by initially dividing the reference clock down in frequency, followed by a conversion into quadrature phases at the control logic 286. By dividing the reference clock by a factor greater than two with digital flip-flops (not shown), the input signal at $X_{IN}$ is known to be differential with well-defined quadrature phases.

Two branches of polyphase filtering are used in this algorithm. Two 4-bit control words are used to control the value of the capacitances in each polyphase filter. The initial control words set the capacitance in the first filter (Polyphase A) to its maximum value and the capacitance in the second filter (Polyphase B) to its minimum value. This provides an initial condition in which the filters have maximum signal suppression set at frequencies ($\omega_{low}$ and $\omega_{high}$) that are approximately ±40% of the frequency of the input signal $X_{IN}$ for the case of nominal process variation. For a sinusoidal input $X_{IN}$, the calibration circuit depicted in FIG. 40 would require only a single-stage polyphase filter in each branch. The single-stage filters would attenuate the sinusoid input signal, generating outputs at $X_A$ and $X_B$ with the dominant one still at the same frequency as the input signal. However, the reference clock from the LO generator is a digital rail-to-rail clock. Because the input is not a pure sinusoid, multiple-stage filters may provide greater calibration accuracy. In the case of a single-stage filter with a digital clock, the filter would suppress the fundamental frequency component at $\omega_{in}$ to a significant degree but the harmonics would pass through relatively unaffected. The RSSI block would then detect and limit the third harmonic component of the input signal at $3\omega_{in}$, as it becomes the dominant frequency component after the fundamental is suppressed. This could result in an inaccurate calibration code.

A three-stage polyphase filter can be used in each branch to suppress the fundamental frequency component of $X_{IN}$ as well as the 3rd and 5th harmonics. The first stage of the polyphase filter can provide rejection of the fundamental frequency component. The second stage can provide rejection of the 3rd harmonic. The third stage can provide rejection of the 5th harmonic. At the same time, the higher harmonics of the input signal $X_{IN}$ can be suppressed with an RC lowpass filter in a buffer (not shown) preceding the polyphase filters. As a result, the dominant frequency component of the signals $X_A$ and $X_B$ remains at the input frequency $\omega_{in}$, which is then properly detected by the RSSI blocks.

A calibration clock used for the control logic runs at a frequency of 250 kHz. The reference clock can be divided down inside the controller, or alternatively in the control logic. This clock frequency has been selected to allow the RSSI outputs to settle after the capacitance value in one of the polyphase filters has been incremented or decremented. For a clock frequency of 250 kHz and a 4-bit control word generating $2^4$ possible capacitance values, the calibration is completed within $(250 \text{ kHz})^{-1}(2^4-1)=60$ $\mu$s. During the calibration process the calibration circuitry draws 4 mA from a 3-V supply, and the RC calibration circuitry can be powered down when the optimal RC value has been selected to reduce power consumption.

4.3 The Capacitor Array

In the transmitter, receiver and LO generator, metal-insulator-metal (MIM) capacitors can be used as the calibration component for the RC circuits. As those skilled in the art will appreciate, other capacitor technologies may be used. The MIM capacitors are generally characterized by a low bottom-plate parasitic capacitance to substrate of 1%.

Figure 41:
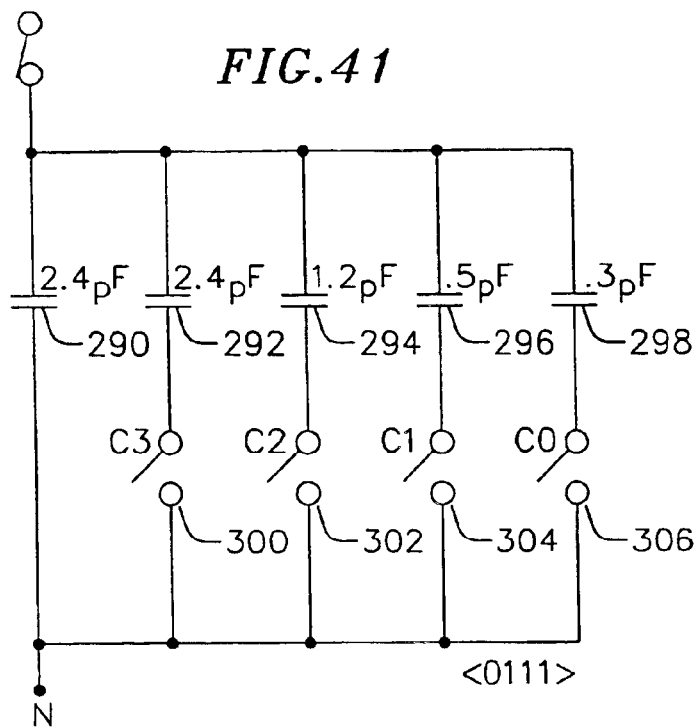
FIG. 41 is an electrical diagram of a capacitor array in accordance with an exemplary embodiment of the present invention.

A parallel capacitor array can be used in calibrating each RC circuit as shown in FIG. 41. The parallel array is much smaller in area than a series array for the same capacitor value.

Complementary MOS switches or other switches known in the art, can be used in the capacitor array. The capacitor array can include any number of capacitors. In the exemplary embodiment, the capacitor array capacitors 290, 292, 294, 296, 298 are connected in parallel. Switches 300, 302, 304, 306 are used to switch the capacitors 292, 294, 296, 298, respectively, in and out of the capacitor array. In the described embodiment, capacitor 290 is 2.4 pF, capacitor 292 is 2.4 pF, capacitor 294 is 1.2 pF, capacitor 296 is 0.6 pF, capacitor 298 is 0.3 pF. The switch positions are nominally selected to produce an equivalent capacitance equal to 4.8 pF. A code of "0111" means that capacitors 294, 296, 298 are switched out of the capacitor array and capacitors 290, 292 are in parallel.

The switches can be binary-weighted in size and the switch sizes can be chosen according to tradeoffs regarding parasitic capacitances and frequency limitations based on the on-resistance of the CMOS switches. The capacitive error resulting from the parasitic capacitance in each capacitive array does not result in frequency error between the three polyphase stages of the RC calibration circuit in the controller. This is because by using same capacitor array in each filter, and by scaling the resistance accordingly in each case. Scaling resistances, relative to those in the fundamental polyphase filter, by factors of 1/3 and 1/5 in the $3^{rd}$ and $5^{th}$ harmonic filters respectively, are achieved with a high degree of accuracy with proper layout. Similarly, RC timing in all other blocks utilizing the calibrated code is optimized when an identical capacitive array is used, scaling only the resistance value in tuning to the desired frequency. The capacitors in the capacitive arrays are laid out in 100 fF increments to improve the matching and parasitic fringing effects.

4.4 Bandgap Calibration Circuit for Accurate Bandgap Reference Current

In accordance with an exemplary embodiment of the present invention, a bandgap reference current is generated by a bandgap calibration circuit. The bandgap reference current is used by the receiver, transmitter, and LO generator to set amplifier gains and voltage swings. The bandgap calibration circuit generates an accurate voltage and resistance. An accurate bandgap reference current results from dividing the accurate voltage by the an accurate resistance.

Bandgap calibration circuits can provide increased accuracy for improved performance. Embodiments of the present invention that are integrated onto a single IC can utilize bandgap calibration circuits to compensate for process, temperature, and power supply variations. For example, variations in the absolute value of the resistance in a bandgap reference may result in deviations from optimal performance in sensitive circuitry that rely on accurate biasing conditions. In the described exemplary embodiment of the transceiver, a bandgap calibration circuit in the controller 16 provides an effective technique for self calibration of resistance values in the transmitter, receiver and LO generator. The calibrated resistance values obtained as a result of the algorithm employed in the bandgap calibration circuit generate a bias current that varies by only +2% over typical process, temperature, and supply variation.

Embodiments of the present invention which are integrated into a single IC can use the described bandgap calibration circuit to provide accurate on-chip resistors by comparing the on-chip resistances to an off-chip reference resistor with a low tolerance of 1%. Using this method, trimming of on-chip resistance values with a total tolerance of 2% can be achieved.

Figure 42:
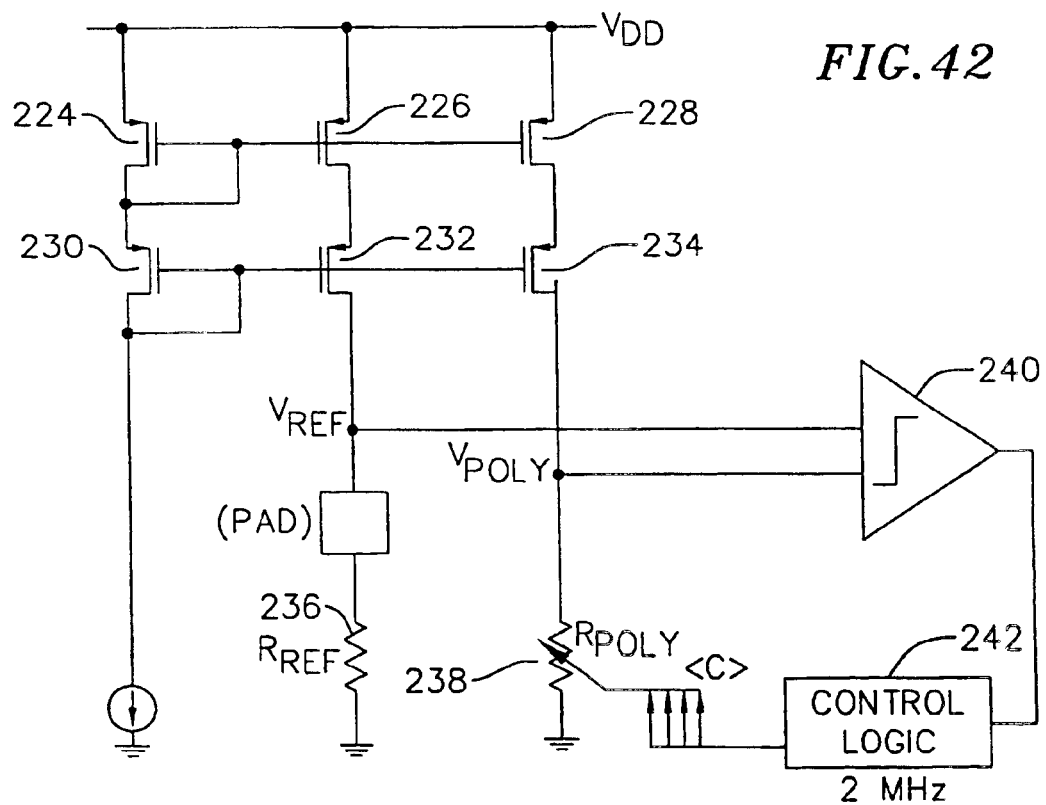
FIG. 42 is an electrical diagram of a bandgap calibration circuit in accordance with an exemplary embodiment of the present invention.

FIG. 42 shows an exemplary embodiment of the bandgap calibration circuit. The bandgap calibration circuit uses the reference clock provided from the LO generator and a reference resistor $R_{REF}$ 236 to adjust a tunable resistance value $R_{POLY}$ 238 in a compare-and-increment loop until an optimum value is obtained. In embodiments of the present invention which are integrated into a single IC, the reference resistor $R_{REF}$ 236 can be off-chip to provide improved calibration accuracy. A 4-bit control word is output to accurately calibrate the resistors in the transmitter, receiver and LO generator within ±2%. Transistors 227, 226, 228, 230, 232, 234 form a cascode current with a reference current $I_{REF}$. The transistors 224, 230 each have their gates tied to their respective sources to set up the reference current $I_{REF}$. By tying the gates of the transistors 224, 230, respectively to the gates of the transistors 226, 232, the reference current $I_{REF}$ is mirrored to the reference resistor $R_{REF236}$. Similarly, by tying the gates of the transistors 228, 234, respectively to the gates of the transistors, the reference current $I_{REF}$ is also mirrored to the tunable resistor $R_{POLY}$ 238. The voltage generated across the tunable resistor $R_{POLY}$ 238 is compared, using a latched comparator 240, to the voltage generated across the reference resistor $R_{REF}$ 236. The value of the tunable resistor $R_{POLY}$ 236 is incremented in successive steps, preferably, every 0.5 μs, through the utilization of control logic 242 that is clocked, by way of example, at 2 MHz. This process continues until the voltage $V_{POLY}$ across the tunable resistor $R_{POLY}$ 238 matches the voltage $V_{REF}$ across the off-chip reference resistor $R_{REF}$ 236 causing the output of the comparator to change states and disable the control logic 242. Once the control logic is disabled, the 4-bit control word can be used to accurately calibrate the resistors in the transmitter, receiver and LO generator.

The clock signals used by the calibration circuit are generated by first dividing the reference clock input into the controller from the LO generator down in frequency, and then converting the result into different phases for the comparison and increment phases of calibration. This bandgap calibration circuit provides accurate resistance values for use in various on-chip circuit implementations because resistor scaling and matching on the same integrated circuit can be well controlled with proper layout techniques. The bandgap calibration circuit provides a resistor tuning range of approximately +30%, which is sufficient to cover the range of press variation typical in semiconductor fabrication. With a 4-bit control word generating 24 possible resistance values, the calibration is completed within (2 MHz)−1(24−1)=7.5 ms. The calibration circuit can be powered down when the optimal resistance value has been obtained.

Figure 43:
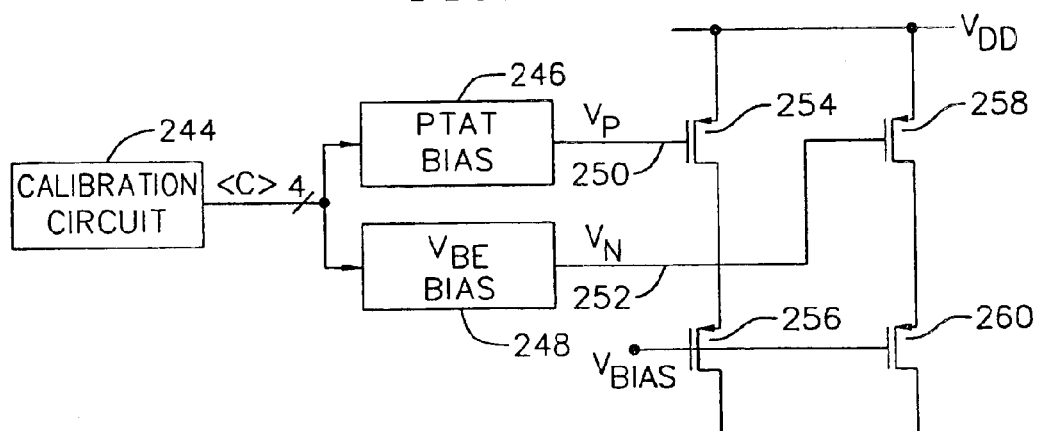
FIG. 43 is a block diagram of bandgap circuit in accordance with an exemplary embodiment of the present invention.

The bandgap calibration circuit can be used for numerous applications. By way of example, FIG. 43 shows a bandgap calibration circuit 244 used in an application for calibrating a bandgap reference current that is independent of temperature. The 4-bit control word from the bandgap calibration circuit is coupled, byway of illustration, to the receiver. The 4-bit control word is used to calibrate resistances in a proportional-to-absolute-temperature (PTAT) bias circuit 246, and also in a $V_{BE}$ (negative temperature coefficient) bias circuit 248. The outputs of these blocks are two bias voltages, $V_p$ 250 and $V_N$ 252 that generate currents exhibiting a positive temperature coefficient, and a negative temperature coefficient, respectively. When these currents are summed together using the cascode current mirror formed by transistors 254, 256, 258, 260, the result is a current $I_{OUT}$ displays a (ideally) zero temperature coefficient.

4.5 Resistor Array

Figure 44:
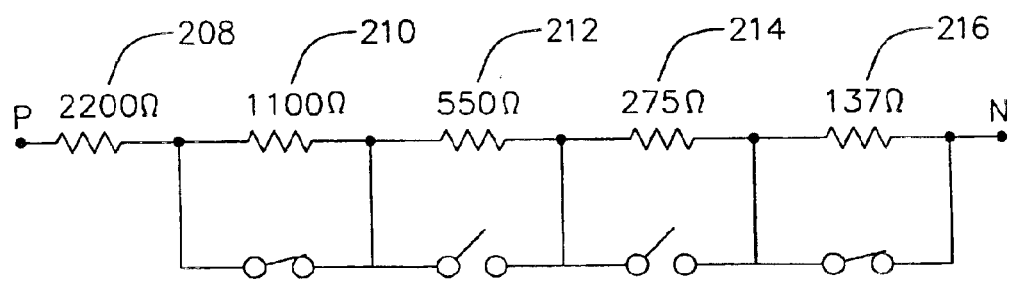
FIG. 44 is a electrical diagram of a resistor array in accordance with an exemplary embodiment of the present invention.

In the transmitter, receiver and LO generator non-silicided polysilicon resistors can be used As those skilled in the art will appreciate, other resistor technologies can also be used. Non-silicided polysilicon resistors have a high sheet resistance of 200-Ω/square along with desirable matching properties. A switching resistor array as shown in FIG. 44 can be used to calibrate a resistor. The array includes serial connected resistors 208, 210, 212, 214, 216, which, byway of example, have resistances of 2200 Ω, 1100 Ω, 550 Ω, 275 Ω, and 137 Ω, respectively. The resistors 210, 212, 214, 216 include a bypass switch for switching the resistors in and out of the array. The switch positions are nominally selected to produce an equivalent of 3025 Ω. This resistance value has been chosen as a convenience to match the value used in generating an accurate bandgap reference current. A 4-bit calibration code 206 is used to control the total resistance in this array. As seen in FIG. 44, the resistances are binary-weighted in value and the accurate scaling of each incremental resistance results by placing the largest resistor (2200 Ω) 208 in series to generate each value. In the described embodiment, the incremental resistances shown in FIG. 44 are chosen so that the total resistance in the array covers a range 30% above and below its nominal value, with a maximum resistance error of +2% determined by the incremental resistance switched by the LSB. The range of resistance covered by the array is sufficient to cover typical process variations in a semiconductor process. A series resistive array maybe desirable opposed to a parallel resistive array because of the smaller area occupied on the wafer.

CMOS switches are one of several different types of switch technology that can be used. The sizing of the switches entails a tradeoff between the on-resistance of each switch and the frequency limitations that result from the parasitic capacitances associated with each switch. For calibration resistors in the bandgap reference circuits, large switches are used to minimize the effect of the on-resistance of each switch, as frequency limitations are not a concern for this application 5.0 Floating MOSFET Capacitors Embodiments of the present invention that are integrated into a single IC can be implemented with a variety of technologies including, by way of example, CMOS technology. Heretofore, CMOS capacitors between two nodes with similar voltages (i.e., floating capacitors) have been problematic. In the described exemplary embodiment of the present invention, a MOS capacitor is used between two nodes having similar voltages for signals with no DC information. The capacitor is made of two MOS capacitors in series with a large resistor in between to ground for biasing.

Figure 45:
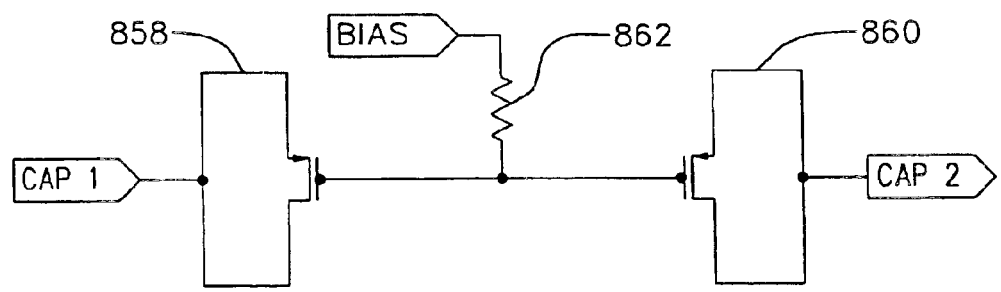
FIG. 45 is a block diagram of a floating MOS capacitor in accordance with an exemplary embodiment of the present invention.

FIG. 45 is a block diagram of the Floating MOS capacitor in accordance with an embodiment of the present invention. As shown in FIG. 45, the capacitor comprises two similar devices 858, 860 in series. Each MOS transistor has its source and drain connected together. The connected drain-source terminal of the MOS transistor 858 constitutes the input of the CMOS capacitor and the connected drain-source terminal of the MOS transistor 860 constitutes the output of the CMOS capacitor. The gates of each MOS transistor are connected through a common resistor 862 to a bias source (not shown).

6.0 Duplexing

In an alternative embodiment of the present invention, an integrated matching circuit can be used to connect the LNA m the receiver to the PA in the transmitter. As the level of integration in radio communication circuits tend to grow, more functions are embodied on the same chip and off-chip components are used less than ever. Presence of external components not only augments the manufacturing costs, but also increases the pin count on the main chip. The antenna switch is an example of such components. This switch is used to connect the receiver to antenna in reception mode and the transmitter to antenna in transmission mode. In the described exemplary embodiment of the present invention, the antenna switch can be eliminated, and the input of the receiver can be tied to the output of the transmitter. This approach has various applications including, but not limited to, single chip integration.

Figure 46:
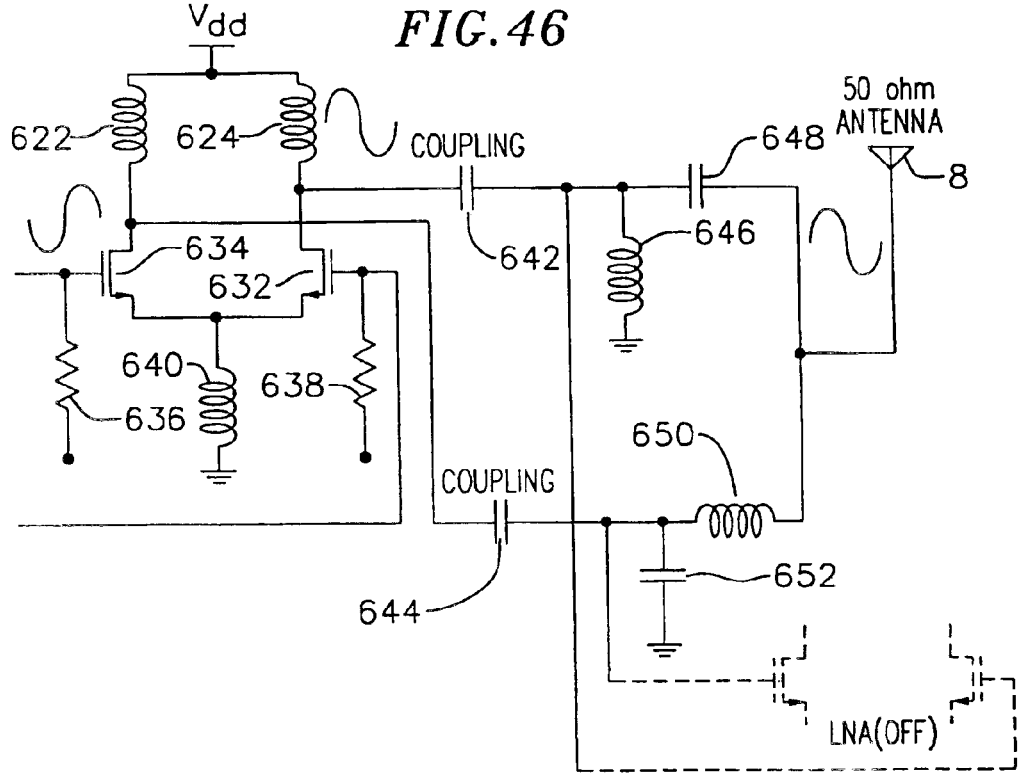
FIG. 46 is an electrical diagram of a duplexing circuit with the power amplifier on and the low noise amplifier off in accordance with an exemplary embodiment of the present invention.
Figure 47:
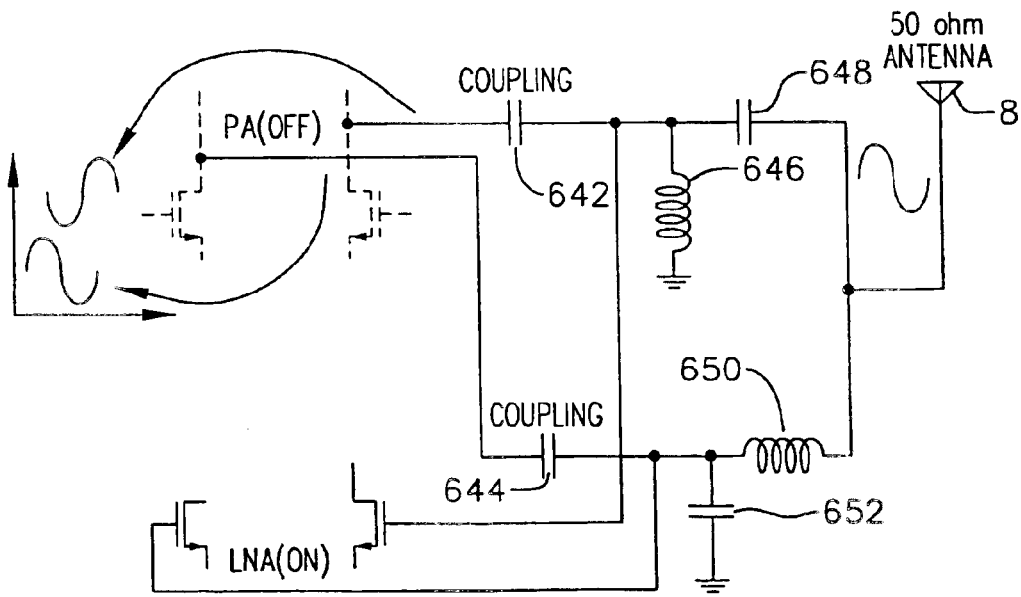
FIG. 47 is an electrical diagram of a duplexing circuit with the low noise amplifier on and the power amplifier off in accordance with an exemplary embodiment of the present invention.

Since the antenna is usually single-ended, differential applications generally require a mechanism to convert the antenna signal from single-ended to differential for connection to the differential low noise amplifier (LNA) or the differential PA. The circuit implementation for a single-ended to differential LNA is shown in FIGS. 46 and 47. LC circuit, 646, 648 and the CL circuit 652, 650 matches the PA to the antenna when the PA is on and the LNA is off (as shown in FIG. 46), and matches the LNA to the antenna when the LNA is on and the PA is off(as shown in FIG. 47). Since the LNA is off and it only introduces a capacitive loading to the PA. The matching circuit can be designed to compensate for this additional capacitance.

In operation, during the transmit mode, a differential voltage across the drains of the PA transistors 634, 632 is generated. The two drains assert 180 degree out of phase voltages and they are combined through the LC and CL matching circuits to yield a single-ended voltage at the output. The LC circuit shifts the phase of the output signal from the transistor 634 by 90 degrees. The CL circuit shifts the phase of the signal output from the transistor 632 by 90 degrees in the opposite direction. Consequently, both signals are in-phase when combined at the output of the matching circuits.

7.0 An Integrated Circuit Transceiver

As those skilled in the art will appreciate, the exemplary embodiments described thus far can be integrated into a singe IC, implemented with discrete hardware components, or be any combination of the two. However, due to the high cost, size and power consumption of currently available transceivers, embodiments of the present invention incorporated into a single integrated circuit provides an economically viable approach. For these integrated circuit applications, a number of techniques can be employed to suppress noise coupling.

Figure 48A:
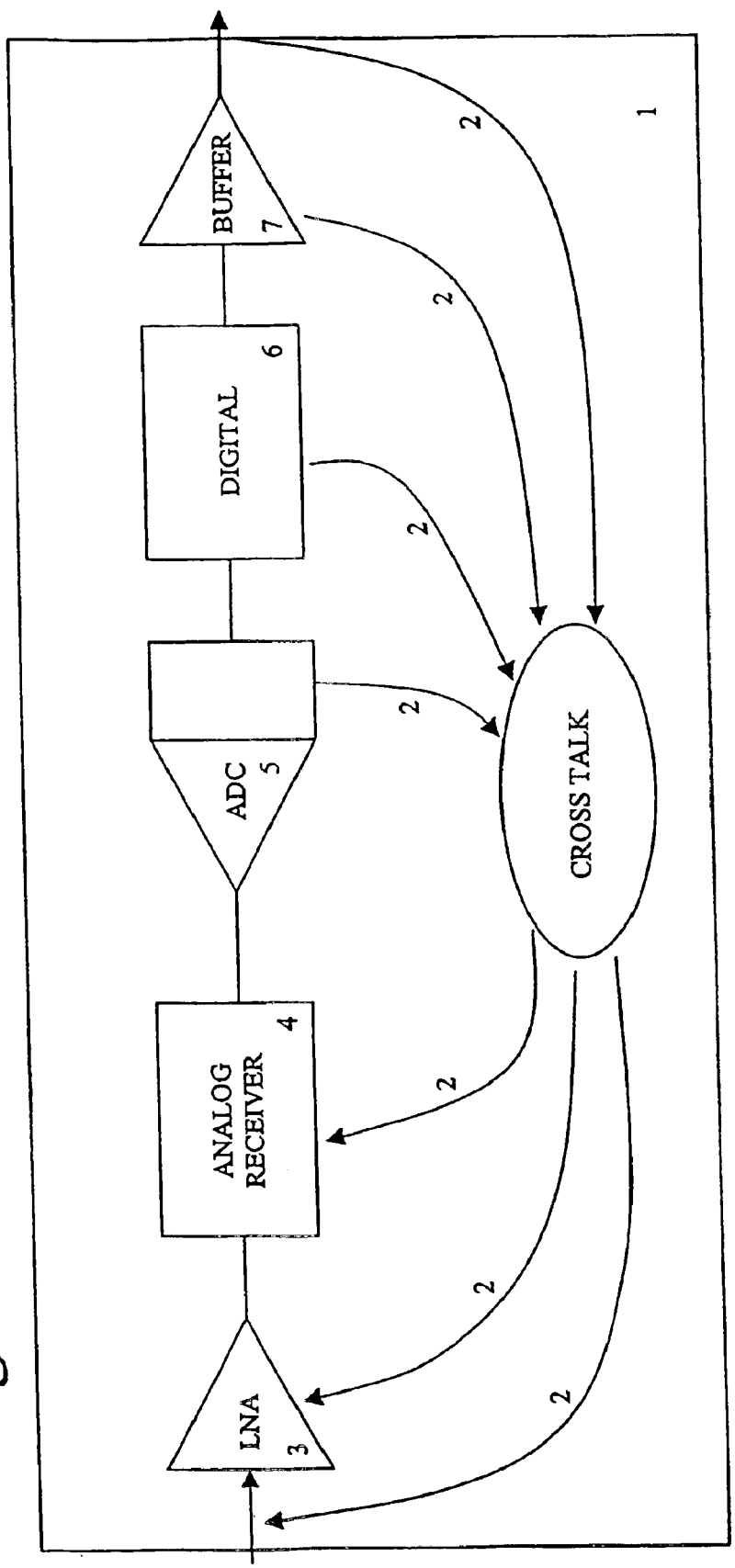
FIG. 48a is a block diagram illustrating typical noise coupling paths present on integrated circuit substrate incorporating digital, analog and RF circuitry.

FIG. 48a is a block diagram illustrating typical noise coupling paths 2 present on integrated circuit substrate 1 incorporating digital, analog and RF circuitry. A single chip 1 integration of analog 5 digital 6 and radio frequency 3, 4 functions on a single integrated circuit 1 is desirable in applications such as a fully integrated transceiver circuit. In the fully integrated embodiments of the present invention, a silicon substrate 1 includes an integrated transceiver (as shown in FIG. 1a) typically incorporating circuit functions 3,4,5,6,7 shown in FIG. 48a. Circuit functions are often classified according to the types of signals present in performing a given function. A transceiver typically processes and generates digital, analog and radio frequency signals. As shown in FIG. 48a, radiation and conduction mechanisms 2 tend to create a cross-talk coupling mechanism that allows unwanted signals to be injected at various undesired locations on the integrated circuit 1. It is desirable to utilize a method of integrated circuit construction that tends to eliminate cross-talk and the coupling paths associated with it.

Circuit design techniques that tend to reduce noise coupling include separating the power supply and ground circuits associated with various functional blocks of the integrated circuit, use of a guard ring, including dedicated ground pins that isolate circuit blocks from each other, and the use of differential circuits throughout the chip to increase noise rejection throughout the integrated circuit. Implementation of these methods is achieved by utilizing circuit design techniques known to those skilled in the art. Additional techniques that are the subject of this patent application may be utilized alone or in conjunction with the above-mentioned techniques in order to produce an integrated circuit that tends to have reduced noise and cross-coupling.

Three types of noise tend to contribute to the cross-coupling related noise and distortion present on an integrated circuit. The first type of noise includes periodic signals generated by a clock circuit, such as a crystal oscillator, local oscillator, ADC, DAC, or digital circuitry clocks. The second type of noise signal includes non-periodic signals that tend to be caused by data being transmitted at low frequencies and is generated by the introduction of indirect noise. The third type of noise signal is spurious noise, which tends to be generated by clock signals, including local oscillators, and tends to be located at the same frequency as the clock signal and at the harmonics of that clock signal.

A spurious noise signal tends to occur in a narrow bandwidth, and possesses a high amplitude. Spurious noise signals tend to be consistently positioned at one or more frequencies, thus making their location predictable. Non-periodic noise signals, generated by data, tend to occur over a broader bandwidth and thus tend to be harder to predict. Indirect noise tends to occur when multiple periodic signals are coupled to a non-linear system. Periodic signals tend to intermodulate causing this intermodulation distortion to interfere with the desired frequency of operation.

Frequency planning is a method utilized to minimize spurious noise generation. Careful selection of digital clock frequencies and intermediate frequencies in an RF circuit tend to reduce spurious noise generation in a desired frequency range. An embodiment of this method includes choosing an intermediate frequency in a radio frequency circuit that is lower than the digital clock frequency present. In an alternate embodiment, the digital clock frequency is set higher than the IF frequency. Utilization of this method tends to ensure that the digital clock signal and its associated harmonics are at a higher frequency than the intermediate frequency preventing the generation of spurious noise through mechanisms known to those skilled in the art.

A fully balanced circuit architecture utilizing common mode averaging is another method that tends to minimize spurious noise generation. Periodic clock signals having a large voltage swing, and non-periodic digital data tend to generate spurious noise. A method of reducing spurious noise generated by these signals includes elimination or reduction of sharp current spikes, caused by these signals, from reaching power supply and ground circuitry. By combining a differential circuit architecture with circuitry providing a common mode averaging, spurious noise generated by large swing periodic clocks and non-periodic digital data tends to be reduced. Differential architectures are effective at frequencies where phase relation between a plus and a minus input that comprise a differential input is maintained at 180°. A phase difference that varies negligibly from 180° at a fundamental frequency is magnified at one or more harmonic frequencies in relation to a harmonic index, or order. Thus, the harmonic signals generated are often no longer differential in nature. A circuit having a differential architecture and common mode averaging circuitry tends to reduce these non-differential harmonic effects.

Figure 48B:
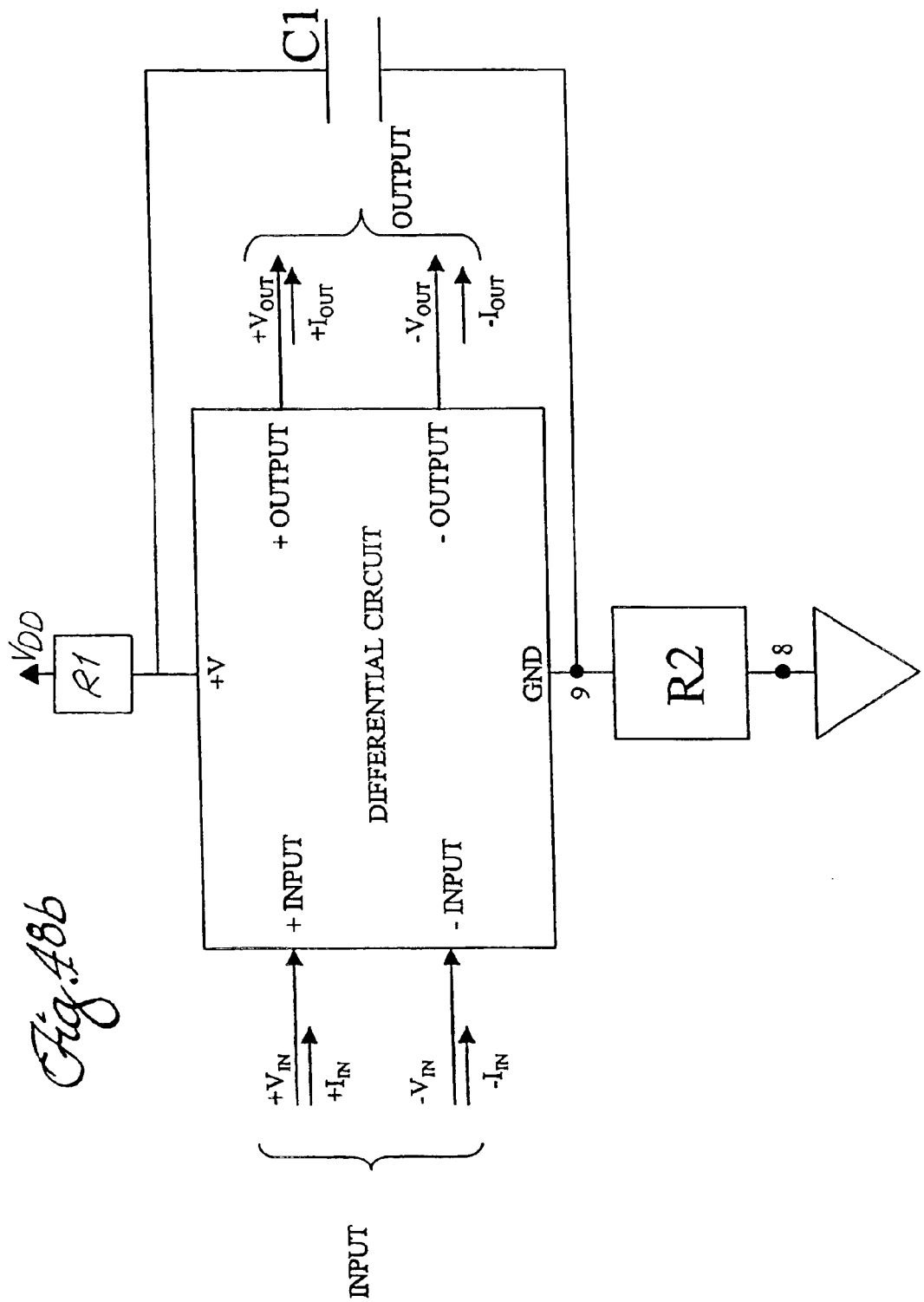
FIG. 48b is a block diagram of a fully balanced circuit utilizing common mode averaging.

FIG. 48b is a block diagram of a fully balanced circuit utilizing common mode averaging. A circuit incorporating noise rejection mechanisms as shown includes two identical logic gates connected to the power supply $V_{DD}$ and ground through two resistors R1 and R2. In this circuit configuration, a conventionally constructed differential circuit is coupled between a power supply $V_{DD}$ and ground.

The differential circuit is conventionally constructed and includes a plus input and a minus input, including signals of substantially equal amplitudes and substantially 180° out of phase relation from each other. The +INPUT signal comprises a voltage $+V_{IN}$ and a positive current $+I_{IN}$. The −INPUT includes a negative voltage $-V_{IN}$ and a negative current $-I_{IN}$. The differential output, OUTPUT, includes a positive output +OUTPUT and a negative output −OUTPUT. The +OUTPUT signal includes a positive output voltage $+V_{OUT}$ and a positive output current $+I_{OUT}$. The −OUTPUT includes a negative voltage $-V_{OUT}$ and a negative output current $-I_{OUT}$.

The differential circuit includes a positive voltage terminal +V and a ground terminal GND indicated by node 9. Resistor R1 is coupled from the +V terminal of the differential circuit to the supply voltage $V_{DD}$. A second resistor R2 is coupled from the ground terminal GND of the differential circuit indicated by node 9 to a ground connection as indicated at node 8. A capacitor C1 is coupled across the differential circuit from the differential circuit terminals +V to GND.

Capacitor C1 is an averaging capacitor selected such that during an input transition at the plus and minus input terminals, the charge will circulate through the capacitor (charge swapping), and not pull the voltages of the power supply and ground rails. The averaging capacitor is charged such that its voltage is maintained at $V_{DD}$ and it thus acts as a battery that maintains a fixed voltage difference between the plus output and the minus output terminals.

During the charge swapping described in the previous paragraph, charge lost from capacitor C1 is compensated for through a recharging mechanism. Recharge of capacitor C1 is controlled by the time constant for the circuit. The time constant is T=(R1)×(R2)×(C1). In the embodiment shown, resistor R2 is equal in value to R1. In alternative embodiments, resistors of different values maybe utilized. Resistors R1, R2 and capacitor C1 are chosen such that the time constant, T, of these components is an order of magnitude smaller than half a period of any clock or data signal having a period t (t/2>(R1×R2×C1)).

By utilizing the fully balanced architecture with common mode averaging, movement in the voltage level of the power supply and reference ground is minimized by using capacitor C1 for charge storage. Upon transition of circuit state, charge is drawn from capacitor C1 rather than instantaneously drawing charge from the supply voltage rail and dumping it to ground.

Figure 48C:
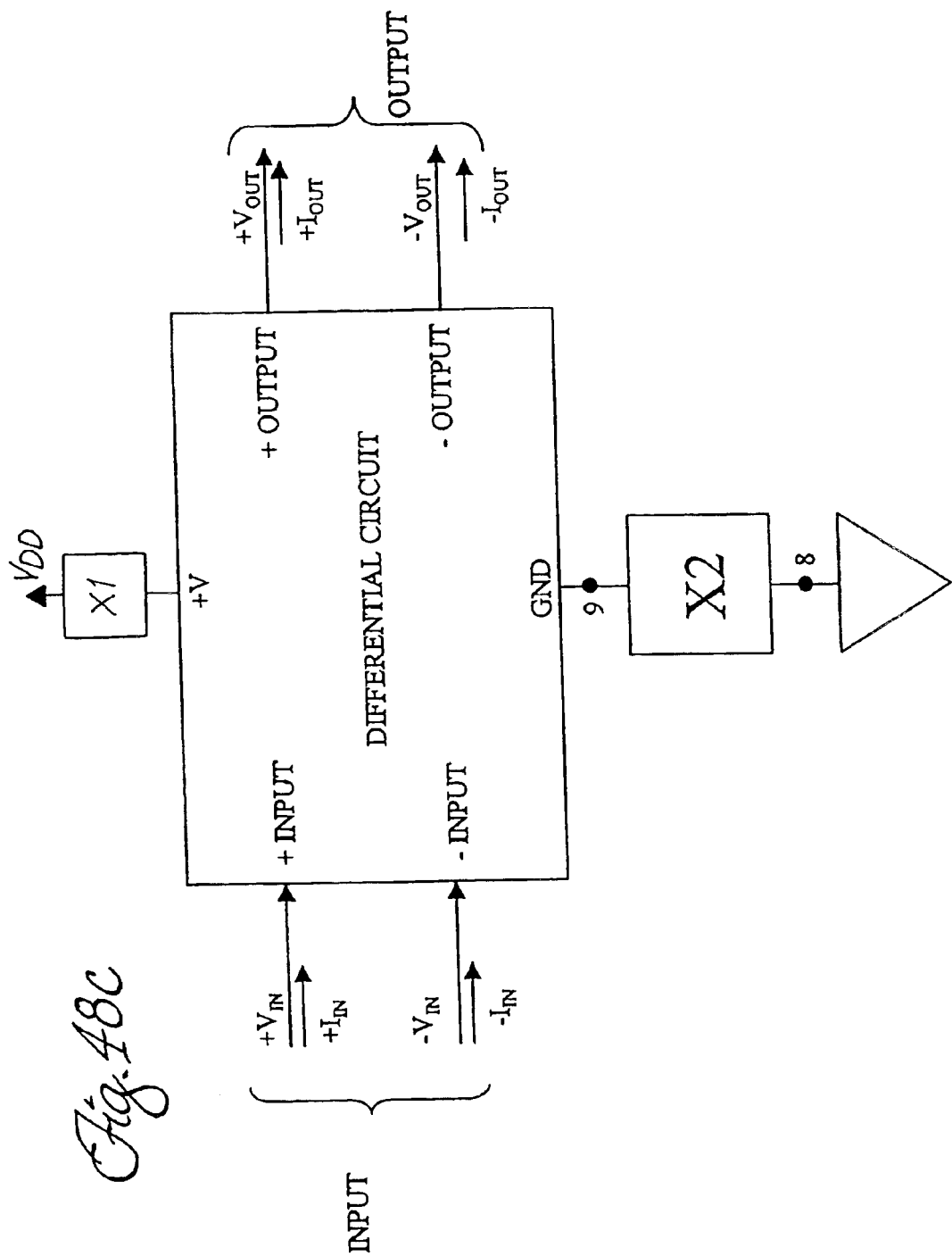
FIG. 48c and 48d are block diagrams of a fully balanced circuit having a common mode inductive load.
Figure 48D:
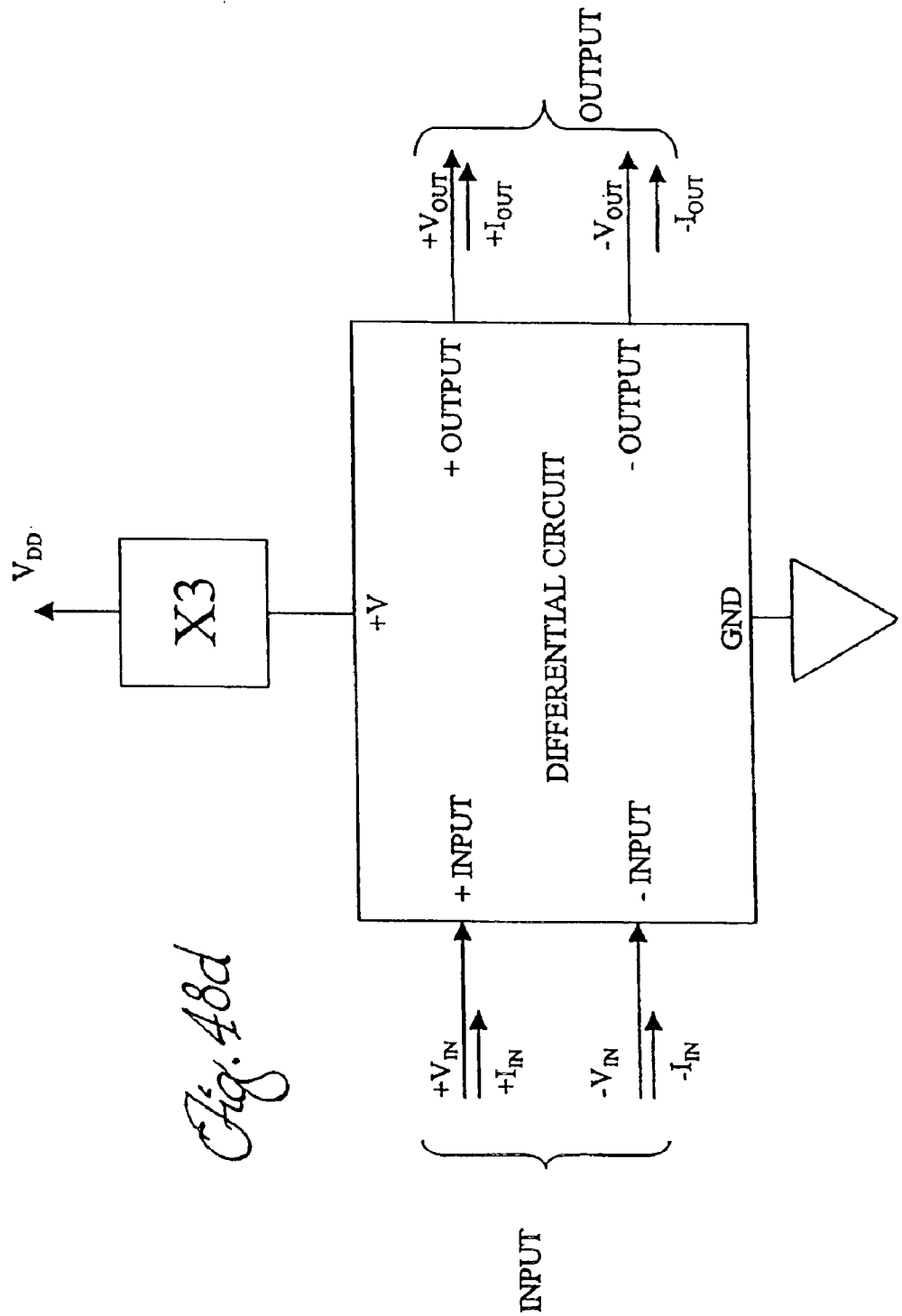

FIGS. 48c and 48d are block diagrams of a fully balanced circuit having a common mode inductive load. High frequency noise is generated typically in an RF local oscillator or from other high amplitude RF signals. Noise from these RF sources tends to be reduced by utilizing a differential circuit as shown in FIGS. 48c and 48d coupled to one or more power supplies through a common mode inductor.

The impedance of the added common mode inductor tends to isolate RF local oscillator (LO) injection into the differential circuit through the power supply. Utilization of the inductors in the power supply and ground leads provides a symmetric circuit that tends to eliminate common mode RF signals from being capacitively coupled to one or more previous circuit stages. Elimination of common mode RF signals is desirable to prevent their mixing with other RF signals that tend to be present. Mixing occurs between the spurious RF signals, and desired signals, that are present in non-linear devices such as mixers.

In FIG. 48c, a conventionally constructed differential circuit, as previously described, is coupled between a power supply $V_{DD}$ and ground. Reactances X1 and X2 are provided in the embodiment shown by inductors. In alternative embodiments, reactances X1 and X2 are provided by resistors. A positive voltage terminal of the differential circuit +V, is coupled to a first terminal of reactance X1. The second terminal of reactance X1 is coupled to power supply $V_{DD}$. The ground terminal of the differential circuit is defined as node 9 and is coupled to a first terminal of reactance X2. A second terminal reactance X2 is coupled to ground at node 8.

FIG. 48d is a block diagram of an alternative embodiment of a fully balanced architecture with a common mode inductive load. In the embodiment shown, a single inductive reactance X3 is utilized to improve common mode rejection. A conventionally constructed differential circuit, as previously described, is coupled between power supply $V_{DD}$ and ground. The input voltage terminal +V of the differential circuit is coupled to a first terminal of reactance X3. A second terminal of reactance X3 is coupled to the supply voltage $V_{DD}$. Ground terminal GND of the differential circuit is coupled to ground.

Design techniques that slow the transition edges of digital signals while changing state tends to reduce distortion present in the circuit. This technique is useful in all digital circuits, and especially in digital I/O buffers. Slowing transition edges is achieved by damping the rate at which capacitors associated with the circuitry are charged or discharged. Slowing the rise time of the digital signals and clocks reduces the number of harmonic related spurs that would otherwise tend to be coupled to the substrate or power supply. The method described of slowing transition edges applies to both periodic and non-periodic signals.

The reduction of noise generation, as previously described, tends to make the integrated circuit more immune to the pick-up of noise signals. A second family of techniques involves reducing the sensitivity of analog and RF circuitry to spurious noise.

Returning to FIGS. 48c and 48d of a fully balanced architecture having common mode inductive load, the use of these circuits in minimizing the sensitivity of analog and RF circuits to spurious noise is described. Circuit inputs and outputs are typically single-ended. Conventionally constructed fully balanced circuits are used in the embodiment of a transceiver shown to avoid the pickup of spurious noise signals. In the embodiment of the invention, having single-ended external connections available to an input, output or both, a conventional single-ended to differential circuit is added at each single-ended to differential interface.

By converting the single-ended signal to a balanced signal throughout its routing on the transceiver chip, a high immunity to power supply and common mode ground noise is maintained. As shown in FIGS. 48c and 48d, the differential circuits embodiments utilize an inductive common mode loads X1, X3 at the power supply and ground connections. Inductive loads minimize noise pickup from the power supply.

The inductive common mode loads also tend to reduce noise present in the power supply leads. Suppression of common mode noise is important because common mode noise tends to mix with differential signals present in the circuit through non-linear mechanisms as known to those skilled in the art. The mixing process causes the creation of differential spurious signals. For example, common mode differential noise coupling from an RF transmitter to an RF local oscillator may result in oscillator pulling. Pulling will occur if the common mode noise is mixed with the oscillator frequency, generating spurious noise close to the oscillator frequency.

Figure 48E:
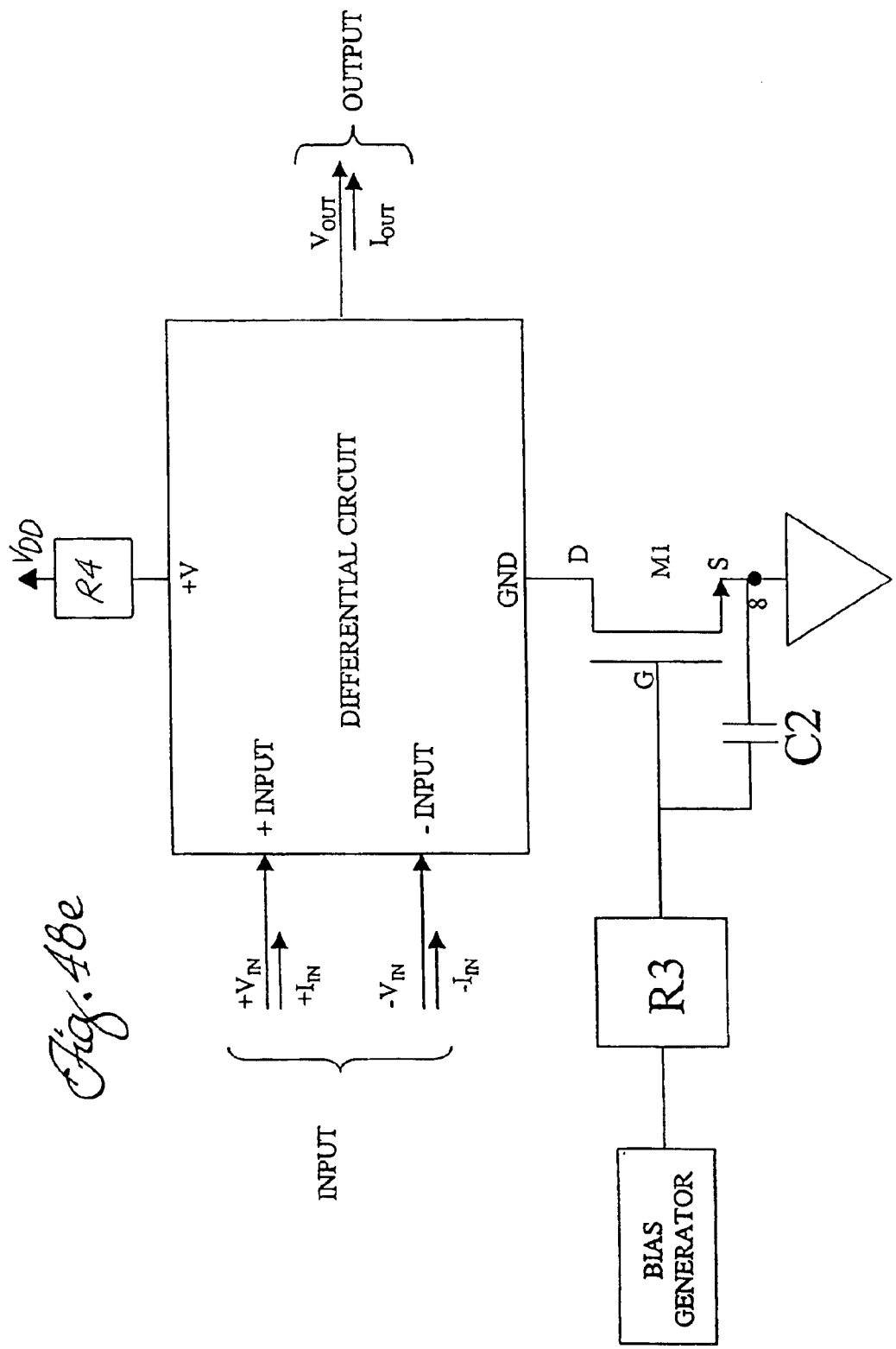
FIG. 48e is a block diagram of a fully balanced architecture having an AC coupled tail current source coupled to ground.

FIG. 48e is a block diagram of a full balanced architecture having an AC coupled tail current source coupled to ground. Transistor M1 forms a tail current source having its gate AC coupled to ground by capacitor C2. AC coupling the gate to ground eliminates common mode low impedance paths from the ground to the output. Noise is picked up typically through the ground as the ground reference potential varies from noise spikes. Any change in the potential of the ground is transferred to the gate of current source M1. Coupling the gate and source of M1 causes their potential to track each other, tending to prevent the transmission of noise through common mode noise pickup from the ground. Common mode signal rejection is important since common mode signals injected into the differential circuit tend to mix with other differential signals in non-linear devices typically present in the differential circuit. The mixing generates end-band differential spurious signals that are undesirable.

Resistor R3 and capacitor C2 act in cooperation to filter high frequency noise that tends to be produced by the bias generator circuit. Additionally, high frequency modulated signals emanating from the differential circuit are coupled to ground via capacitor C2, preventing them from interfering with the operation of the bias generator.

The fully balanced differential circuit having an AC coupled tail current source includes a resistor R4 coupled between a voltage source $V_{DD}$ and differential circuit power supply terminal +V. A ground terminal GND of the differential circuit is coupled to the drain of a field effect (FET) transistor M1. The source of M1 is coupled to ground at node 8. The gate of M1 is coupled to a first terminal of resistor R3 and a first terminal of capacitor C2. A second terminal of capacitor C2 is coupled to ground node 8. A second terminal of resistor R3 is coupled to a conventionally constructed bias generator circuit.

Figure 48F:
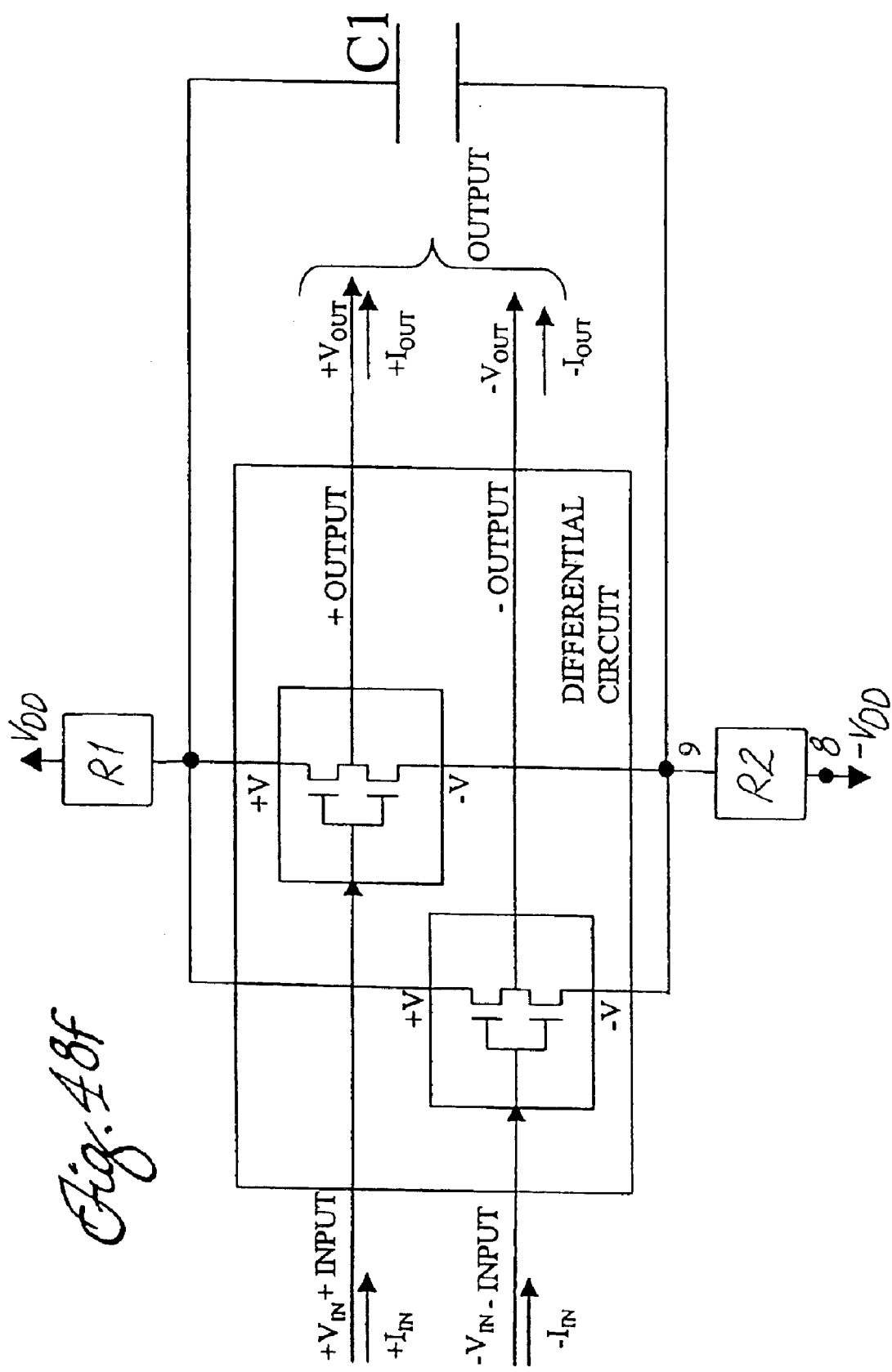
FIG. 48f is a block diagram of a differential logic circuit utilizing the noise reduction scheme of FIG. 48b.

FIG. 48f is a block diagram of a differential logic circuit utilizing the noise reduction scheme of FIG. 48b. Dual inverter logic circuits are coupled between +V and −V connections in the differential circuit Capacitor C1 is coupled from the +V to −V terminals. Resistor R1 is coupled between the +V terminal and a power supply terminal $V_{DD}$. Resistor R2 is coupled between the −V terminal and the −$V_{DD}$ power supply.

A fully ballanced differential circuit is conventionally constructed as known by those skilled in the art to achieve a desired circuit function. The input and the circuitry in the differential circuit operate fully differentially having an output that is converted internally inside of the differential circuit into a single-ended output. In alternative embodiments, the output is maintained as a differential signal.

Utilization of distributed filtering and amplification tends to minimize noise pickup. Once a signal is down-converted by one or more mixers to an IF frequency, a typical first circuit element encountered in an IF frequency strip of circuitry is a bandpass filter. A bandpass filter typically eliminates out-of-band noise signals that tend to interfere with signal processing in the IF strip. Alternatively, circuitry in the IF strip often has a designed bandwidth that tends to eliminate interference outside of the IF frequency band. Once a signal has been converted to an intermediate frequency (IF), the intermediate frequency should be maintained at a high level so it may be easily distinguished from the noise floor of the receiver.

In the embodiment, one or more active filter stages are provided to filter out unwanted spurious signals and to amplify the intermediate frequency signal in multiple stages. Alternatively, filtering is provided by one or more cascaded LC filters operating in cooperation with one or more cascaded amplifier circuits. Cascaded filters improve the selectivity with each active filter added to the IF strip. In the described embodiment, a signal-to-noise ratio of typically 30 to 40 dB is achieved.

Often a spurious signal will fall within the band of IF frequencies being amplified. The IF strip typically includes circuitry having high gain. The spurious signal will typically intermodulate with the intermediate frequency, causing a high amplitude intermodulation distortion product to be formed that has the effect of reducing overall receiver sensitivity. The utilization of multiple stages of active filters distributes the gain over the several stages and thus reducing the non-linearity of the active filter stages distribution gain stages and filtering will thus tend to reduce and remove spurious signals generated through intermodulation.

Although a preferred embodiment of the present invention has been described, it should not be construed to limit the scope of the appended claims. For example, the present invention can be into a single integrated circuit, can be constructed from discrete components, or can include one or more integrated circuits supported by discrete components. Those skilled in the art will understand that various modifications may be made to the described embodiments. Moreover, to those skilled in the various arts, the invention itself herein will suggest solutions to other tasks and adaptations for other applications. It is therefore desired that the present embodiments be considered in all respects as illustrative and not restrictive, reference being made to the appended claims rather than the foregoing description to indicate the scope of the invention.

What is claimed is:

1. A phase lock loop, comprising:
an oscillator having a tuning input, and an output with a tunable frequency responsive to the tuning input;
a subsampling mixer to mix the oscillator output with a second signal to produce a mixed signal; and
a phase detector outputting an error signal which is a function of a phase difference between the mixed signal and an input signal, the error signal being applied to the tuning input.

2. The phase lock loop of claim 1 wherein the second signal comprises a frequency different from the frequency of the oscillator output.

3. The phase lock loop of claim 1 wherein the oscillator comprises a voltage controlled oscillator, the tuning input being responsive to a voltage of the error signal.

4. The phase lock loop of claim 1 further comprising a bandpass filter to filter the mixed signal before being applied to the phase detector, the filtered mixed signal comprising a difference frequency between the frequency of the oscillator output and a harmonic of the second signal.

5. The phase lock loop of claim 3 further comprising a limiter to limit the filtered mixed signal from the filter before being applied to the phase detector.

6. The phase lock loop of claim 1 further comprising a charge pump disposed between the phase detector and the oscillator.

7. The phase lock loop of claim 1 further comprising a loop filter disposed between the phase detector and the oscillator.

8. The phase lock loop of claim 1 wherein the oscillator comprises a voltage controlled oscillator, the tuning input being responsive to a voltage of the error signal, and the second signal comprises a frequency different from the frequency of the oscillator output, the phase lock loop further comprising a bandpass filter to filter the mixed signal before being applied to the phase detector, the filtered mixed signal comprising a difference frequency between the frequency of the oscillator output and a harmonic of the second signal, a limiter to limit the filtered mixed signal from the filter before being applied to the phase detector, a charge pump disposed between the phase detector and the oscillator, and a loop filter disposed between the charge pump and the oscillator.

9. A phase lock loop, comprising:
   a tunable oscillator having a tuning input;
   a subsampling mixer having coupled the oscillator; and
   a phase detector having a first input coupled to the mixer, a second input adapted to receive an input signal, and an output coupled to the tuning input.

10. The phase lock loop of claim 9 wherein the oscillator comprises a voltage controlled oscillator.

11. The phase lock loop of claim 9 further comprising a bandpass filter coupled between the subsampling mixer and the first input of the phase detector.

12. The phase lock loop of claim 9 further comprising a limiter coupled between the bandpass filter and the first input of the phase detector.

13. The phase lock loop of claim 9 further comprising a charge pump coupled between the phase detector output and the tuning input of the oscillator.

14. The phase lock loop of claim 9 further comprising a loop filter coupled between the phase detector output and the tuning input of the oscillator.

15. The phase lock loop of claim 9 wherein the oscillator comprises a voltage controlled oscillator, the phase lock loop further comprising a bandpass filter coupled to the subsampling mixer, a limiter coupled between the bandpass filter and the first input of the phase detector, a charge pump coupled to the phase detector output, and a loop filter coupled between the charge pump and the tuning input of the oscillator.

16. A phase lock loop, comprising:
   oscillator means for generating a first signal having a tunable frequency, the oscillating means comprising tuning means for tuning the frequency of the first signal;
   mixer means for mixing the first signal with a second signal to produce a mixed signal;
   filter means for filtering the mixed signal to generate a difference signal between the frequency of the first signal and a harmonic of the second signal; and
   detector means for detecting a phase difference between the filtered mixed signal and an input signal, and generating an error signal which is a function of the phase difference, the tuning means being responsive to the error signal.

17. The phase lock loop of claim 16 wherein the oscillator means comprises a voltage controlled oscillator, the tuning means being responsive to a voltage of the error signal.

18. The phase lock loop of claim 16 wherein the second signal comprises a frequency different from the frequency of the oscillator means.

19. The phase lock loop of claim 16 further comprising means for limiting the filtered mixed signal from the filter means before being applied to the detector means.

20. The phase lock loop of claim 16 further comprising means for sourcing current to the tuning means responsive to the error signal.

21. The phase lock loop of claim 16 further comprising means for filtering the error signal from the detecting means before being applied to the tuning means.

22. The phase lock loop of claim 16 wherein the oscillator means comprises a voltage controlled oscillator, the tuning means being responsive to a voltage of the error signal, and the second signal comprises a frequency different from the frequency of the oscillator means, the phase lock loop further comprising means for limiting the filtered mixed signal from the filter means before being applied to the detector means, current means for sourcing current to the tuning means responsive to the error signal, and means for filtering the current sourced error signal from the current means before being applied to the tuning means.

23. A method of upconverting an input signal, comprising:
   generating a first signal having a tunable frequency;
      mixing the first signal with a second signal to produce a mixed signal;
      filtering the mixed signal to generate a difference signal between the frequency of the first signal and a harmonic of the second signal;
      generating an error signal as a function of a phase difference between the mixed signal and the input signal; and
      tuning the first frequency with the error signal.

24. The method of claim 23 further comprising modulating a carrier with a third signal, the modulated carrier comprising the input signal.

25. The method of claim 23 further comprising transmitting the tuned first signal into free space.

26. The method of claim 25 wherein the second signal comprises a frequency different from the frequency of the fist signal, the method further comprising limiting the filtered mixed signal before generating the error signal, and filtering the error signal before using it to tune the first frequency.

27. The method of claim 23 wherein the second signal comprises a frequency different from the frequency of the first signal.

28. The method of claim 23 further comprising limiting the filtered mixed signal before generating the error signal.

29. The method of claim 23 further comprising filtering the error signal before using it to tune the first frequency.

* * * * *